United States Patent
Duan et al.

(10) Patent No.: US 7,427,328 B2
(45) Date of Patent: Sep. 23, 2008

(54) LARGE-AREA NANOENABLED MACROELECTRONIC SUBSTRATES AND USES THEREFOR

(75) Inventors: Xiangfeng Duan, Mountain View, CA (US); Chunming Niu, Palo Alto, CA (US); Stephen A. Empedocles, Menlo Park, CA (US); Linda T. Romano, Sunnyvale, CA (US); Jian Chen, Mountain View, CA (US); Vijendra Sahi, Menlo Park, CA (US); Lawrence A. Bock, Encinitas, CA (US); David P. Stumbo, Belmont, CA (US); J. Wallace Parce, Palo Alto, CA (US); Jay L. Goldman, Mountain View, CA (US)

(73) Assignee: Nanosys, Inc., Palo Alto, CA (US)

( * ) Notice: Subject to any disclaimer, the term of this patent is extended or adjusted under 35 U.S.C. 154(b) by 17 days.

(21) Appl. No.: 11/602,783

(22) Filed: Nov. 21, 2006

(65) Prior Publication Data

US 2007/0120167 A1 May 31, 2007

Related U.S. Application Data

(63) Continuation of application No. 11/490,637, filed on Jul. 21, 2006, now Pat. No. 7,233,041, which is a continuation of application No. 11/106,340, filed on Apr. 13, 2005, now Pat. No. 7,135,728, which is a continuation of application No. 10/674,060, filed on Sep. 30, 2003, now Pat. No. 7,067,867.

(60) Provisional application No. 60/488,801, filed on Jul. 22, 2003, provisional application No. 60/474,065, filed on May 29, 2003, provisional application No. 60/468,276, filed on May 7, 2003, provisional application No. 60/445,421, filed on Feb. 5, 2003, provisional application No. 60/414,359, filed on Sep. 30, 2002, provisional application No. 60/414,323, filed on Sep. 30, 2002.

(51) Int. Cl.
*B05C 5/00* (2006.01)
*B05B 7/00* (2006.01)
(52) U.S. Cl. .................. 118/300; 118/313; 438/479
(58) Field of Classification Search ................ 257/296, 257/E21.705; 438/99
See application file for complete search history.

(56) References Cited

U.S. PATENT DOCUMENTS 5,920,078 A 7/1999 Frey (Continued)

OTHER PUBLICATIONS

Chung et al., "Silicon nanowire devices" Am. Inst. Phys. (2000) 76(15).

(Continued)

*Primary Examiner*—Bradley W. Baumeister
*Assistant Examiner*—Igwe U. Anya
(74) *Attorney, Agent, or Firm*—Andrew L. Filler

(57) ABSTRACT

A method and apparatus for an electronic substrate having a plurality of semiconductor devices is described. A thin film of nanowires is formed on a substrate. The thin film of nanowires is formed to have a sufficient density of nanowires to achieve an operational current level. A plurality of semiconductor regions are defined in the thin film of nanowires. Contacts are formed at the semiconductor device regions to thereby provide electrical connectivity to the plurality of semiconductor devices. Furthermore, various materials for fabricating nanowires, thin films including p-doped nanowires and n-doped nanowires, nanowire heterostructures, light emitting nanowire heterostructures, flow masks for positioning nanowires on substrates, nanowire spraying techniques for depositing nanowires, techniques for reducing or eliminating phonon scattering of electrons in nanowires, and techniques for reducing surface states in nanowires are described.

12 Claims, 55 Drawing Sheets

U.S. PATENT DOCUMENTS

| | | | |
|---|---|---|---|
| 5,962,863 | A | 10/1999 | Russell et al. |
| 6,256,767 | B1 | 7/2001 | Kuekes et al. |
| 6,274,007 | B1 | 8/2001 | Smirnov et al. |
| 6,438,025 | B1 | 8/2002 | Skarupo |
| 6,447,663 | B1 | 9/2002 | Lee et al. |
| 6,455,325 | B1 * | 9/2002 | Tajima ................. 436/526 |
| 6,465,813 | B2 | 10/2002 | Ihm |
| 6,509,085 | B1 * | 1/2003 | Kennedy ............... 428/188 |
| 6,566,704 | B2 | 5/2003 | Choi et al. |
| 6,586,785 | B2 | 7/2003 | Flagan et al. |
| 6,672,925 | B2 | 1/2004 | Talin et al. |
| 6,706,566 | B2 | 3/2004 | Avouris et al. |
| 6,760,245 | B2 | 7/2004 | Eaton et al. |
| 6,790,425 | B1 | 9/2004 | Smalley et al. |
| 6,798,000 | B2 | 9/2004 | Luyken et al. |
| 6,815,218 | B1 * | 11/2004 | Jacobson et al. ............ 438/1 |
| 6,890,624 | B1 * | 5/2005 | Kambe et al. .......... 428/195.1 |
| 6,903,717 | B2 | 6/2005 | Takahashi et al. |
| 2001/0003148 | A1 * | 6/2001 | Coffee ..................... 602/42 |
| 2002/0005876 | A1 * | 1/2002 | Grimes et al. ............ 347/53 |
| 2002/0007869 | A1 * | 1/2002 | Pui et al. ................. 141/173 |
| 2002/0096246 | A1 * | 7/2002 | Sennet et al. ............ 156/167 |
| 2002/0117659 | A1 | 8/2002 | Lieber et al. |
| 2002/0127495 | A1 | 9/2002 | Scherer |
| 2002/0130311 | A1 | 9/2002 | Lieber et al. |
| 2002/0130353 | A1 | 9/2002 | Lieber et al. |
| 2002/0146745 | A1 * | 10/2002 | Natan et al. ............. 435/7.1 |
| 2002/0163079 | A1 | 11/2002 | Awano |
| 2002/0173083 | A1 | 11/2002 | Avouris et al. |
| 2002/0175408 | A1 | 11/2002 | Majumdar et al. |
| 2003/0012723 | A1 | 1/2003 | Clarke |
| 2003/0042562 | A1 | 3/2003 | Giebeler et al. |
| 2003/0077625 | A1 * | 4/2003 | Hutchison .................. 435/6 |
| 2003/0089899 | A1 | 5/2003 | Lieber et al. |
| 2003/0186522 | A1 * | 10/2003 | Duan et al. ............... 438/584 |
| 2003/0189202 | A1 | 10/2003 | Li et al. |
| 2003/0215865 | A1 * | 11/2003 | Mayer et al. ................ 435/6 |
| 2003/0234465 | A1 * | 12/2003 | Chen et al. ............... 264/108 |
| 2004/0005258 | A1 | 1/2004 | Fonash et al. |
| 2004/0031975 | A1 | 2/2004 | Kern et al. |
| 2004/0036126 | A1 | 2/2004 | Chau et al. |
| 2004/0036128 | A1 | 2/2004 | Zhang et al. |
| 2004/0061422 | A1 | 4/2004 | Avouris et al. |
| 2004/0213307 | A1 | 10/2004 | Lieber et al. |
| 2004/0238887 | A1 | 12/2004 | Nihey |
| 2005/0064618 | A1 | 3/2005 | Brown et al. |

OTHER PUBLICATIONS

Duan et al., "High performance thin-film transistors using semiconductor nanowires and nanoribbons" Nature (2003) 425:274-278.

Tans et al., "Room-temperature transistor based on a single carbon nanotube" Nature (1998) 393.

Yamada "Analysis of submicron carbon nanotube field-effect transistors" Appl. Phys Letts (2000) 76(5).

* cited by examiner

| 2902 | 2904 | 2906 |
|---|---|---|
| SEMICONDUCTOR | EFFECTIVE MASS $m_{eff}/m_0$ | BAND GAP $E_g$(eV) |
| DIAMOND | 0.57 | 5.5 |
| Si | 0.33 | 1.14 |
| Ge | 0.2 | 0.67 |
| AlN | 0.4 | 6.2 |
| AlSb | 0.12 | 1.58 |
| GaN | 0.13 | 3.2 |
| GaP | 0.38 | 2.9 |
| GaAs | 0.067 | 1.5 |
| GaSb | 0.041 | 0.72 |
| InN | 0.11 | 2.0 |
| InP | 0.07 | 1.29 |
| InAs | 0.02 | 0.33 |
| InSb | 0.013 | 0.16 |
| ZnO | 0.27 | 3.35 |
| Zns | 0.40 | 3.68 |

| MATERIAL | $E_g$(eV) | $\Delta$(eV) | $E_g$(eV) | $m_0/m_0$ | $m_{lb}/m_0$ | $m_h/m_0$ |
|---|---|---|---|---|---|---|
| AlAs | 3.13 | 0.275 | 21.1 | 0.124 | 0.26 | 0.5 |
| GaP | 2.895 | 0.08 | 22.2 | – | 0.17 | 0.67 |
| GaAs | 1.519 | 0.34 | 25.7 | 0.0665 | 0.082 | 0.45 |
| InP | 1.423 | 0.108 | 20.4 | 0.079 | 0.12 | 0.65 |
| InAs | 0.418 | 0.38 | 22.2 | 0.024 | 0.025 | 0.41 |
| InSb | 0.23 | 0.8 | 23.1 | 0.014 | 0.016 | 0.4 |

TABLE 1.1. PARAMETERS FOR VARIOUS ZINC BLENDE III–V SEMICONDUCTORS (ALL QUOTED FOR LOW TEMPERATURE). (NOTE: ALL VALUES ARE FOR THE DIRECT GAP AT ZONE CENTER, THOUGH AlAs AND GaP ARE INDIRECT GAP SEMICONDUCTORS, HAVING LOWER CONDUCTION BAND MINIMA AWAY FROM ZONE CENTER.)

SHELL: GATE DIELECTRICS    CORE: SINGLE CRYSTAL CHANNEL

LARGE-AREA NANOENABLED MACROELECTRONIC SUBSTRATES AND USES THEREFOR

CROSS-REFERENCE TO RELATED APPLICATIONS

This application is a continuation of U.S. patent application Ser. No. 11/490,637 filed Jul. 21, 2006, which is a continuation of U.S. patent application Ser. No. 11/106,340 filed Apr. 13, 2005, now, U.S. Pat. No. 7,135,728, which is a continuation of U.S. patent application Ser. No. 10/674,060 filed Sep. 30, 2003, now U.S. Pat. No. 7,067,867, which claims priority to the following U.S. Provisional Applications, all of which are incorporated herein by reference in their entireties:

Provisional Application No. 60/414,323, filed Sep. 30, 2002;

Provisional Application No. 60/414,359, filed Sep. 30, 2002;

Provisional Application No. 60/445,421, filed Feb. 5, 2003;

Provisional Application No. 60/468,276, filed May 7, 2003;

Provisional Application No. 60/474,065, filed May 29, 2003; and

Provisional Application No. 60/488,801, filed Jul. 22, 2003.

The following application is related to the grandparent patent U.S. Pat. No. 7,067,867, has the same filing date as the grandparent patent, and is herein incorporated by reference in its entirety:

"Integrated Displays Using Nanowire Transistors," Ser. No. 10/673,669, now U.S. Pat. No. 7,102,605;

BACKGROUND OF THE INVENTION

1. Field of the Invention

The present invention relates to semiconductor devices, and more particularly, to the use of thin films of nanowires in semiconductor devices.

2. Background Art

An interest exists in industry in developing low cost electronics, and in particular, in developing low cost, large area electronic devices. Availability of such large area electronic devices could revolutionize a variety of technology areas, ranging from civil to military applications. Example applications for such devices include driving circuitry for active matrix liquid crystal displays (LCDs) and other types of matrix displays, smart libraries, credit cards, radio-frequency identification tags for smart price and inventory tags, security screening/surveillance or highway traffic monitoring systems, large area sensor arrays, and the like.

The advancement of electronics has been moving towards two extremes in terms of physical scale. Rapid miniaturization of microelectronics according to Moore's law has led to increases in computing power while at the same time enabling reductions in cost. At the same time, progress has been made in the area of macroelectronics, in which electronic devices are integrated over large area substrates (e.g., having sizes measured in square meters). Current macroelectronics are primarily based on amorphous silicon (a-Si) or polycrystalline silicon (p-Si) thin film transistors (TFTs) on glass, and are finding important applications in various areas, including flat panel display (FPD), solar cells, image sensor arrays and digital x-ray imagers.

The current technology, however, is limited in what applications to which it can be applied. For example, there has been growing interest in the use of plastic as a substrate for macroelectronics due to various beneficial attributes of plastic, including flexibility, shock resistance, low weight, and low cost. However, the fabrication of high performance TFTs on plastics is difficult because process steps must be carried out below the glass transition temperature of the plastic. Significant efforts have been devoted to search for new materials (such as organics and organic-inorganic hybrids) or new fabrication strategies suitable for TFTs on plastics, but only with limited success. Organic TFTs have the potential for roll-to-roll fabrication process on plastic substrates, but with only a limited carrier mobility of about 1 $cm^2/V \cdot s$ (centimeter squared per volt second). The limitations posed by materials and/or substrate process temperature (particularly on plastic) lead to low device performance, restricting devices to low-frequency applications. Therefore, applications that require even modest computation, control, or communication functions cannot be addressed by the existing TFT technology.

Individual semiconductor nanowires (NWs) and single walled carbon nanotubes can be used to fabricate nanoscale field effect transistors (FETs) with electronic performance comparable to and in some case exceeding that of the highest-quality single-crystal materials. In particular, carrier mobility of 300 $cm^2/V \cdot s$ has been demonstrated for p-Si NWs, 2000-4000 $cm^2/V \cdot s$ for n-indium InP NWs and up to 20,000 $cm^2/V \cdot s$ for single walled carbon nanotubes. These nano-FETs are extending Moore's law toward the molecular level. They are, however, currently difficult to implement for production-scale nanoelectronics due to the complexity and limited scalability of the device fabrication processes.

Accordingly, what is needed are higher performance conductive or semiconductive materials and devices, and methods and systems for producing lower-cost, high performance electronic devices and components.

Furthermore, what is needed are high performance TFTs that can be applied to plastics and other substrates requiring low process temperatures.

What is also needed is a production scalable method for fabrication of nanoscale semiconductor devices than can be used as high performance TFTs.

BRIEF SUMMARY OF THE INVENTION

Methods, systems, and apparatuses for an electronic substrate having one or more semiconductor devices formed thereon is described. A thin film of semiconductor nanowires is formed on a substrate. The thin film of nanowires is formed to have a sufficient density of nanowires to achieve an operational current level. A plurality of semiconductor regions are defined in the thin film of nanowires. Contacts are formed at the semiconductor device regions to thereby provide electrical connectivity to the plurality of semiconductor devices.

In a first aspect of the present invention, a semiconductor device is formed. A plurality of nanowires are deposited onto a substrate in a thin film. First and second electrical contacts are formed on the substrate. At least one of the nanowires couples the first electrical contact to the second electrical contact. In aspects of the present invention, the deposited nanowires can be semiconducting, magnetic, ferroelectric, thermoelectric, piezoelectric, metallic or transition metal oxide nanowires.

In another aspect of the present invention, a thin film for use in one or more semiconductor devices is fabricated. A first plurality of nanowires that are p-doped are formed. A second plurality of nanowires that are n-doped are formed. The first plurality of nanowires and second plurality of nanowires are deposited onto a substrate to form a thin film of nanowires that includes n-doped and p-doped nanowires. The thin film of nanowires exhibits characteristics of both n-doped and p-doped nanowires.

In another aspect of the present invention, an electrical device is formed incorporating nanowire heterostructures. A plurality of nanowires are formed so that each nanowire has along its long axis at least one first portion doped with a first dopant and at least one second portion doped with a second dopant. Each nanowire has a spacing between consecutive junctions of the first and second portions substantially equal to a first distance. A pair of electrical contacts are formed on the substrate. A distance between the electrical contacts is approximately equal to the first distance. The plurality of nanowires are deposited onto the substrate. At least one nanowire of the plurality of nanowires couples the first electrical contact to the second electrical contact.

In another aspect of the present invention, a light emitting thin film is fabricated incorporating nanowire heterostructures. At least one light emitting semiconductor material. A plurality of nanowires are formed from the selected at least one light emitting semiconductor material. Each nanowire is doped so that each nanowire includes at least one P-N junction. The plurality of nanowires are deposited onto a substrate.

In still another aspect of the present invention, nanowires are positioned on a target surface. A first surface of a flow mask is mated with the target surface such that at least one channel formed in the first surface of the flow mask covers a portion of the target surface. A liquid that contains a plurality of nanowires is flowed through the at least one channel. Nanowires contained in the liquid flowing through the at least one channel are permitted to become positioned on the portion of the target surface covered by the at least one channel.

In still another aspect of the present invention, nanowires are applied to a target surface. A solution source provides a nanowire solution. The nanowire solution comprises a liquid containing a plurality of nanowires. A nozzle is coupled to the solution source. The nozzle has at least one output opening. The nozzle directs the nanowire solution through the output opening(s) onto the target surface. The nanowires of the nanowire solution are directed onto the target surface to be aligned on said target surface substantially parallel to each other, or to be randomly oriented with respect to each other.

In still another aspect of the present invention, conducting nanowires having high mobility of electrons are designed. A semiconductor material is selected. A maximum diameter for a nanowire made from the selected semiconductor material that provides substantial quantum confinement of electrons is determined.

In an example aspect, the diameter is determined by calculating the maximum diameter as follows:

$$\text{the maximum diameter} = \sqrt{\frac{Nk_b T(8.9)\hbar^2}{2m_{\it eff}}}$$

wherein:

$h$=Planck's constant=$4.14 \times 10^{-15}$ eV-sec;

$m_{\it eff}$=effective mass of the selected semiconductor material;

N=a predetermined factor;

$k_b$=Boltzmann's constant=$8.62 \times 10^{-5}$ eV/°K.; and

T=operating temperature;

wherein at room temperature, $k_b T$=0.0259 eV.

In still another aspect of the present invention, nanowires are configured to use electrons as conducting carriers to substantially reduce or entirely eliminate phonon scattering of electrons in the nanowires. In one aspect, the nanowires are doped with an n-type dopant material to be configured to use electrons as conducting carriers. In another aspect, the nanowires are doped with an p-type dopant material. The nanowires are operated in an inversion mode by applying a sufficient bias voltage to a thin film of the nanowires so that electrons are used as conducting carriers.

In still another aspect of the present invention, nanowires having reduced surface scattering are fabricated. A semiconductor material is selected. A plurality of nanowires are formed from the selected semiconductor material. A circumferential surface of each nanowire of the plurality of nanowires is coated with an insulating layer.

In still another aspect of the present invention, nanowires having reduced surface scattering are fabricated. A semiconductor material is selected. A plurality of nanowires are formed from the selected semiconductor material. Each nanowire of the plurality of nanowires is doped so that each nanowire comprises a core-shell structure. The shell is a doped outer layer of each nanowire surrounding a respective core. Carriers of each nanowire are thereby caused to be substantially confined to the core during operation.

In a further aspect, the present invention is directed to thin film transistors using nanowires, nanorods, or nanoribbons, and to production scalable methods for producing such transistors on a variety of substrates. In particular, an entirely new concept of macroelectronics has been developed by using oriented semiconductor nanowire or nanoribbon thin films to produce thin film transistors (TFTs) with the conducting channel parallel to the wire/ribbon axis. These new TFTs have a conducting channel formed by multiple single crystal nanowires in parallel (like a log bridge) or a single crystal nanoribbon, which crosses all the way from source to drain electrode for high carrier mobility.

In another aspect of the present invention, a NW-TFT fabrication method is provided in which a high-temperature active semiconductor materials synthesis process (e.g., used to form nanowires or nanoribbons) is carried out before the active semiconductor materials are applied to a device substrate. Subsequently, the formed NW-TFTs are applied to the device substrate via a solution assembly process, providing a general technique for applying any semiconductor material to any substrate type, including a plastic substrate.

According to aspects of the invention, both p-channel and n-channel TFTs can be formed. In an example aspect, a complementary inverter is described herein that is assembled from p-channel and n-channel TFTs using a combination of nanowires and nanoribbons.

Systems and methods to further improve performance are described herein, according to further aspects of the present invention. For example, aspects of the present invention allow NW-TFT performance to match or exceed that of bulk single crystal materials. In an example aspect, by fabricating novel core-shell NW structures and fully exploiting quantum electronic effects at reduced dimensions, carrier mobility can be enhanced to exceed that of bulk single crystal materials. In addition, approaches to fabricating NW-TFTs, according to aspects of the present invention, represent a general platform for a variety of macroelectronic applications. In aspects of the present invention, NWs made of optically active materials with various bandgaps are used to produce high performance, optically active thin films for multiple color solid-state light emitting diode (LED) displays. Furthermore, according to aspects of the present invention, NW-TFTs can be deposited from solution onto large area substrates using low-cost, low-temperature processes including micro-contact or ink-jet printing technology, for example.

In another aspect of this invention, electrical devices can be formed using a structure that includes multiple nanowire thin film layers. A first plurality of nanowires are deposited on a substrate to form a first nanowire thin film layer. A second plurality of nanowires are deposited on the first nanowire thin film layer to form a second nanowire thin film layer. Junctions, such as p-n junctions, are thereby formed at the cross points between the nanowires of the first and second thin film layers. Contacts can be formed to create electrical devices based on the properties of the junctions. Nanowires of the first thin film layer are preferably aligned parallel to each other, and nanowires of the second thin film layer are preferably aligned parallel to each other. However, in alternative aspects, the nanowires of the first and/or second thin film layers can be randomly oriented.

In another aspect of this invention, an electrical device is formed that includes a hybrid nanowire-single crystal semiconductor structure. A single-crystal semiconductor strip/thin film is formed. A plurality of nanowires are deposited on the top of the strip. Junctions, such as p-n junctions, are formed at the cross points between the nanowires and the single crystal semiconductor strip. Contacts can be formed to create electrical devices based on the properties of these junctions. The nanowires of the plurality of nanowires are preferably aligned parallel to each other, but can alternatively be randomly oriented.

In another aspect of the present invention, an electrical device is formed that includes a hybrid nanowire-amorphous/polycrystalline semiconductor structure. An amorphous or polycrystalline semiconductor thin film is deposited on a substrate. A plurality of nanowires are deposited on the thin film pattern. Junctions, such as p-n junctions, are formed at the cross points between the nanowires and the amorphous/polycrystalline semiconductor thin film pattern. Contacts can be formed to create electrical devices based on the properties of these junctions. The nanowires of the plurality of nanowires are preferably aligned parallel to each other, but can alternatively be randomly oriented.

In another aspect of the present invention, semiconductor nanowires emitting red, green and blue light in a predetermined ratio can be mixed in a solution. The wire mixture is flowed across a single-crystal, amorphous, or polycrystalline semiconductor strip/thin film. Contacts are formed to create a light emitting electrical device. Depending on the mixture of light emitting nanowires, any color of light can be emitted by the light emitting electrical device, including white light.

Thus, according to aspects of the present invention, nanowire, nanorod, nanoribbon, and nanotube thin films enable a variety of new capabilities. In aspects, these include: moving microelectronics from single crystal substrates to glass and plastic substrates; integrating macroelectronics, microelectronics and nanoelectronics at the device level; and, integrating different semiconductor materials on a single substrate. These aspects of the present invention impact a broad range of existing applications, from flat-panel displays to image sensor arrays, and enable a whole new range of universal flexible, wearable, disposable electronics for computing, storage and communication.

These and other objects, advantages and features will become readily apparent in view of the following detailed description of the invention.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

Figure 7:
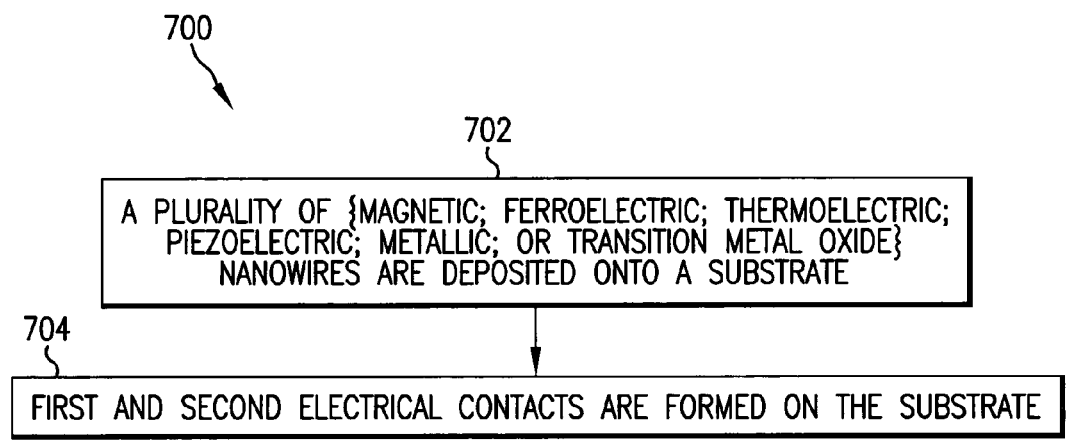
Figure 8A:
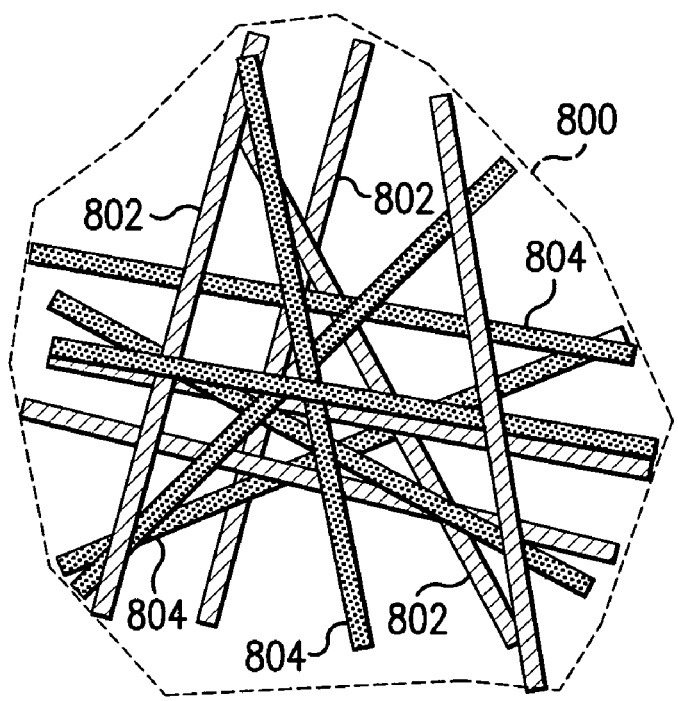

FIG. 7 shows a flowchart providing example steps for making an electrical device that incorporates a thin film of nanowires of the present invention, according to an embodiment of the present invention FIG. 8A shows a close up view of an example portion of a nanowire thin film that includes a homogeneous mixture of n-doped nanowires and p-doped nanowires, according to an embodiment of the present invention.

Figure 8B:
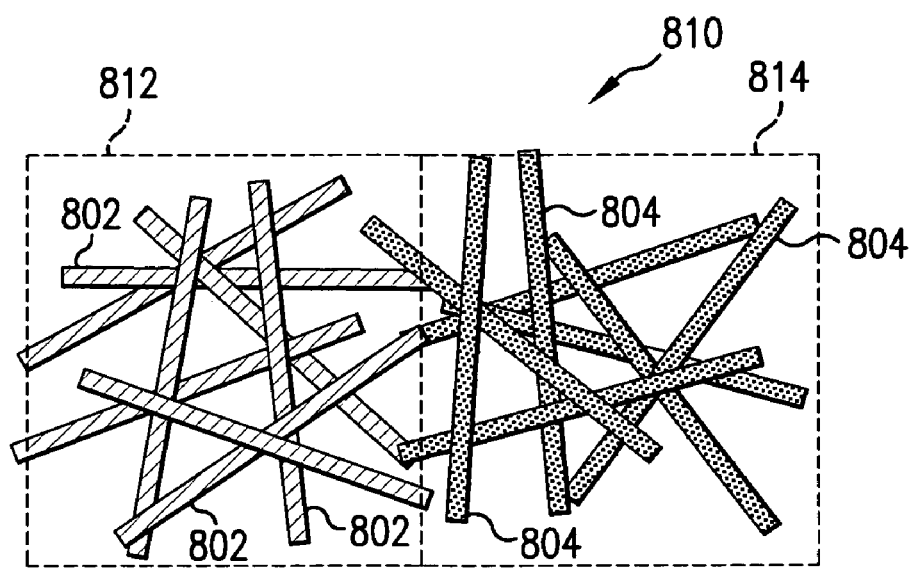

FIG. 8B shows an example portion of a nanowire thin film that includes both n-doped nanowires and p-doped nanowires.

Figure 8C:
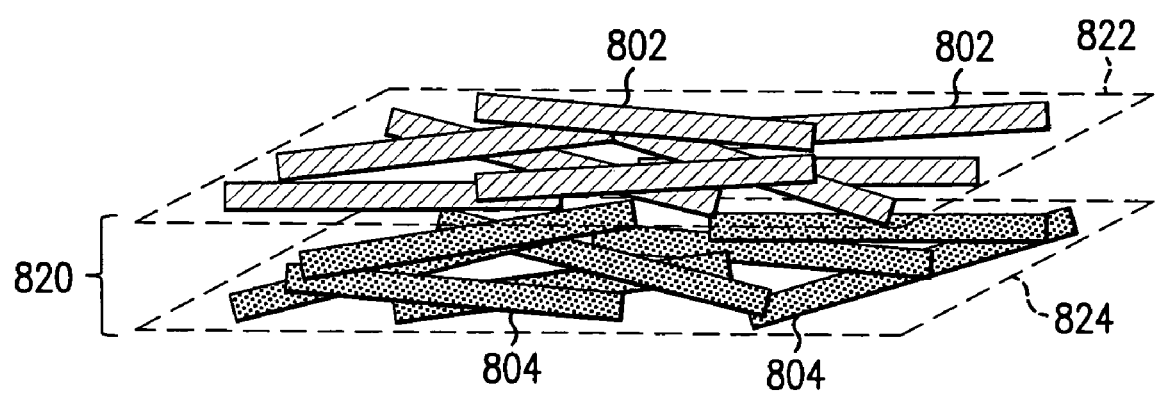

FIG. 8C shows a thin film of nanowires that includes both n-doped nanowires and p-doped nanowires.

Figure 9:
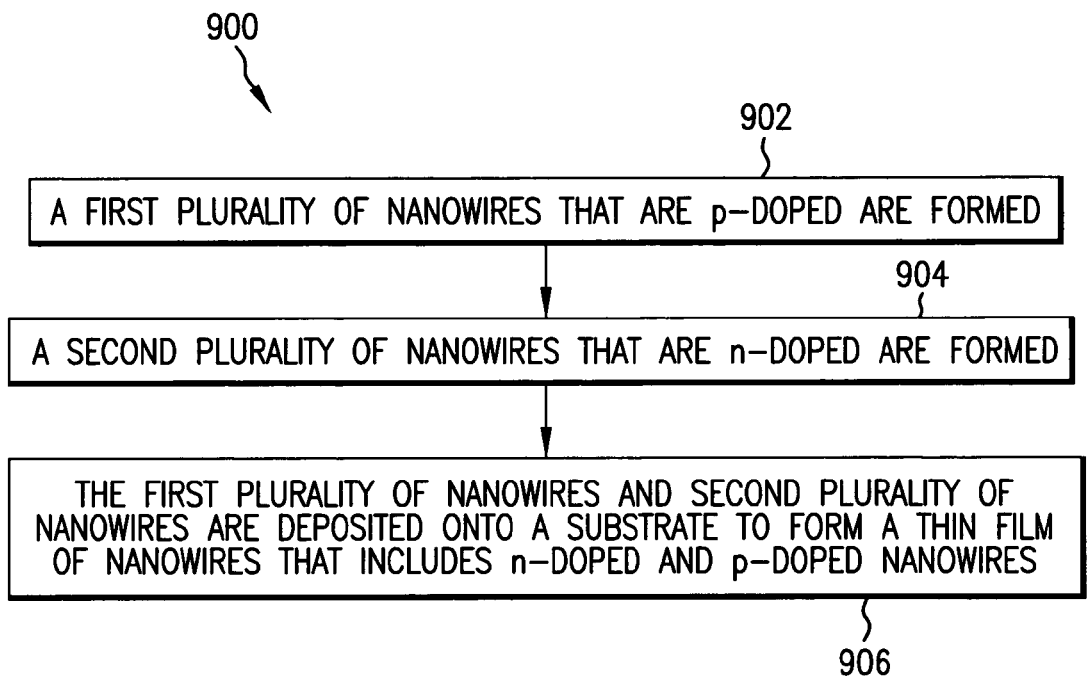

FIG. 9 shows a flowchart providing example steps for making a thin film of nanowires of the present invention, according to an embodiment of the present invention.

Figure 10:
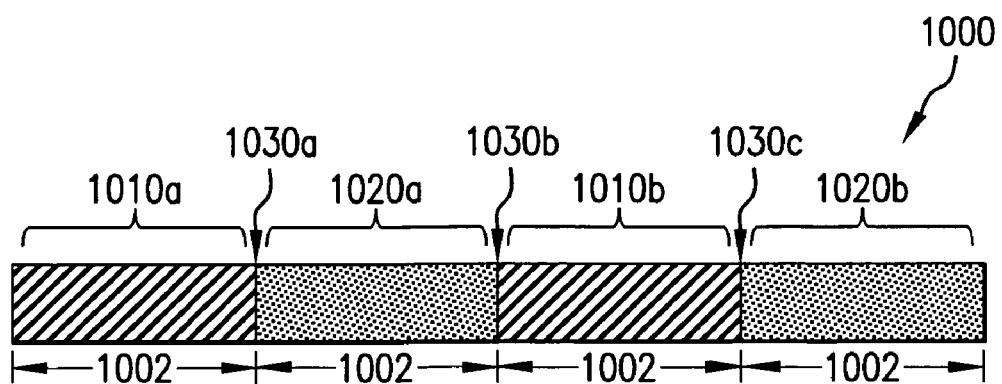

FIG. 10 shows a nanowire that is a nanowire heterostructure, according to an example embodiment of the present invention.

Figure 11A:
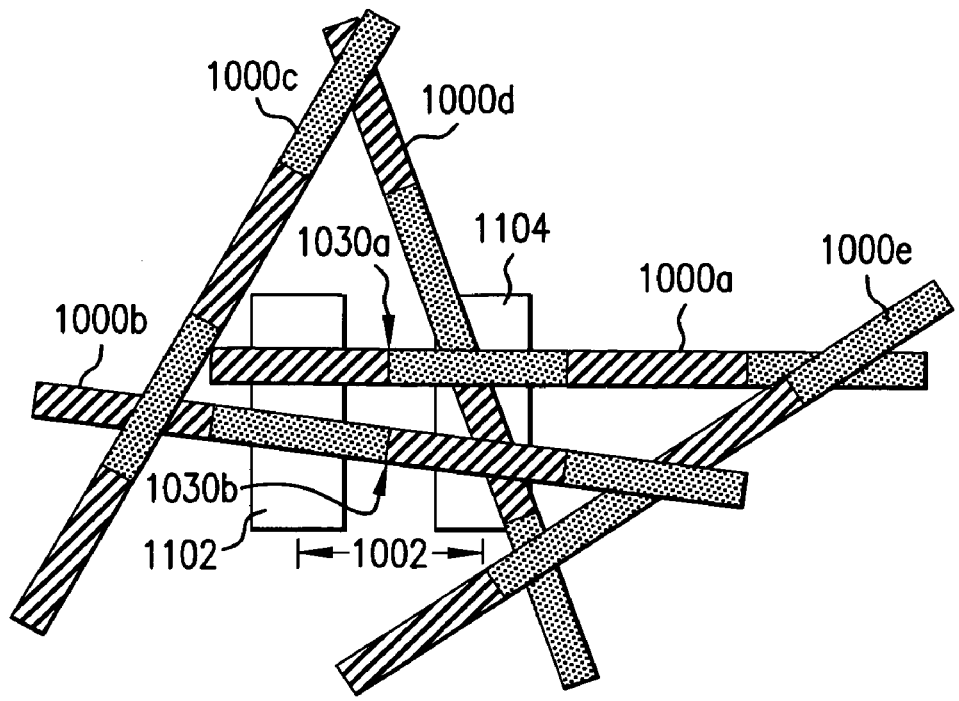

FIG. 11A shows an example two-terminal electrical device that includes a plurality of nanowires, according to an embodiment of the present invention.

Figure 11B:
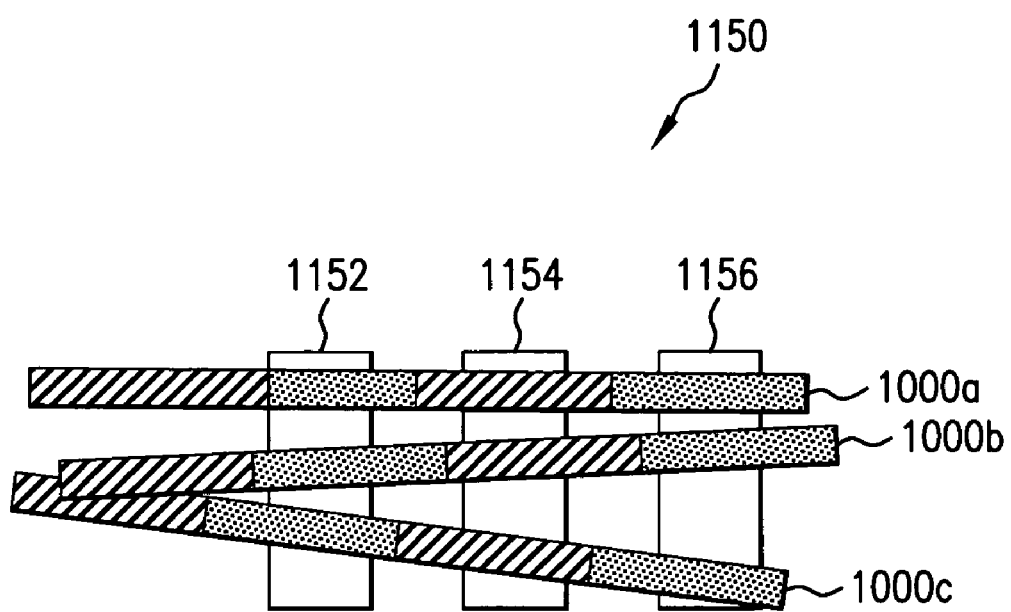

FIG. 11B shows an example p-n-p transistor, incorporating nanowire heterostructures.

Figure 12:
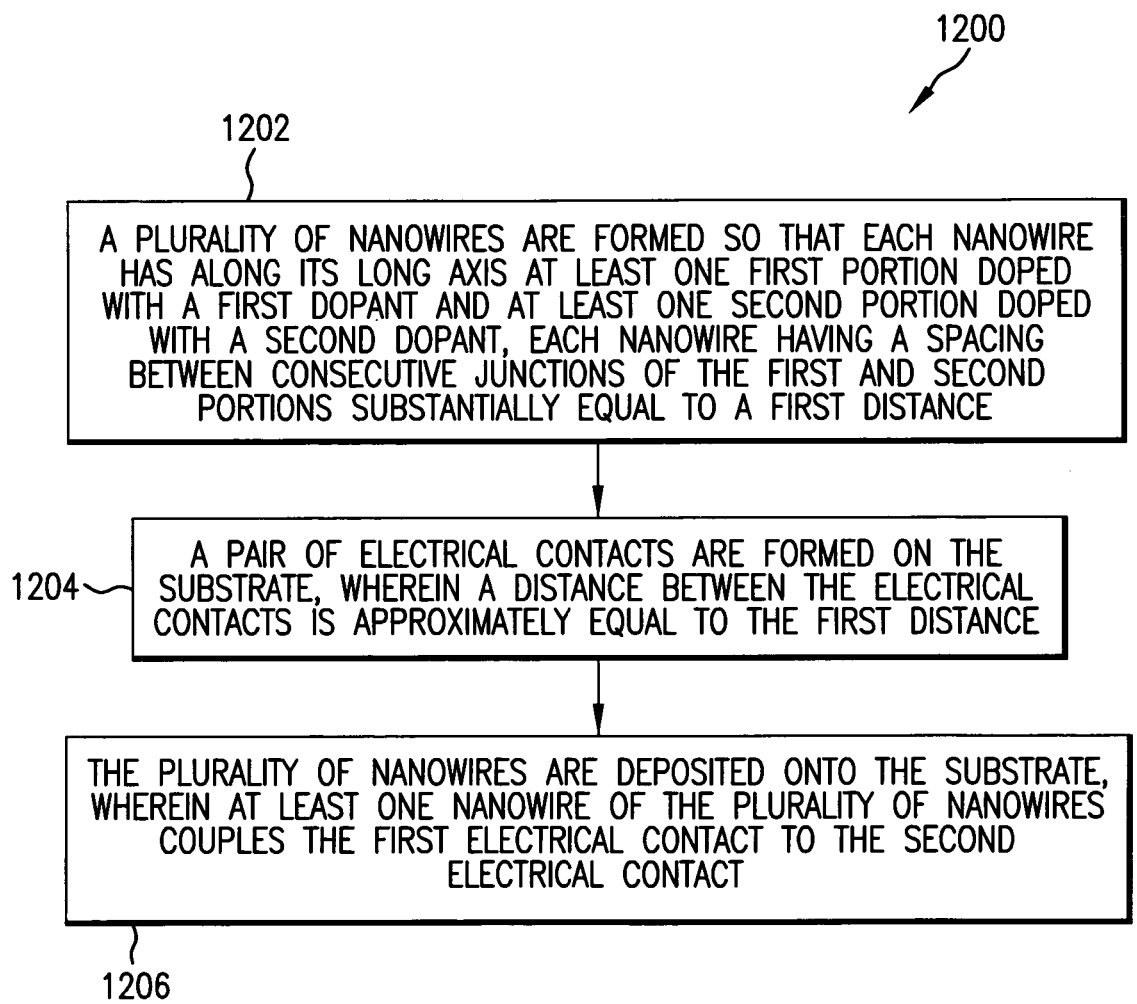

FIG. 12 shows a flowchart providing example steps for making an electrical device incorporating nanowire heterostructures, according to an embodiment of the present invention.

Figure 13A:
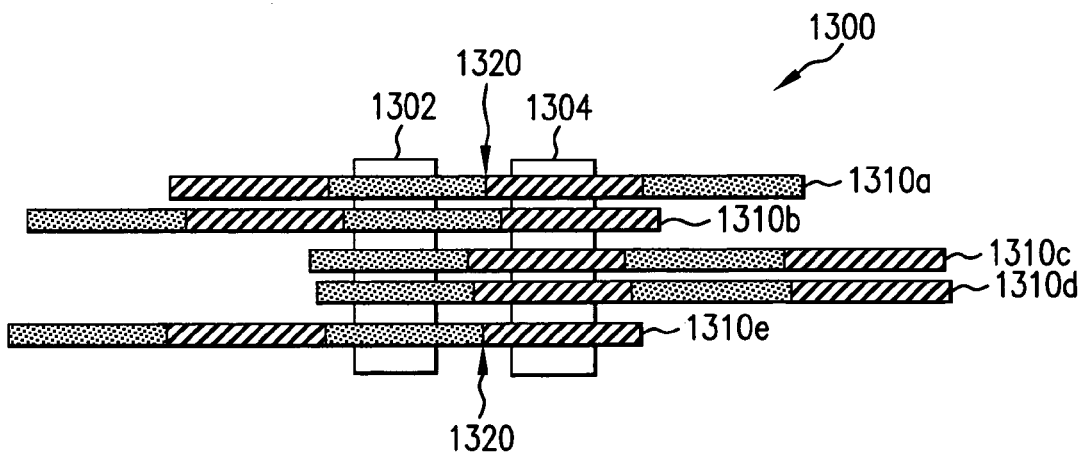

FIG. 13A shows a discrete pixel or light source, having a pair of electrodes, first electrical contact and second electrical contact, according to an embodiment of the present invention.

Figure 13B:
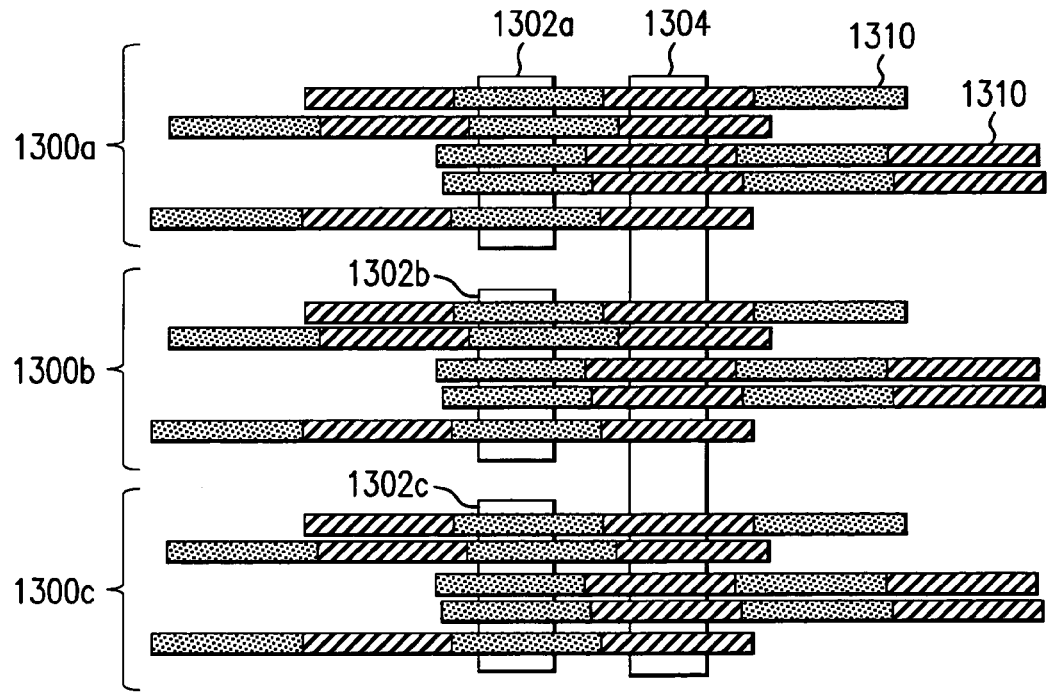

FIG. 13B shows a column of discrete pixels or light sources, each similar to pixel or light source, according to an embodiment of the present invention.

Figure 13C:
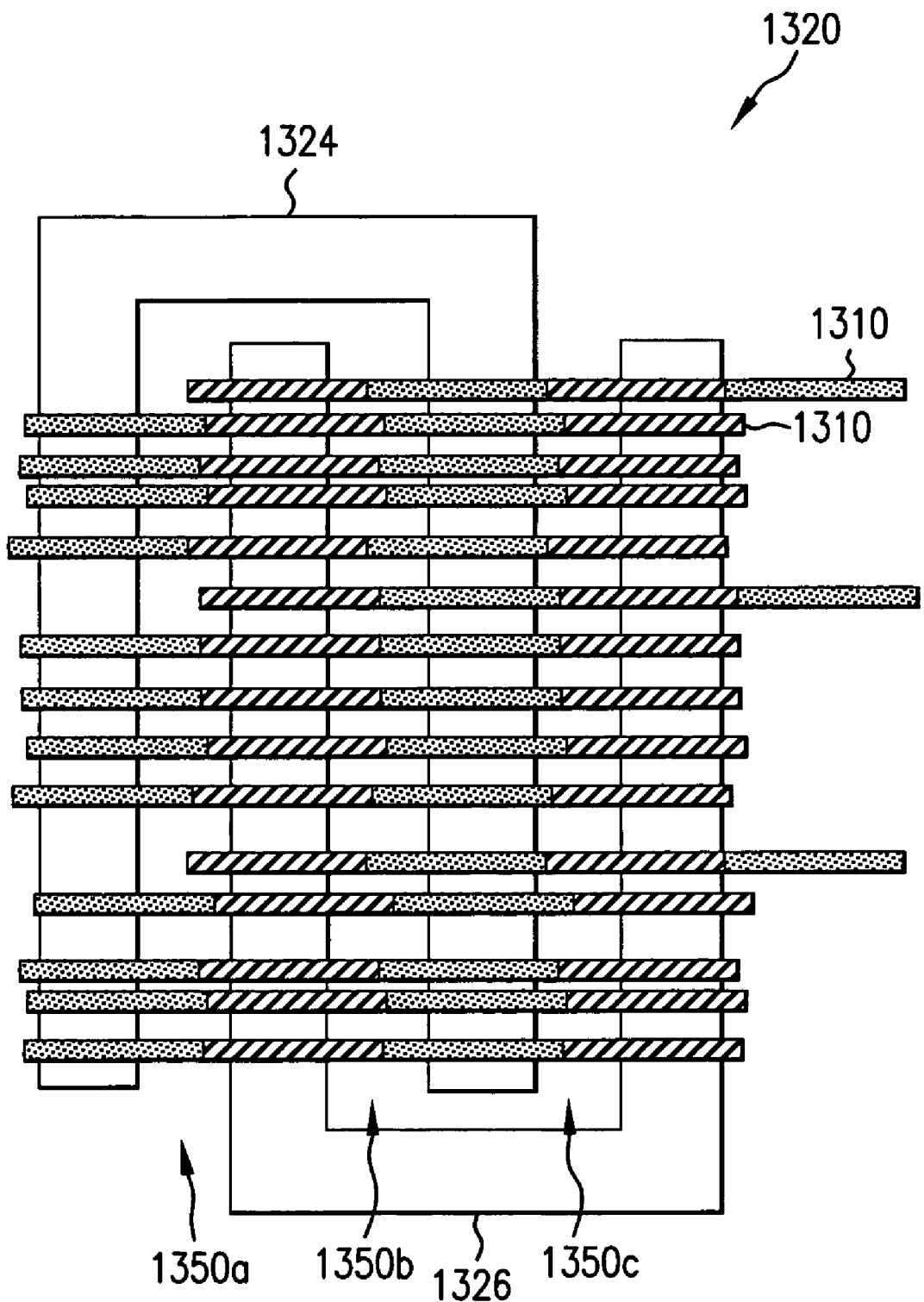

FIG. 13C shows a large area light source, which includes a plurality of light source columns, according to an embodiment of the present invention.

Figure 14:
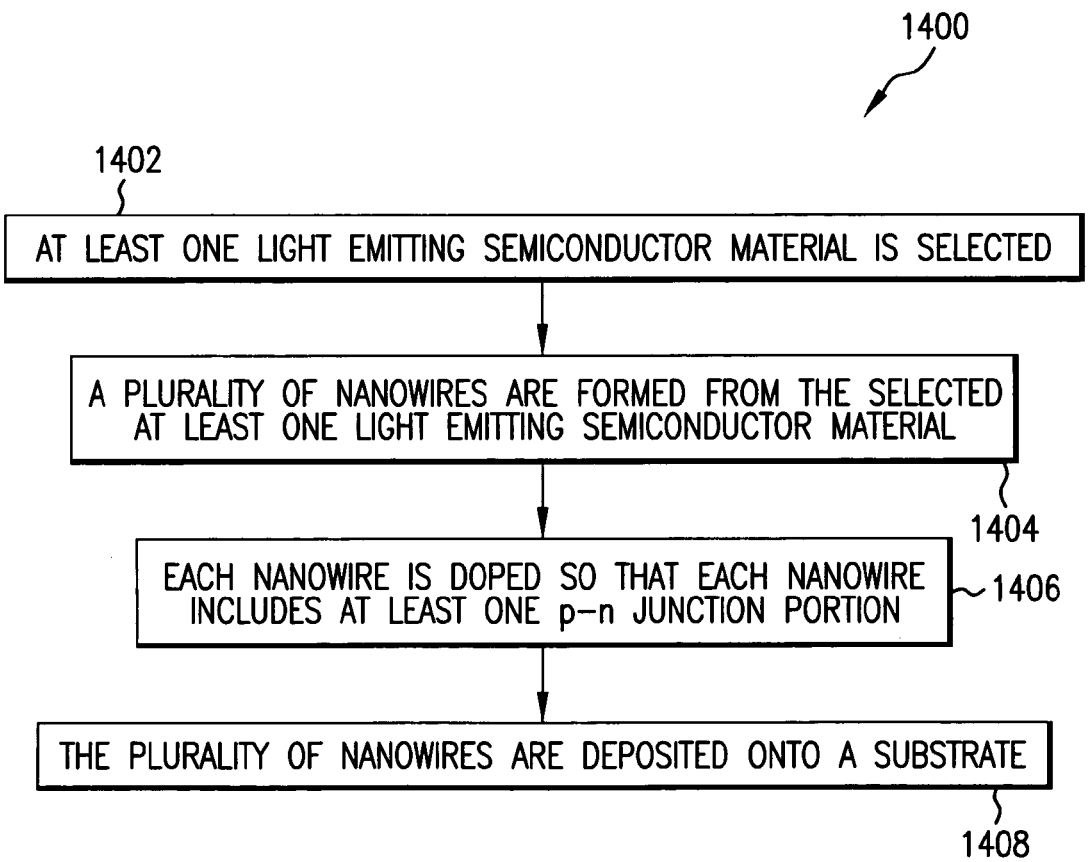

FIG. 14 shows a flowchart providing example steps for making a light emitting device incorporating light emitting nanowire heterostructures, according to an embodiment of the present invention.

Figure 15A:
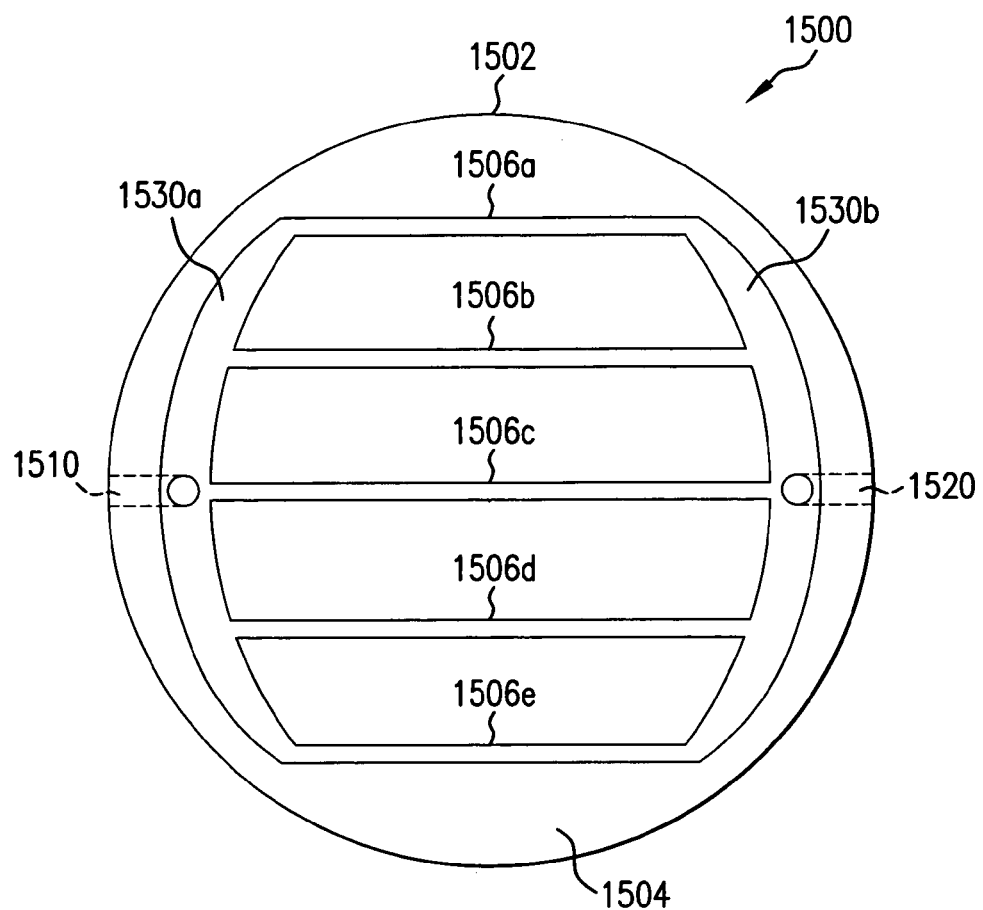
Figure 15B:
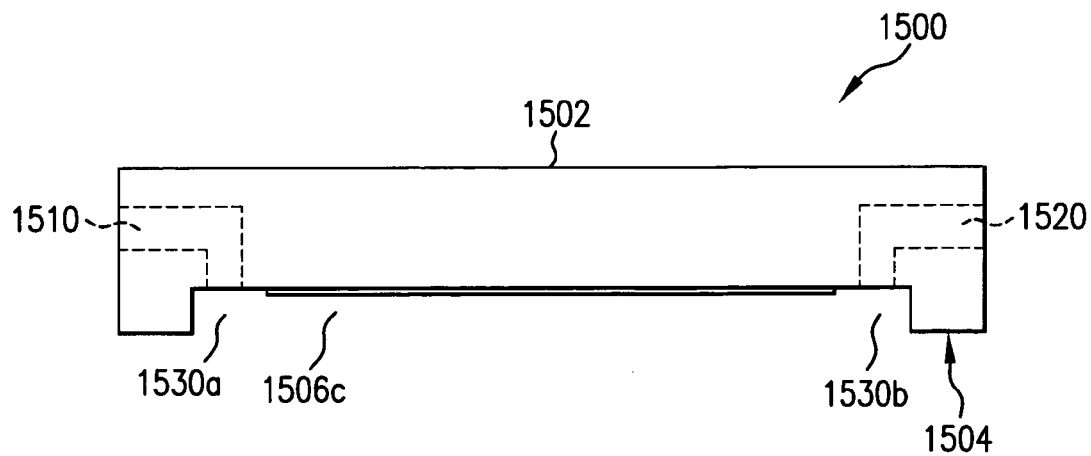

FIGS. 15A and 15B show bottom and cross-sectional views of an example flow mask, according to an embodiment of the present invention.

Figure 16:
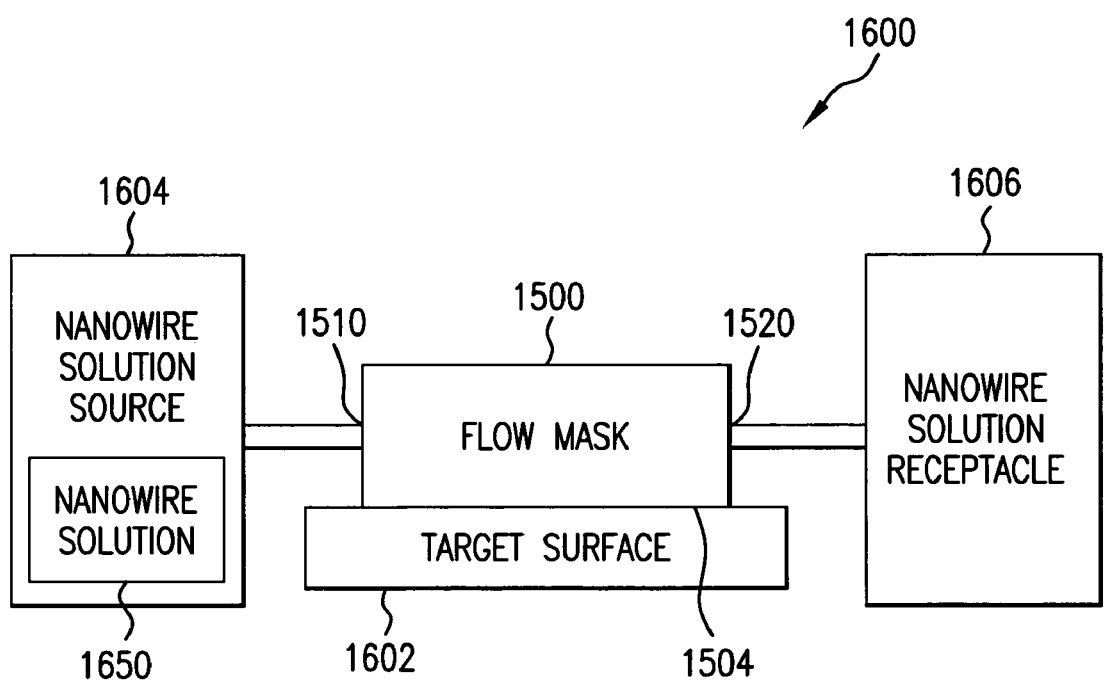

FIG. 16 shows a nanowire positioning system that incorporates flow mask, according to an example embodiment of the present invention.

Figure 17A:
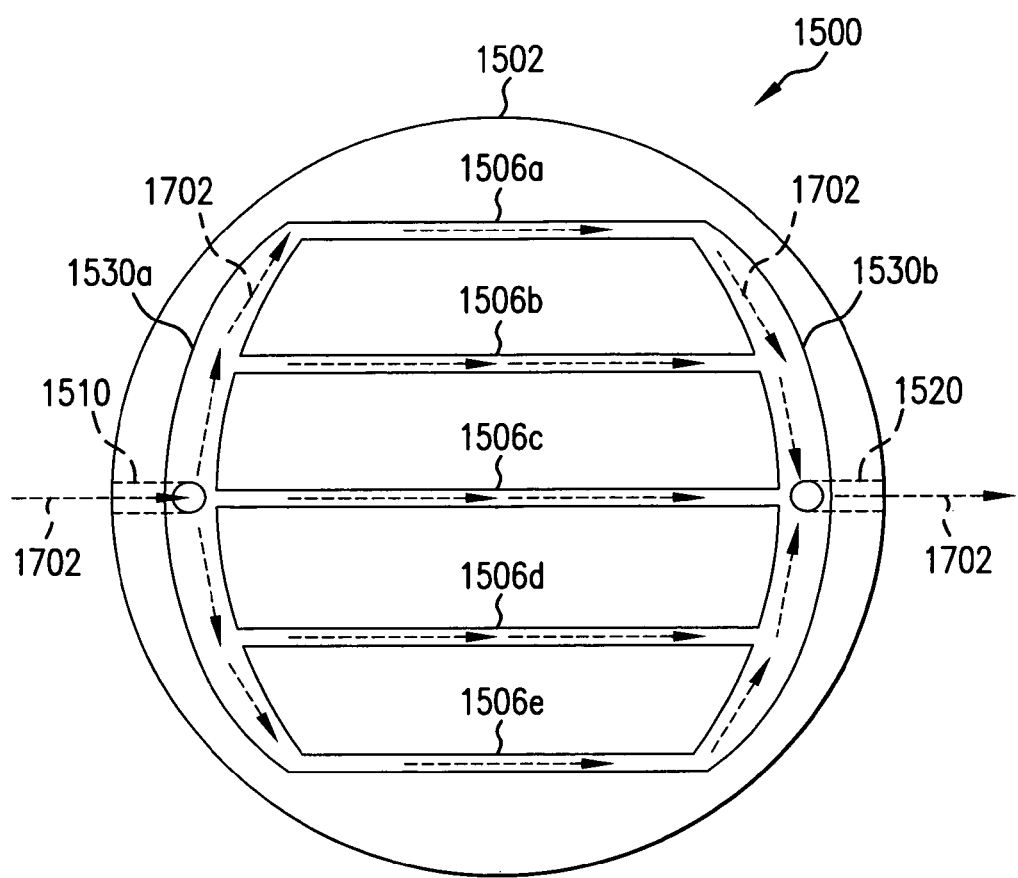
Figure 17B:
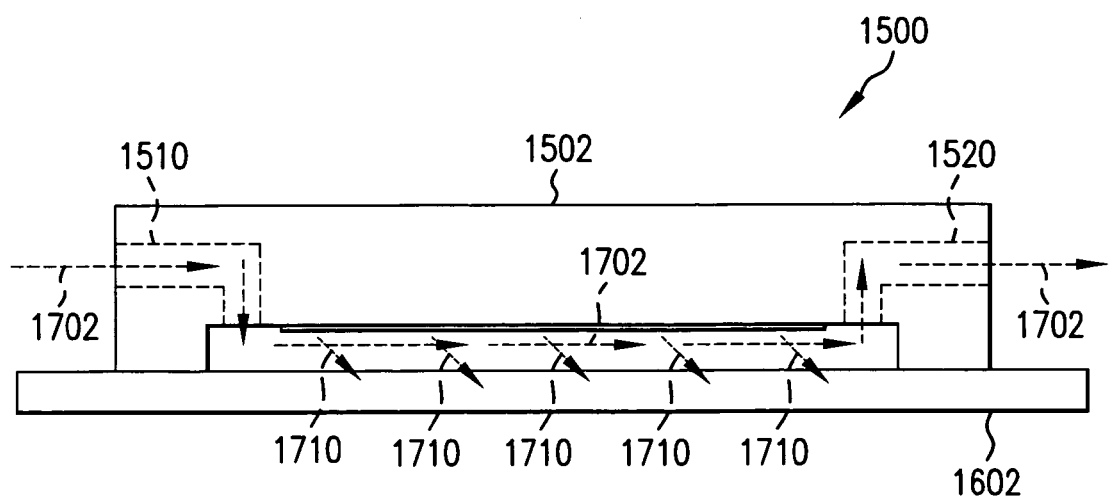

FIGS. 17A and 17B show plan and cross-sectional views of a flow of nanowires flowing through flow mask, according to an example embodiment of the present invention.

Figure 18A:
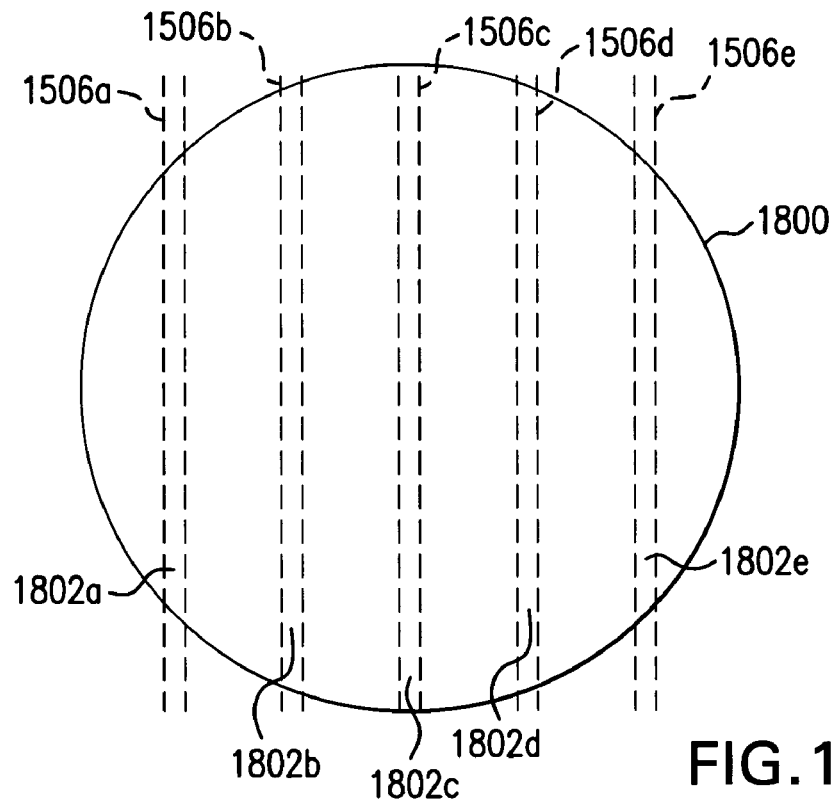

FIG. 18A shows an example semiconductor wafer mated with a flow mask, according to an embodiment of the present invention.

Figure 18B:
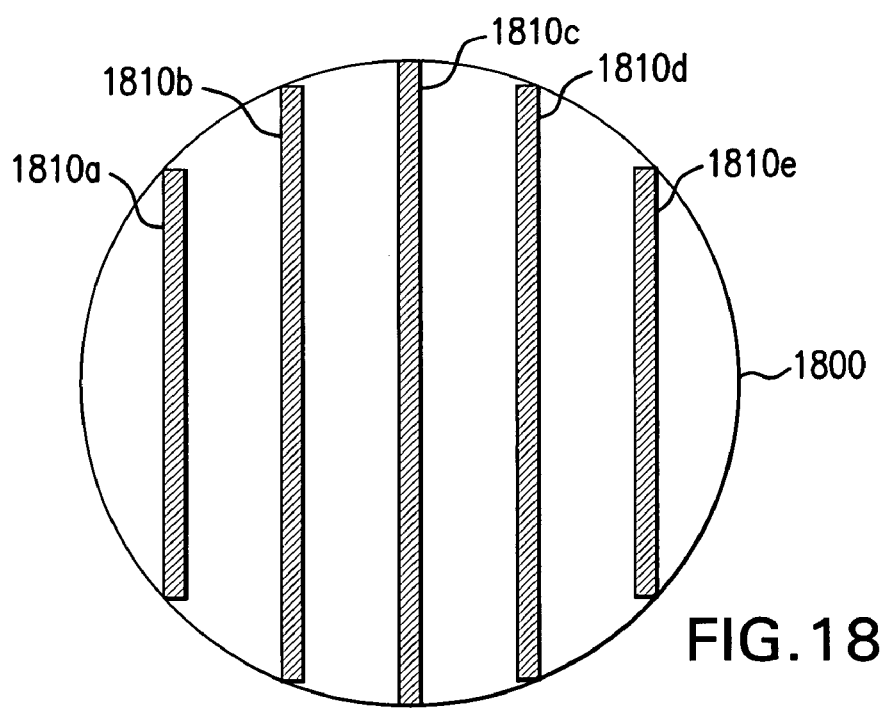

FIG. 18B shows portions of the surface of the wafer of FIG. 18A, having nanowires positioned thereon, due to operation of the present invention.

Figure 18C:
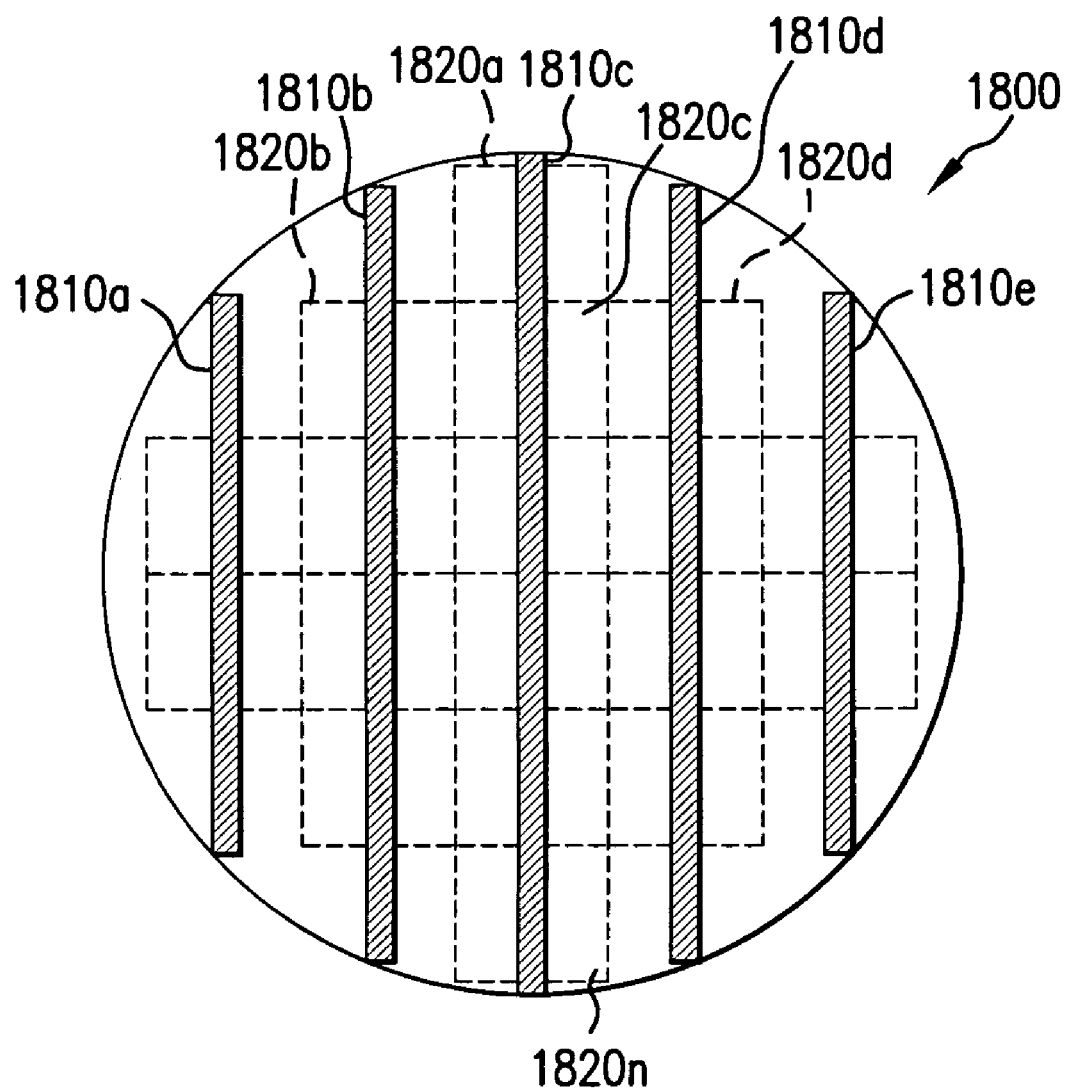

FIG. 18C shows an array of integrated circuits formed on a wafer, with nanowires positioned thereon, due to operation of the present invention.

Figure 19A:
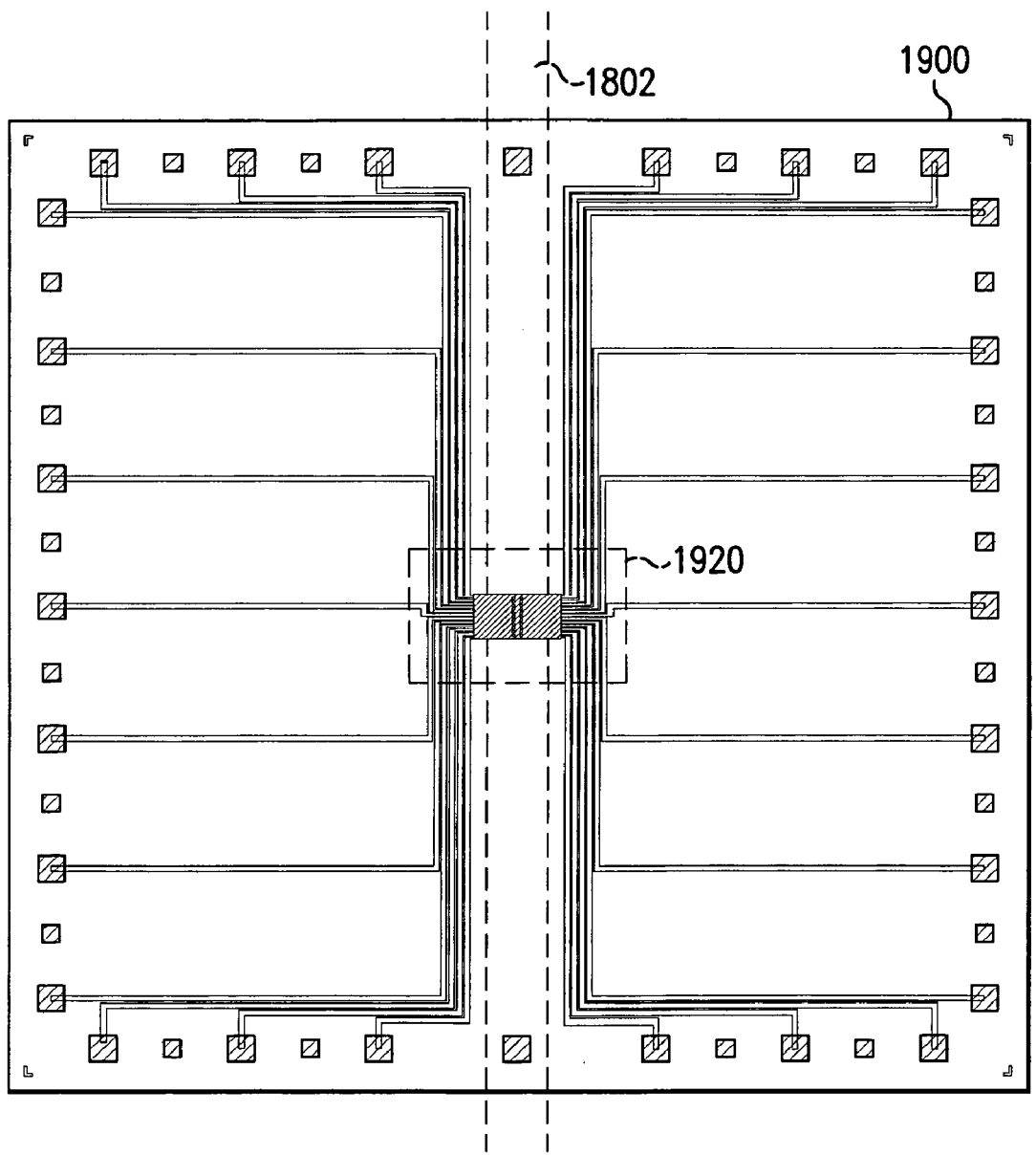

FIG. 19A shows an integrated circuit, which can be an example of one of the integrated circuits of the wafer shown in FIG. 18C, according to an embodiment of the present invention.

Figure 19B:
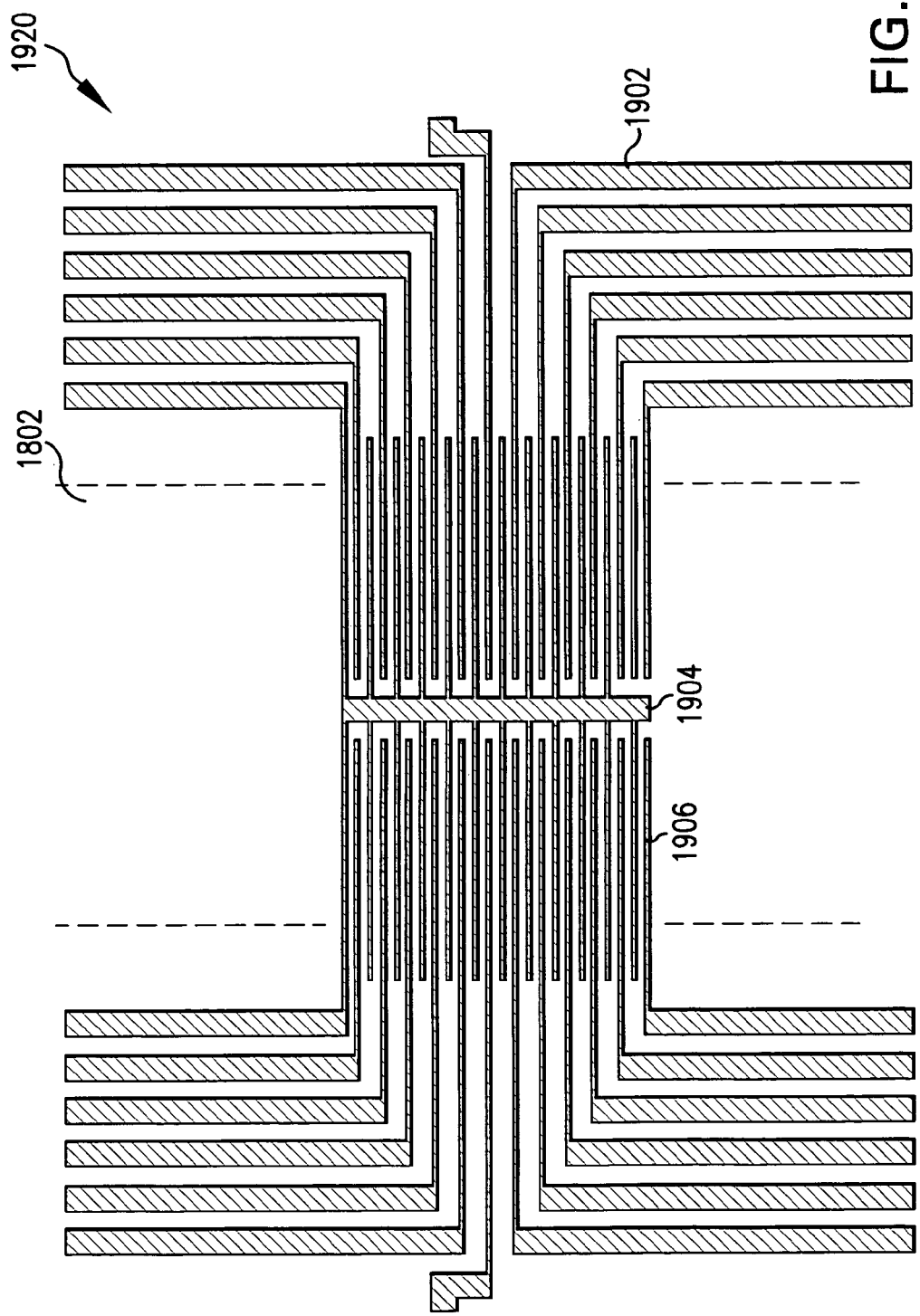

FIG. 19B shows a close-up view a portion of the integrated circuit of FIG. 19A, showing detail of example electrically conductive traces, according to an embodiment of the present invention.

Figure 19C:
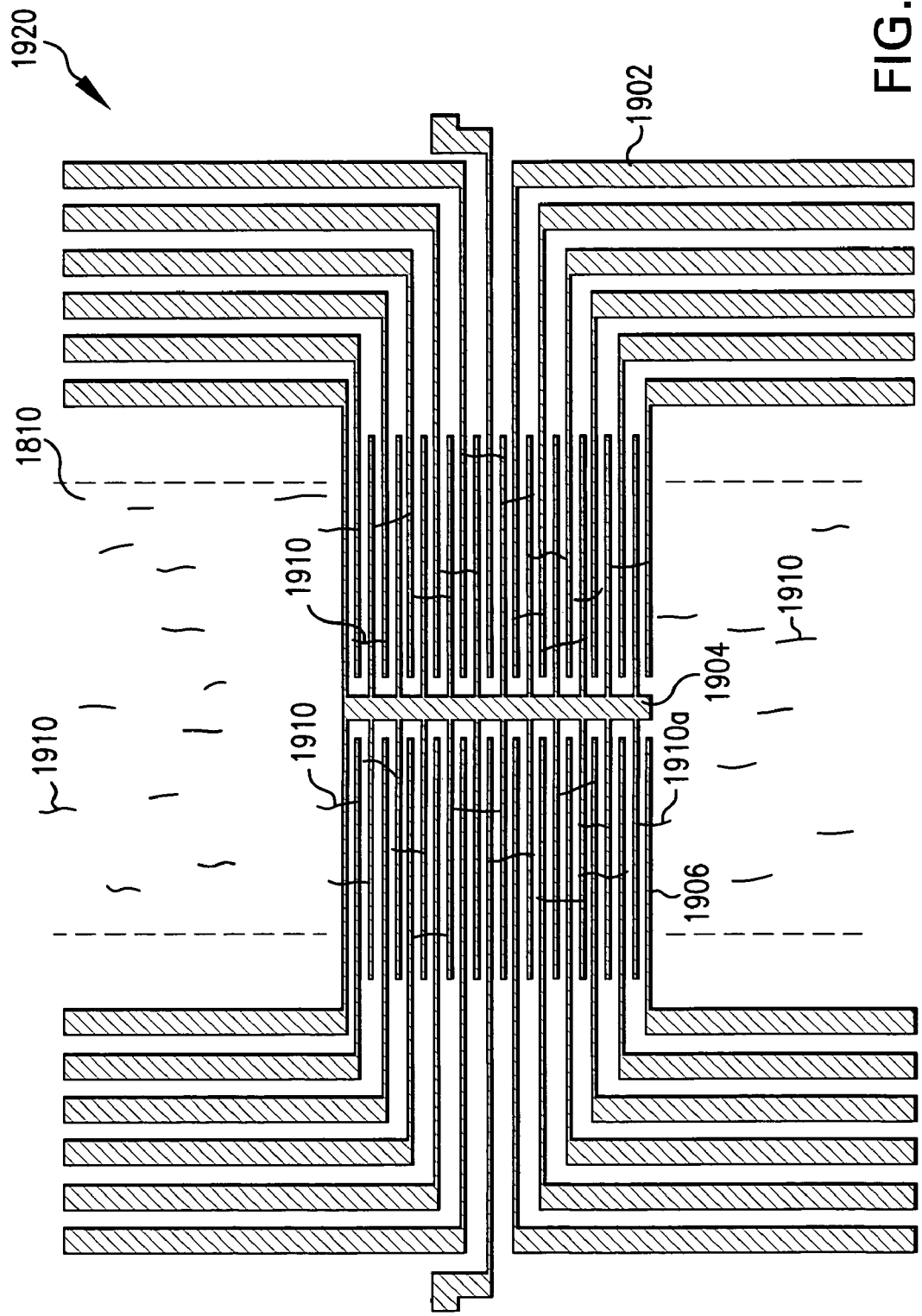

FIG. 19C shows nanowires having been deposited on the integrated circuit portion of FIG. 19B, by operation of an example flow mask of the present invention.

Figure 19D:
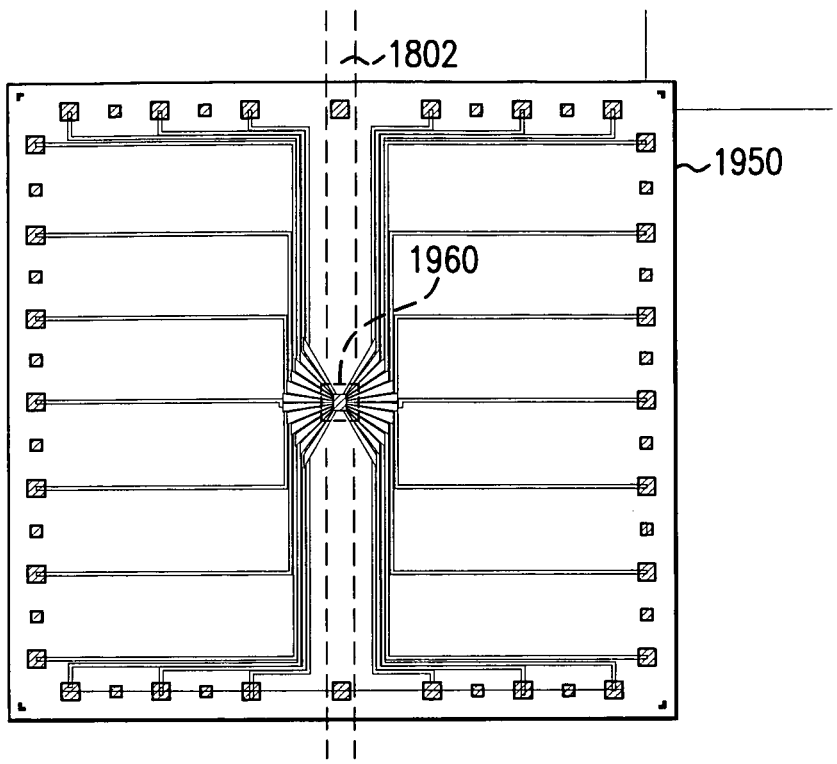

FIG. 19D shows an integrated circuit, which can be an example of one of the integrated circuits of the wafer shown in FIG. 18C, according to an embodiment of the present invention.

Figure 19E:
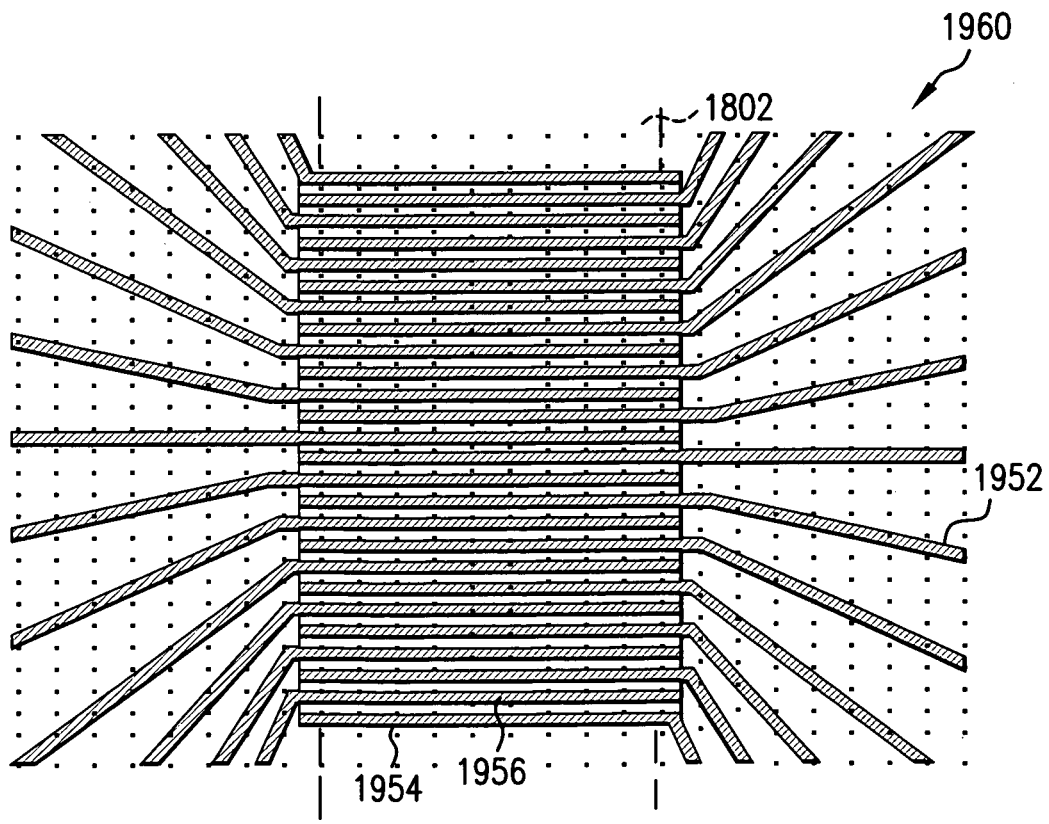

FIG. 19E shows a close-up view a portion of the integrated circuit of FIG. 19D, showing detail of example electrically conductive traces, according to an embodiment of the present invention.

Figure 19F:
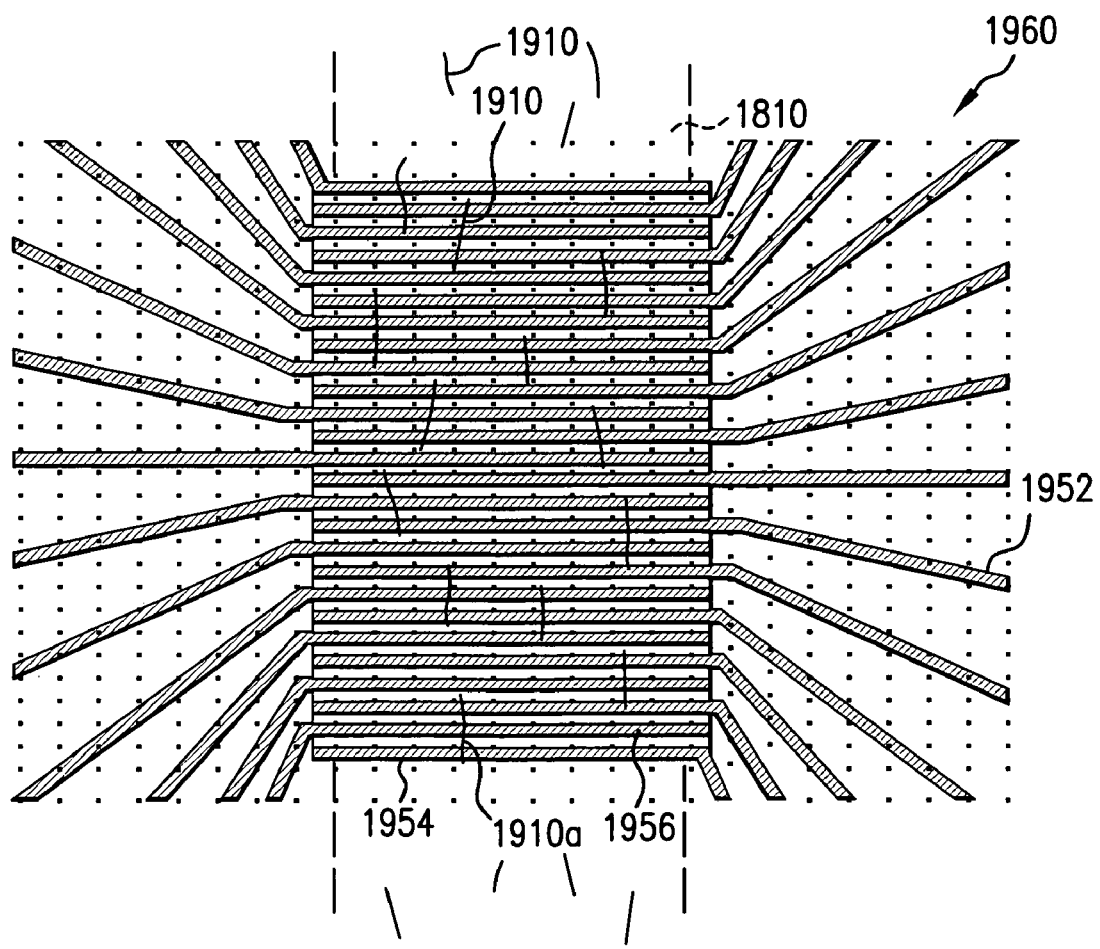

FIG. 19F shows nanowires having been deposited on the integrated circuit portion of FIG. 19E, by operation of an example flow mask of the present invention.

Figure 20A:
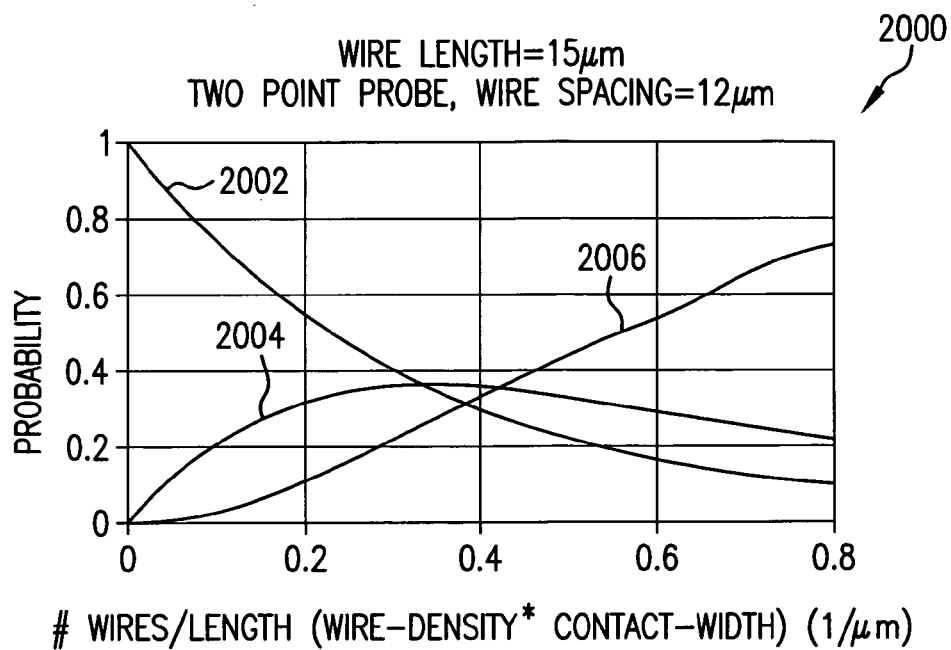

FIG. 20A shows a graph related to FIGS. 19A-C.

Figure 20B:
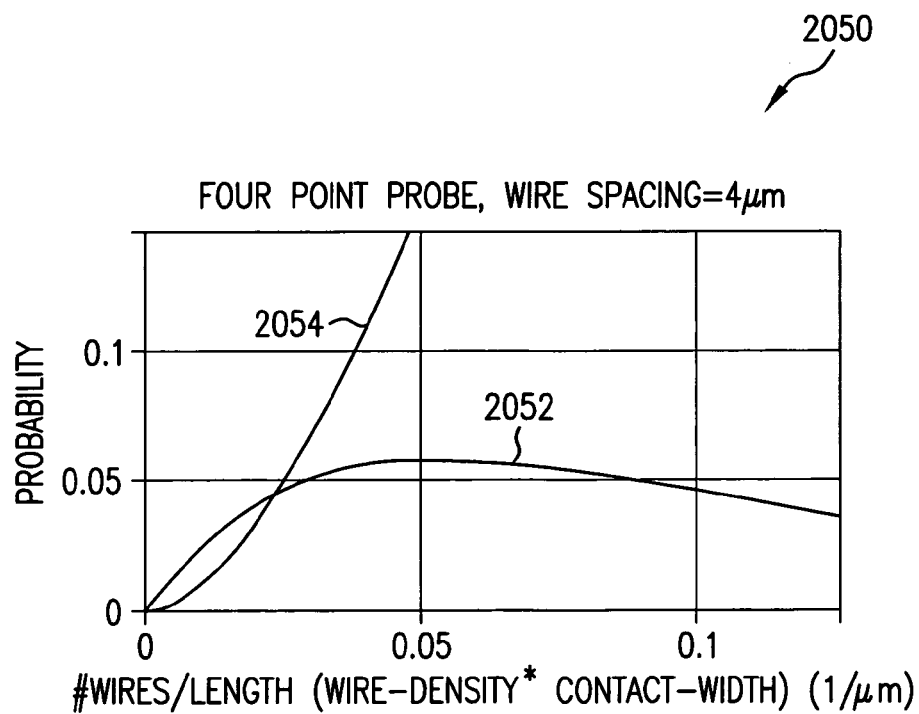

FIG. 20B shows a graph related to FIGS. 19D-19F.

Figure 21:
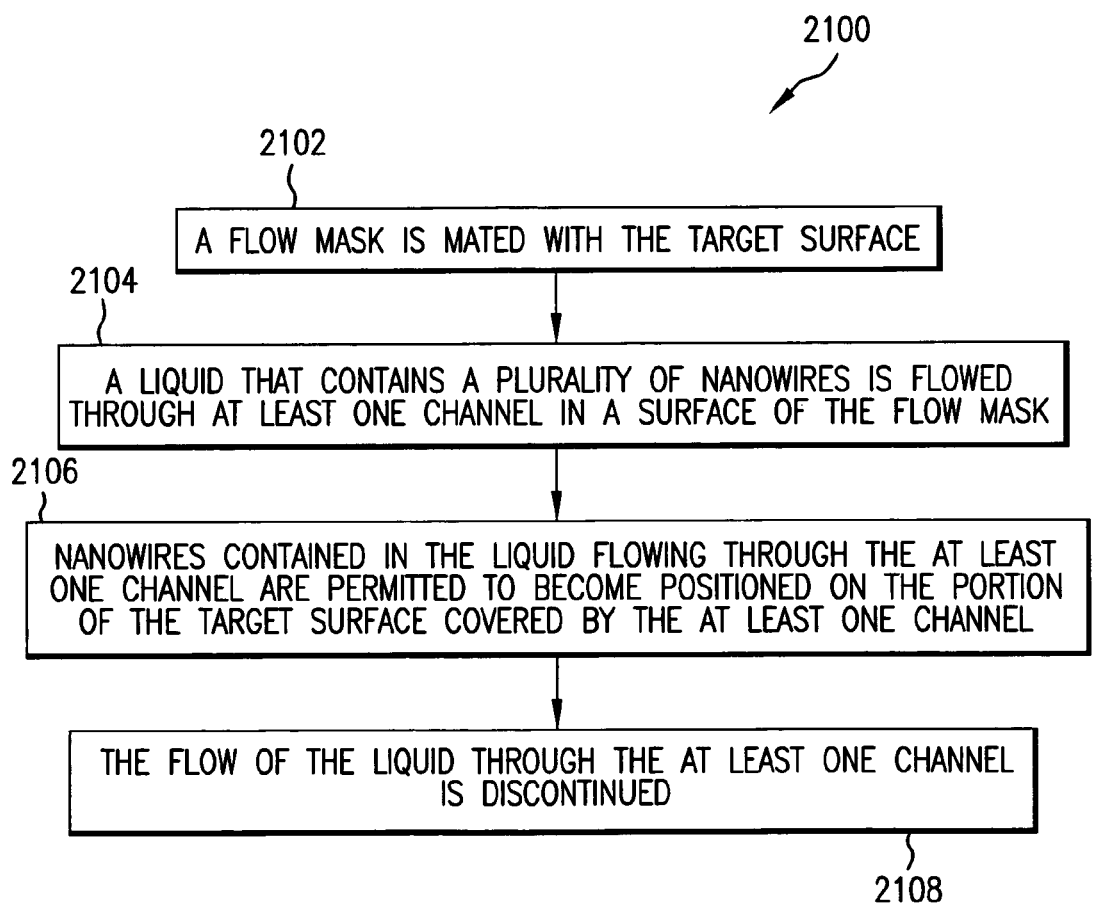

FIG. 21 shows a flowchart providing example steps for positioning nanowires on a target surface using a flow mask, according to an example embodiment of the present invention.

Figure 22:
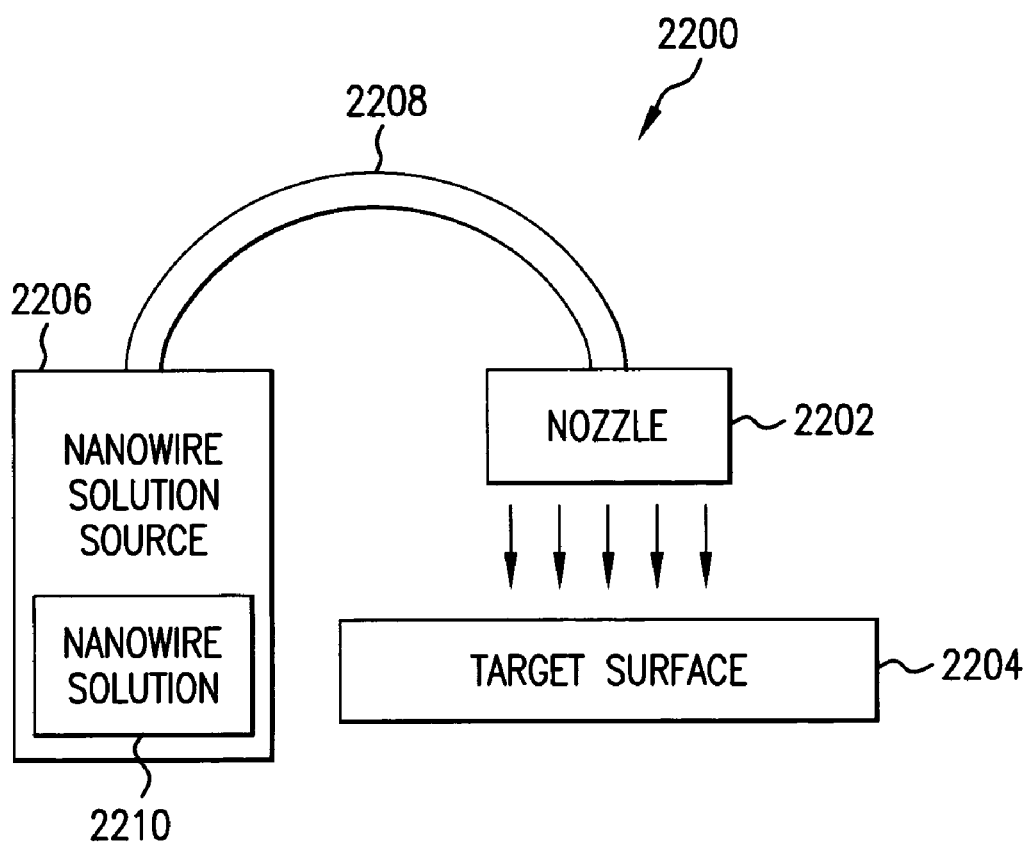

FIG. 22 shows a block diagram of an example nanowire spray application system, according to an embodiment of the present invention.

Figure 23:
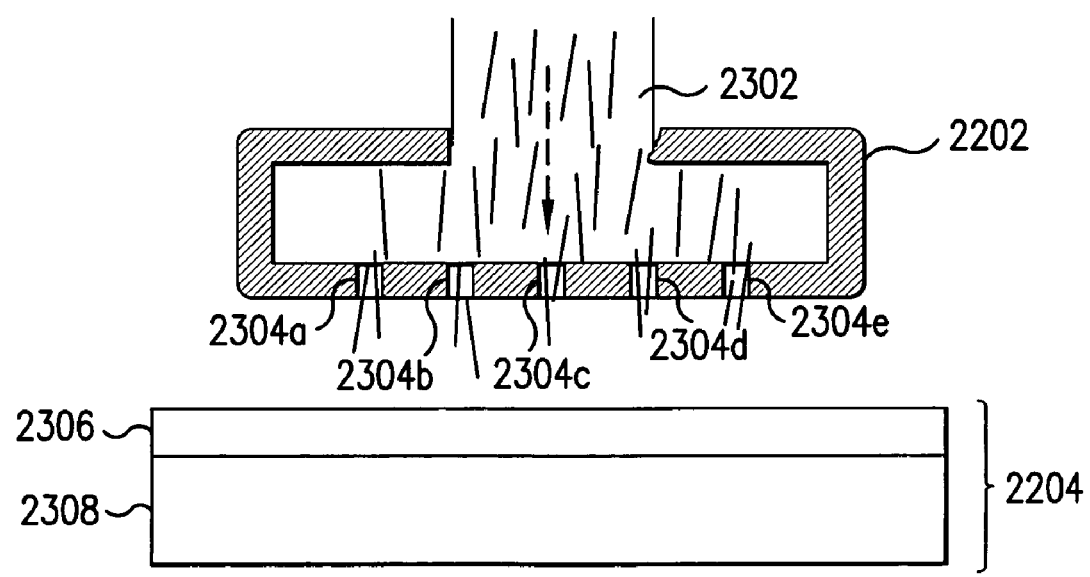

FIG. 23 shows a detailed view of a nozzle outputting a flow of nanowires onto an example target surface, according to an embodiment of the present invention.

Figure 24:
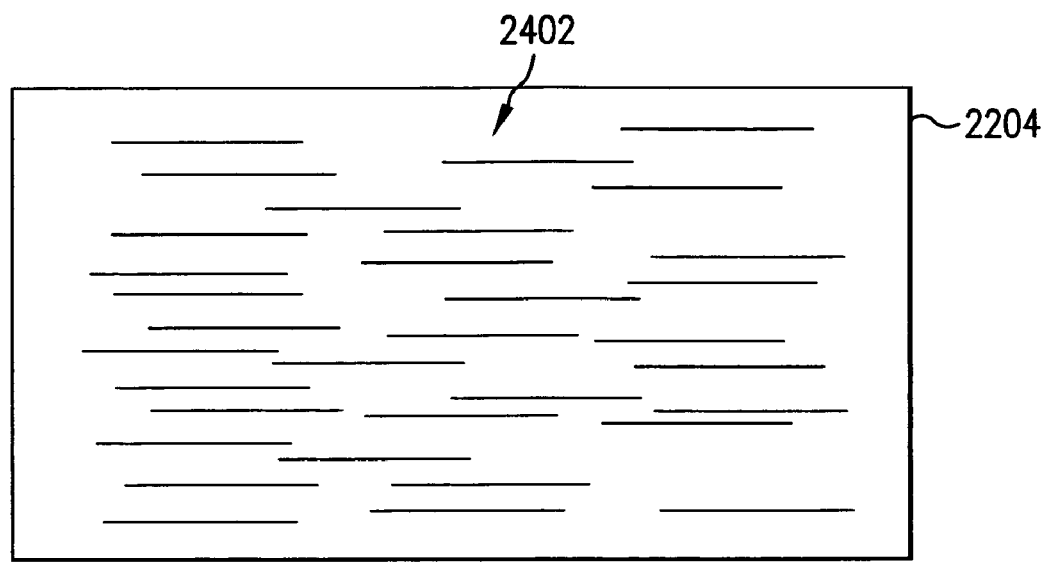
Figure 25:
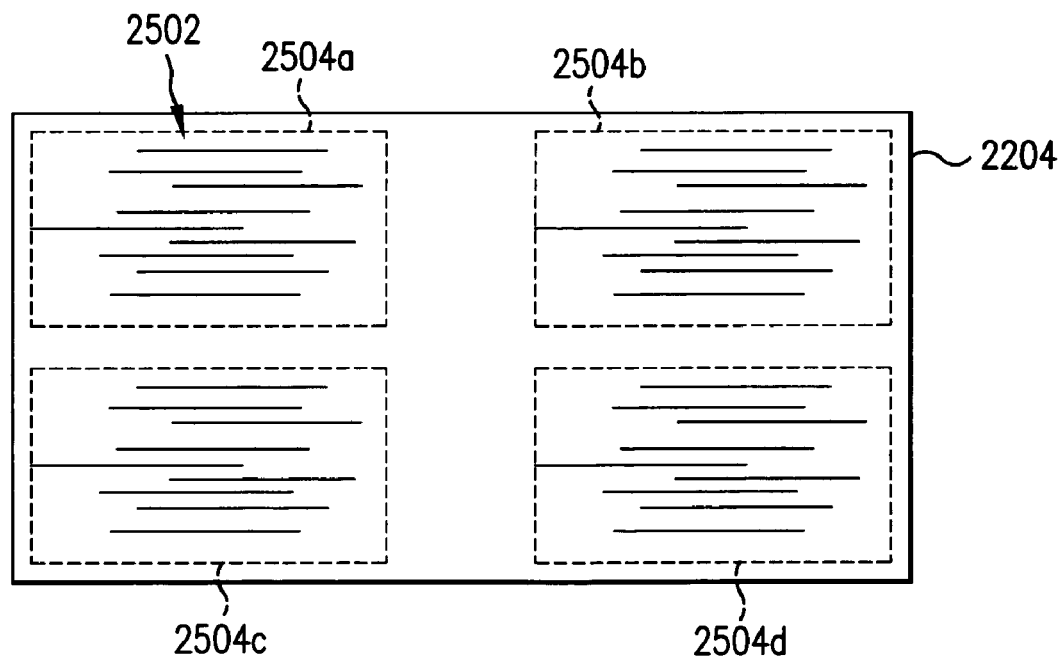

FIGS. 24 and 25 show plan views of a target surfaces having a plurality of nanowires positioned thereon, due to operation of the present invention.

Figure 26:
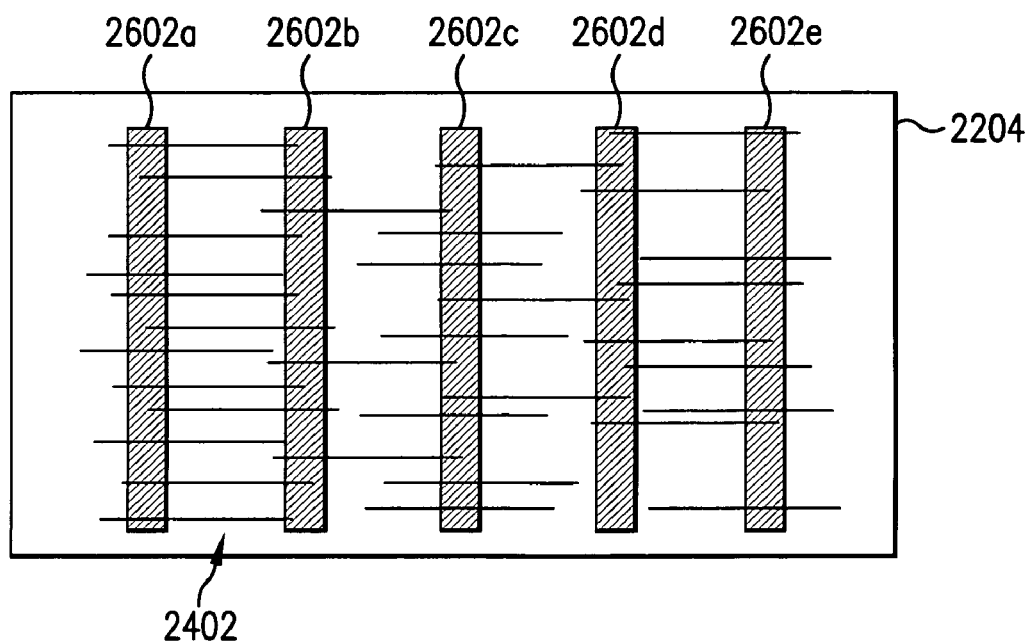

FIG. 26 shows a plan view of a target surface with a plurality of electrical contacts formed thereon, in electrical contact with nanowires, according to an embodiment of the present invention.

Figure 27:
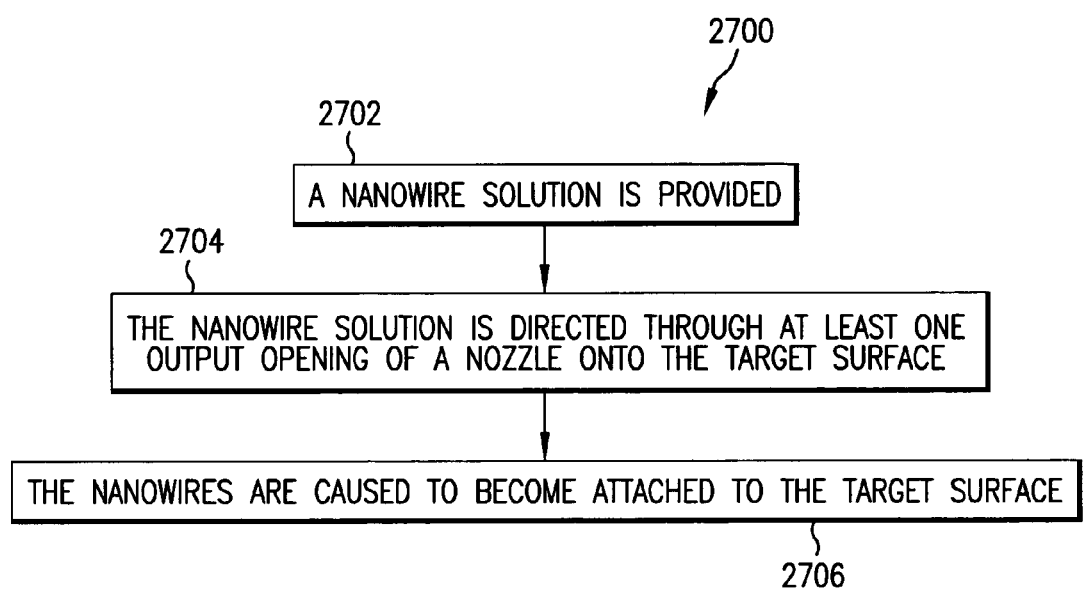

FIG. 27 shows a flowchart providing example steps for positioning nanowires on a target surface using spray techniques, according to an example embodiment of the present invention.

Figures 28, 29:
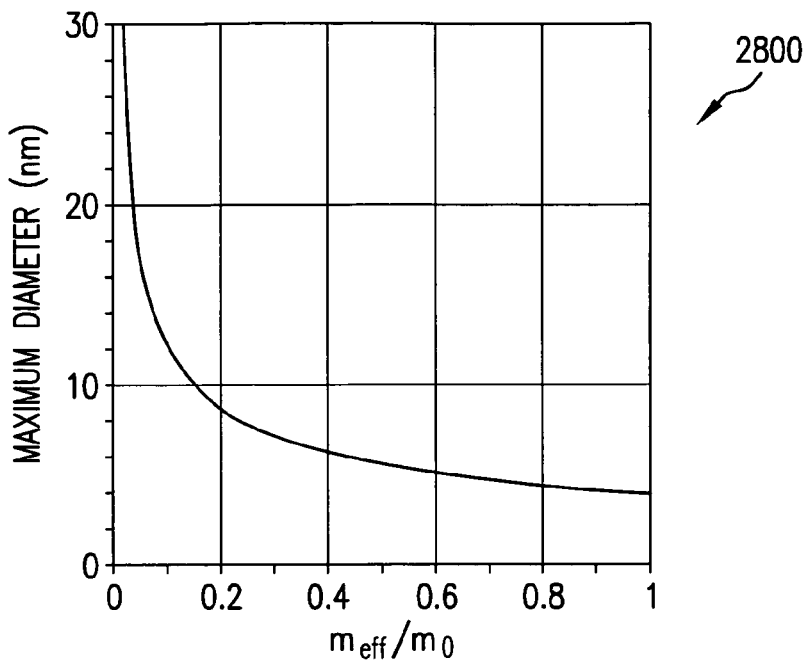

FIG. 28 shows a graph providing a relationship between a maximum allowable diameter for a semiconductor material and effective mass $m_{eff}$, according to an embodiment of the present invention.

FIG. 29 shows a table listing information about various example semiconductor materials.

Figure 30:
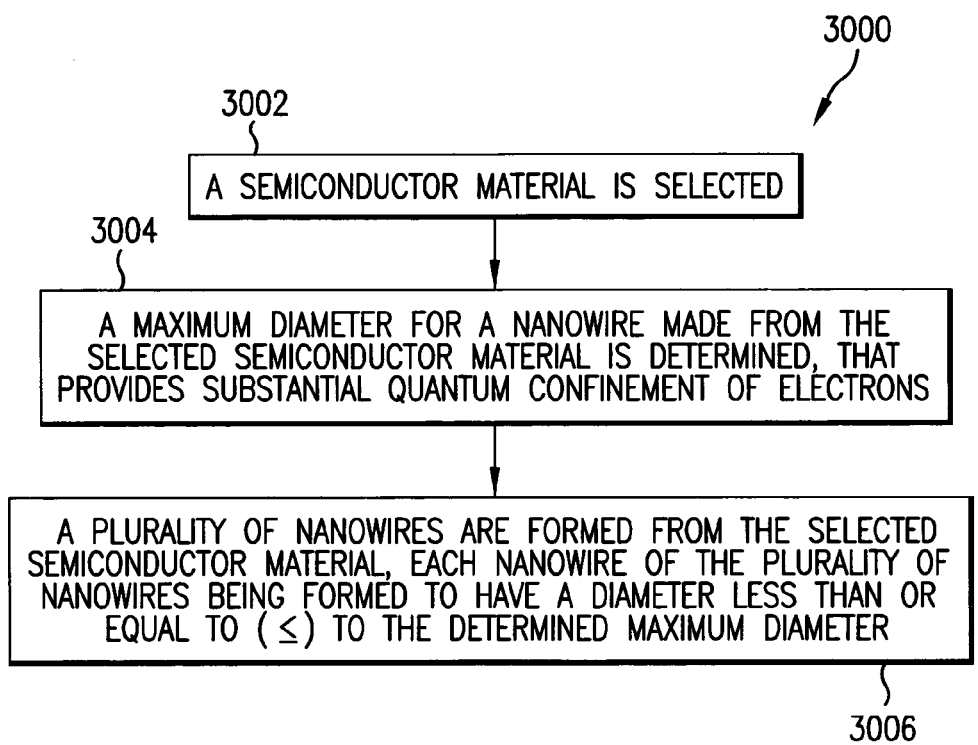

FIG. 30 shows a flowchart providing example steps for designing conducting nanowires having high mobility of electrons, according to an example embodiment of the present invention.

Figure 31:
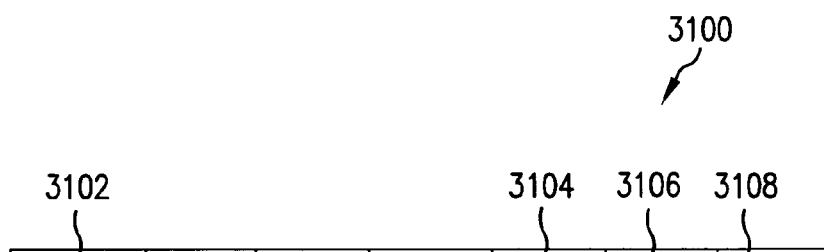

FIG. 31 shows a table listing information about example III-V semiconductor type materials.

Figure 32:
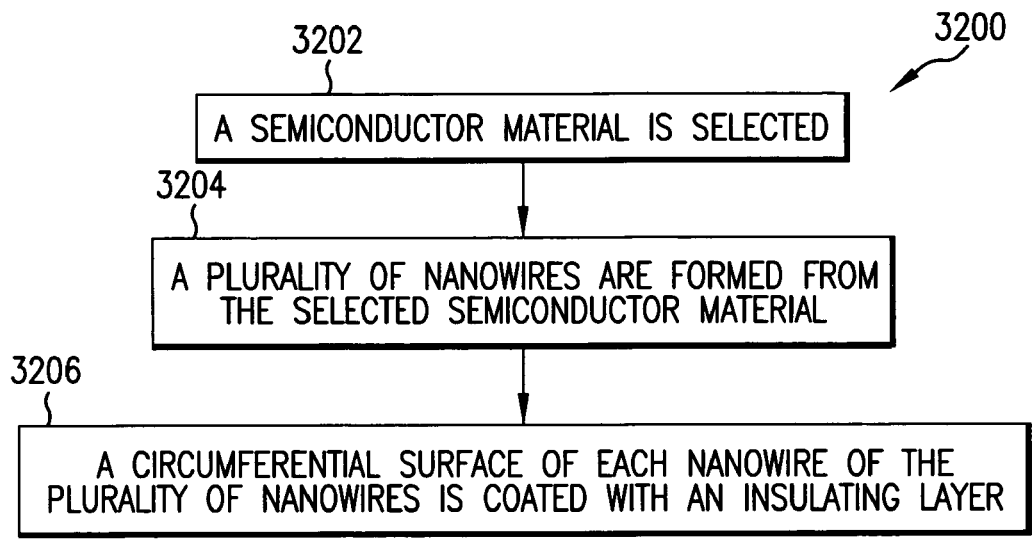
Figure 33:
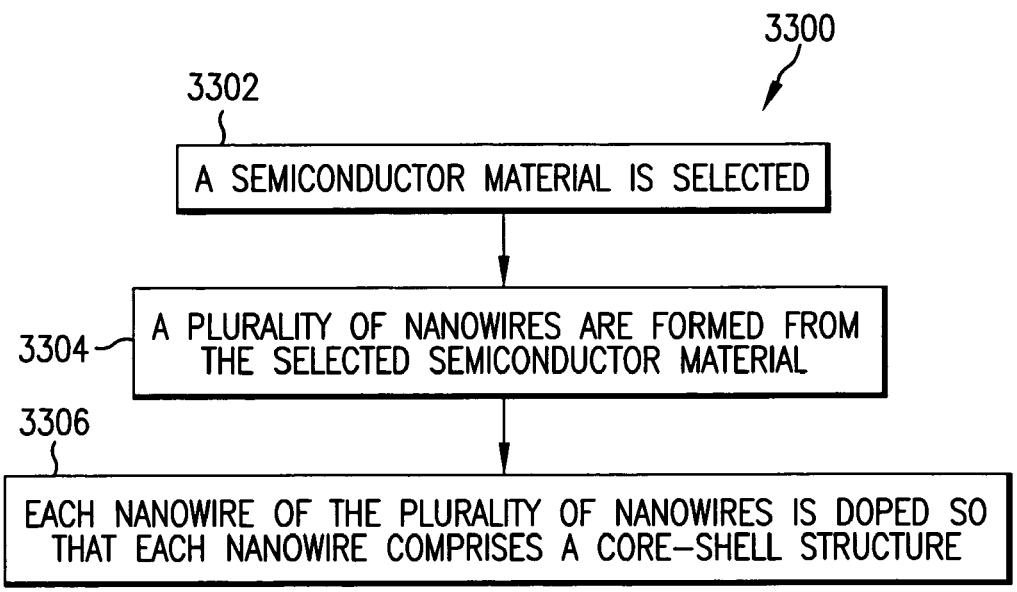

FIGS. 32 and 33 show flowcharts providing example steps for fabricating nanowires having reduced surface scattering, according to example embodiments of the present invention.

Figure 34C:
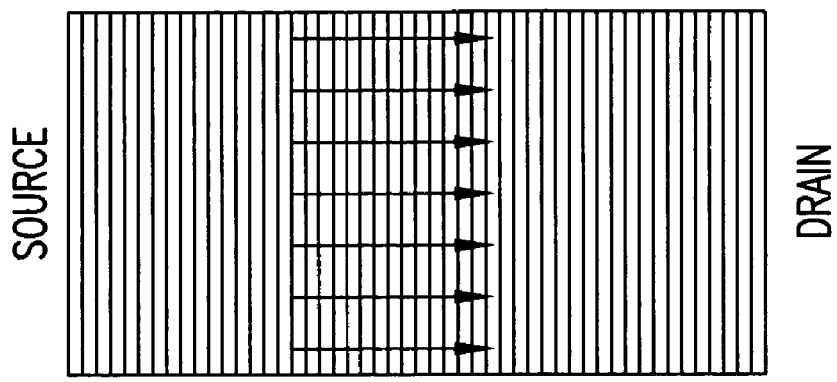
Figure 34B:
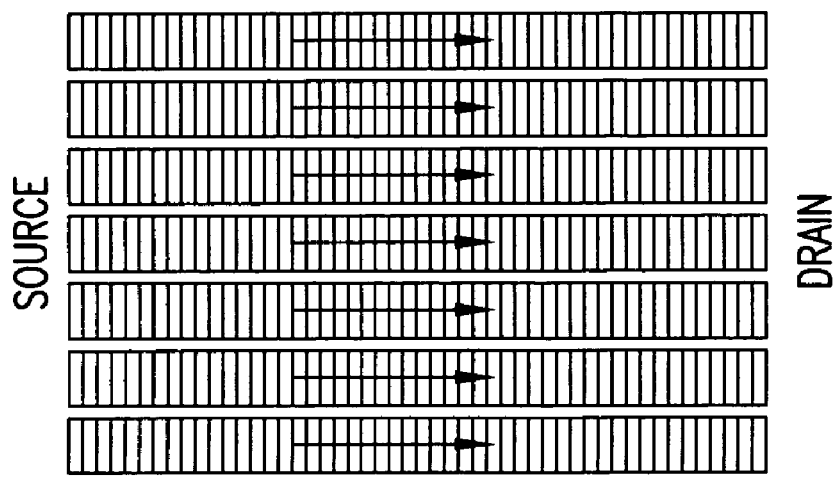
Figure 34A:
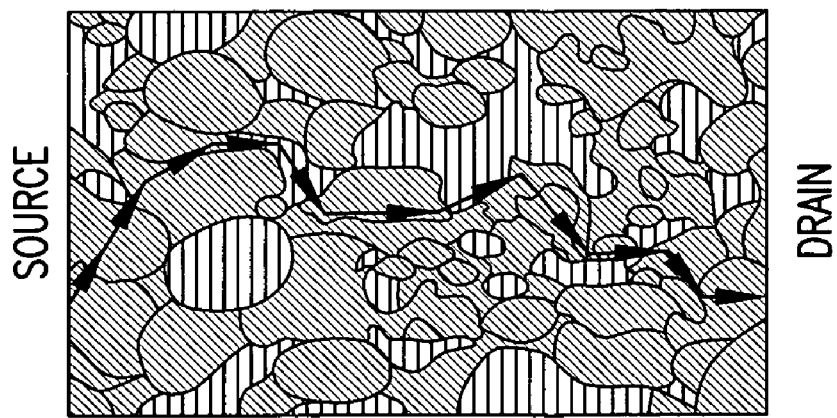

FIG. 34A is a diagram of amorphous or polycrystalline Si TFTs.

FIG. 34B is a diagram of a nanowire TFT, according to an embodiment of the invention.

FIG. 34C is a diagram of a nanoribbon TFT, according to an embodiment of the invention.

Figure 35A:
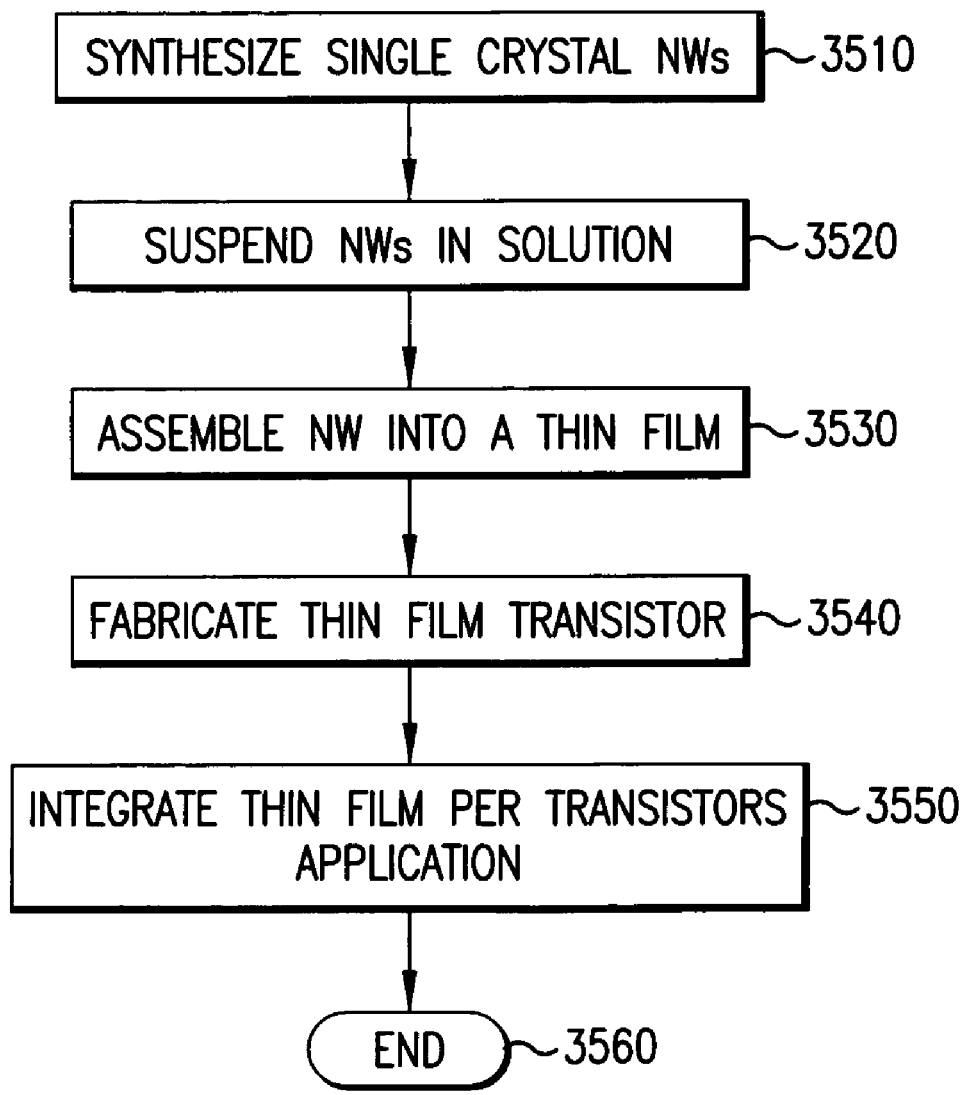

FIG. 35A is a flow chart of a method for NW-TFT fabrication, according to an embodiment of the invention.

Figures 35B, 35C, 35D:
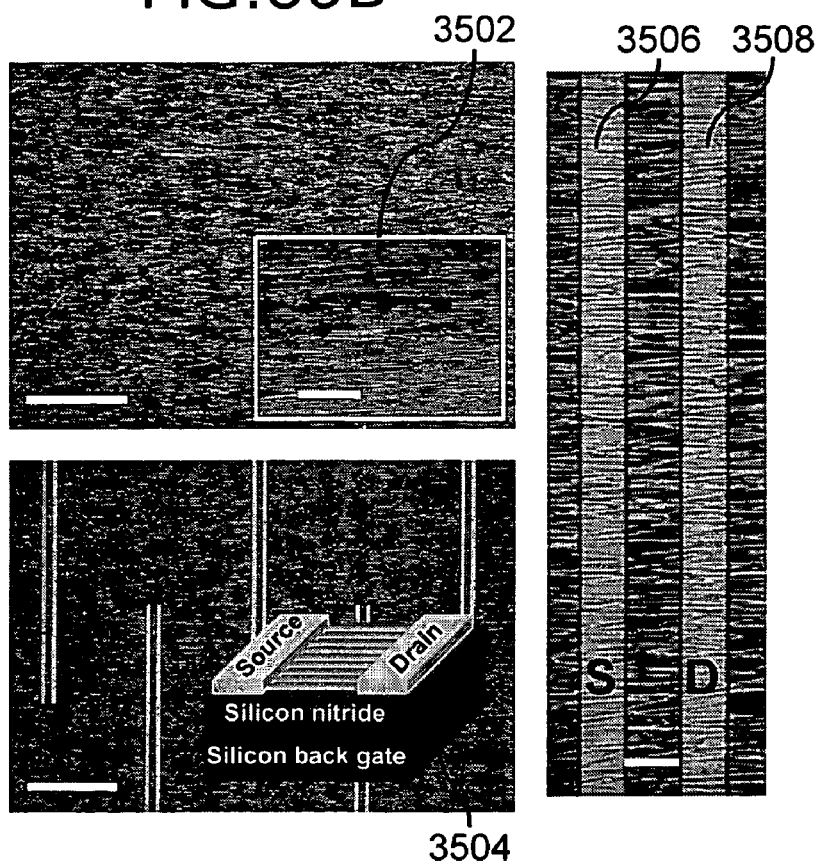

FIG. 35B is a diagram of an optical micrograph of a NW thin film, according to an embodiment of the invention.

FIG. 35C is a diagram of a NW-TFT with gold electrodes, according to an embodiment of the invention.

FIG. 35D is a diagram of an optical micrograph of a NW-TFT with parallel arrays of NWs bridging from source to drain electrodes, according to an embodiment of the invention.

Figure 36B:
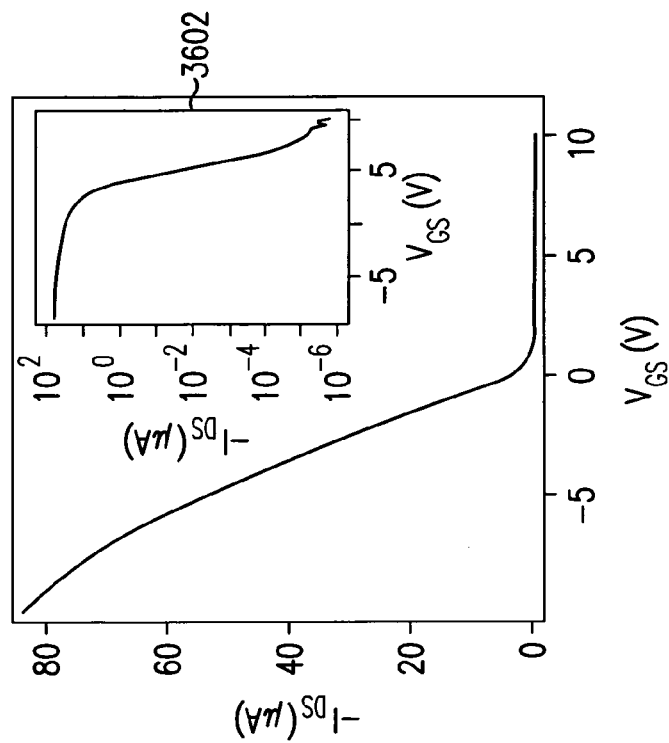
Figure 36A:
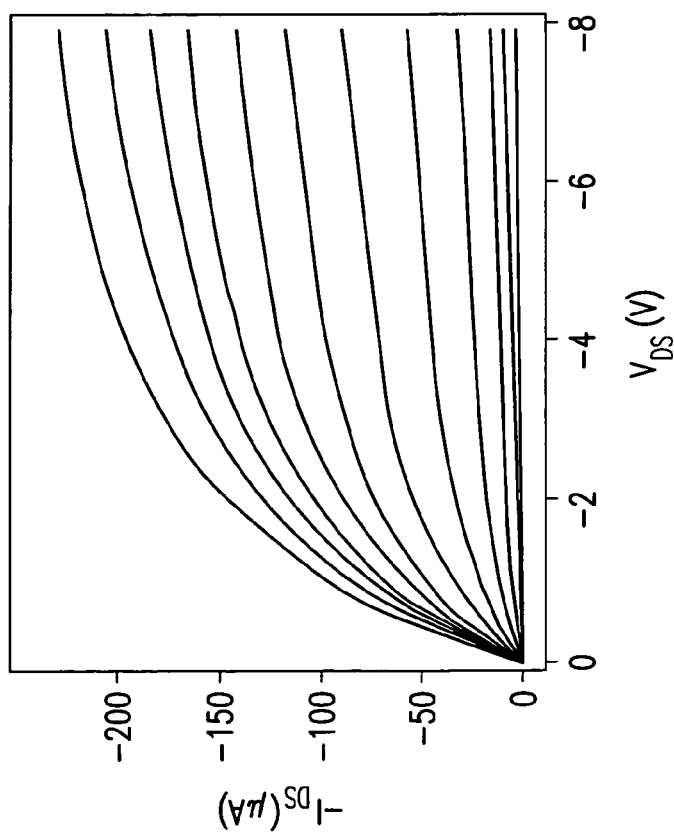

FIG. 36A is a chart showing typical drain current ($I_{DS}$) versus drain-source bias voltage ($V_{DS}$) relations at different gate voltages ($V_{GS}$) in the steps of 1 volt (V) for a NW-TFT, according to an embodiment of the invention.

FIG. 36B is a chart showing a plot of $I_{DS}$ versus $V_{GS}$, for a NW-TFT according to an embodiment of the invention.

Figure 36D:
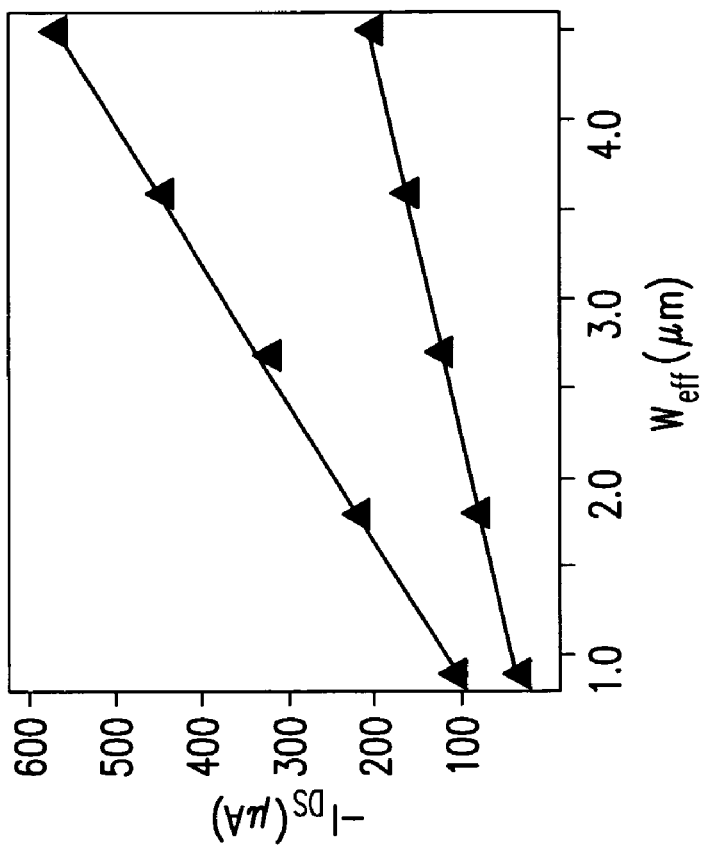
Figure 36C:
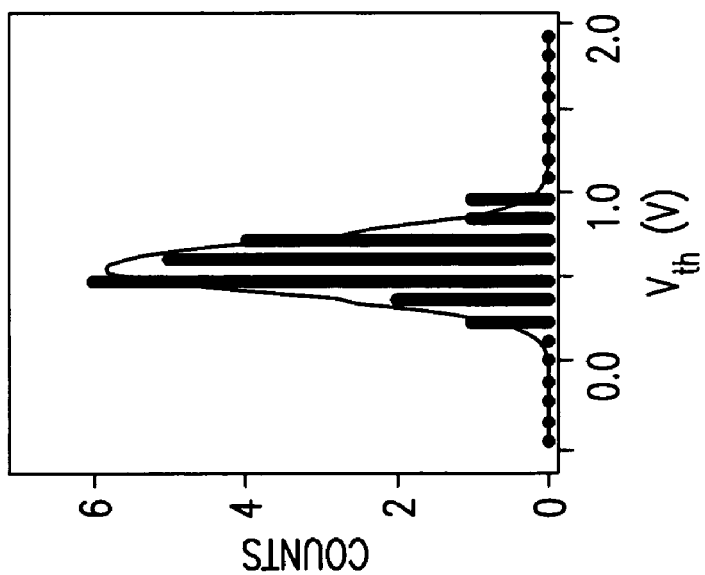

FIG. 36C is a chart showing a histogram of threshold voltage distribution for a NW-TFT, according to an embodiment of the invention.

FIG. 36D is a chart illustrating the linear-scale relation for the drain current when the device is turned on (Vgs=−10V) for a NW-TFT, according to an embodiment of the invention.

Figure 37A:
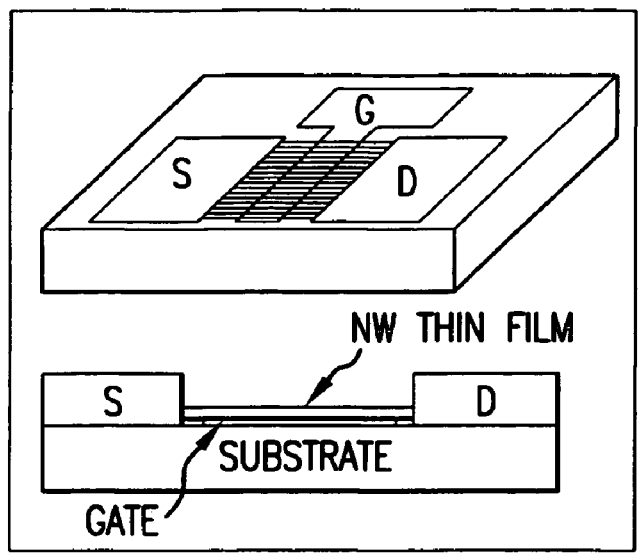

FIG. 37A is a diagram of a NW-TFT on a plastic substrate, according to an embodiment of the invention.

Figure 37B:
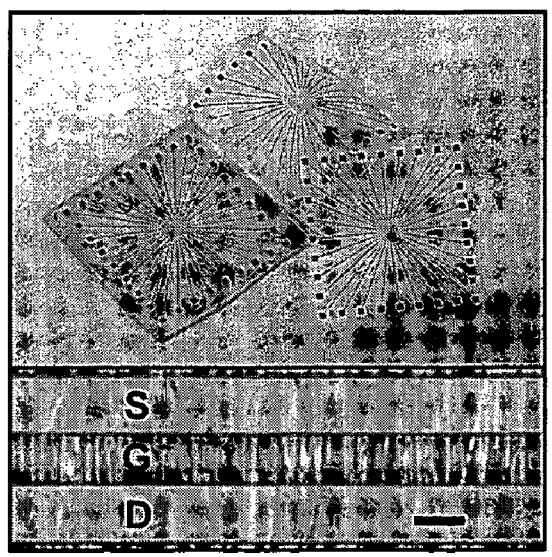

FIG. 37B is a diagram of several NW-TFTs on plastic substrates, according to an embodiment of the invention.

Figure 37D:
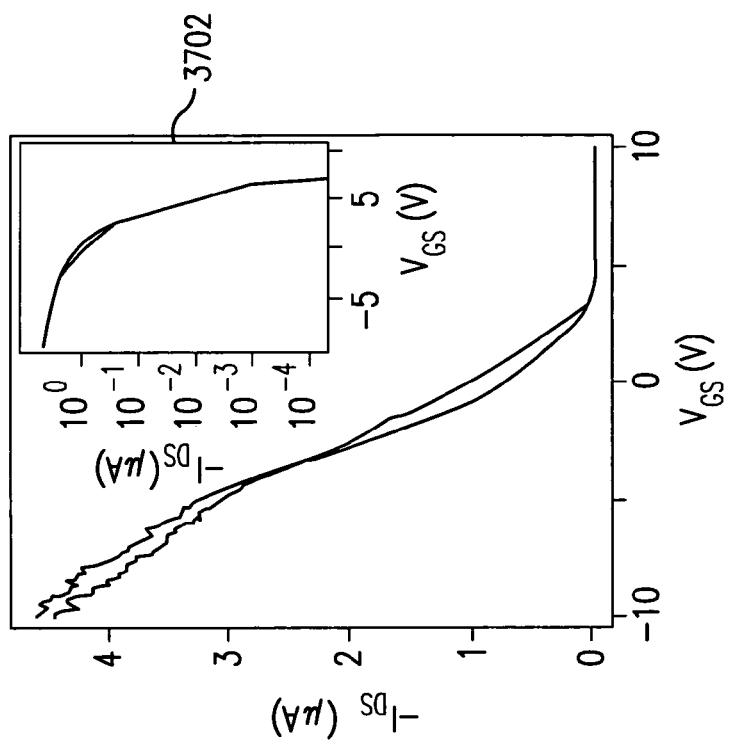
Figure 37C:
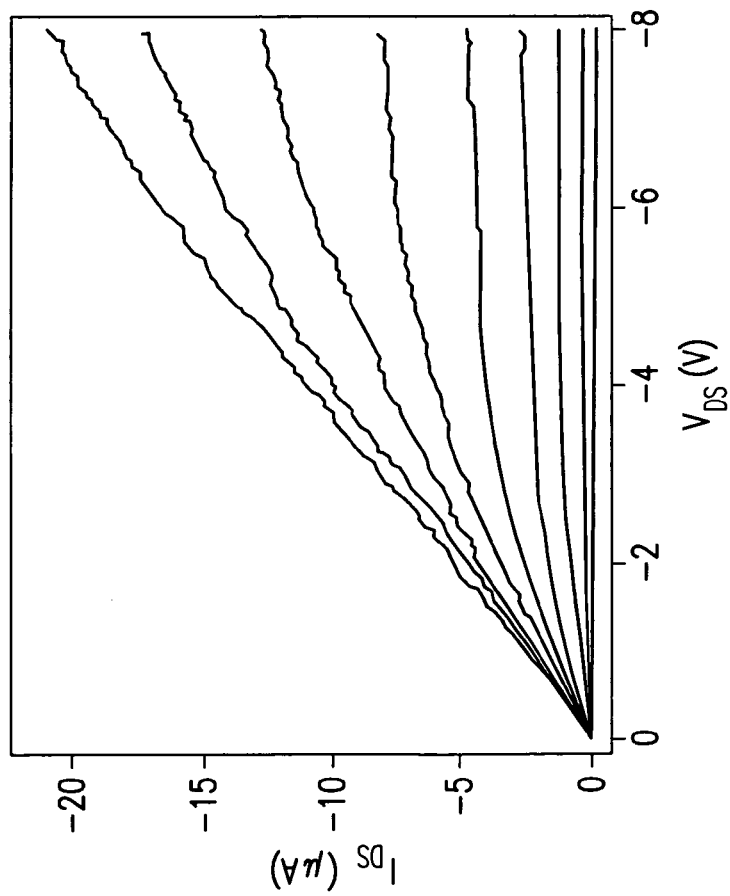

FIG. 37C is a diagram showing drain current ($I_{DS}$) versus drain-source bias voltage ($V_{DS}$) relations at different gate voltages ($V_{GS}$) in the steps of 1 volt (V) for a NW-TFT on a plastic substrate, according to an embodiment of the invention.

FIG. 37D is a diagram showing the transfer characteristics of the same NW-TFT before and after slight flexing of the plastic substrate, according to an embodiment of the invention.

Figure 38A:
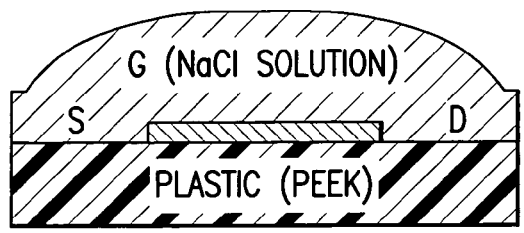

FIG. 38A is a diagram of a NW-TFT on a plastic substrate with an electrolyte solution gate, according to an embodiment of the invention.

Figure 38B:
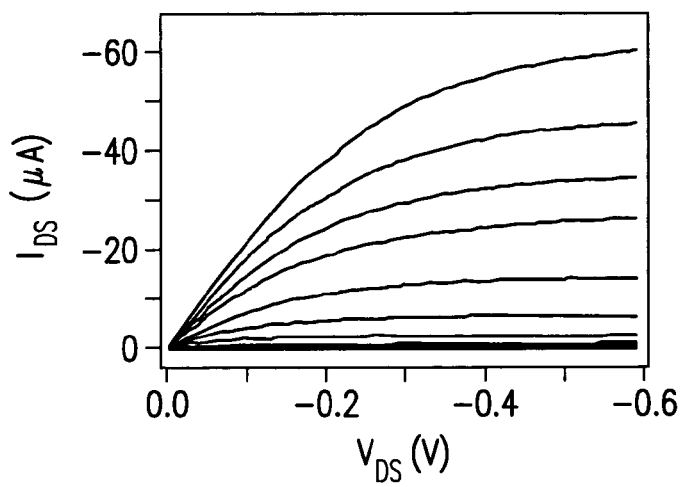

FIG. 38B is a chart of the $I_{DS}$–$V_{DS}$ relation as a function of various electrolyte solution gate voltages for a NW-TFT on a plastic substrate, according to an embodiment of the invention.

Figure 38C:
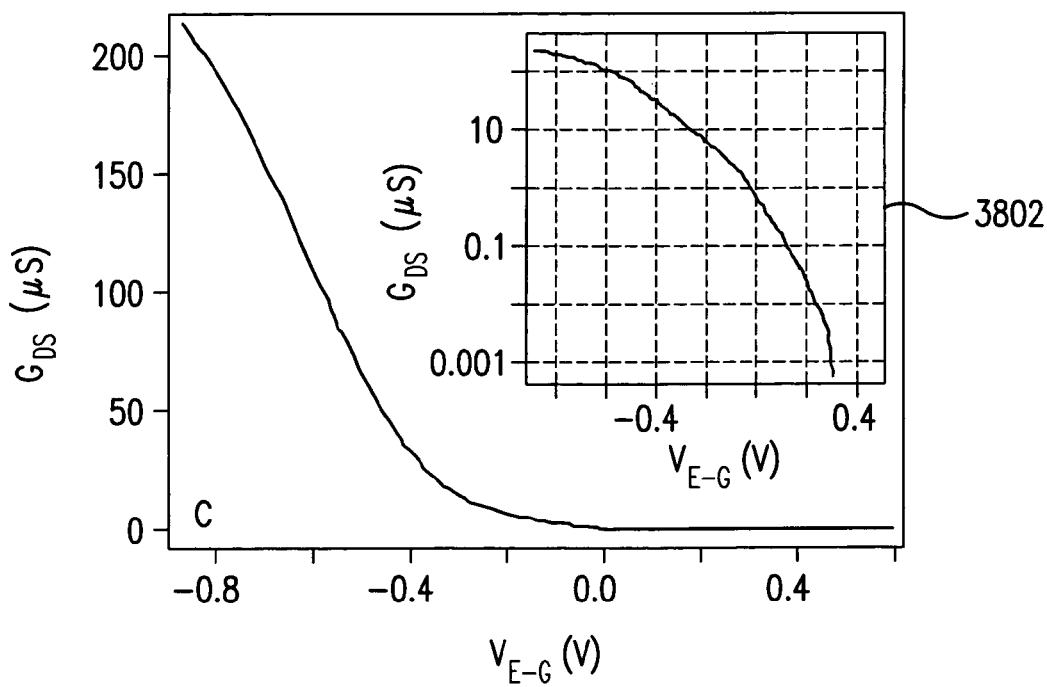

FIG. 38C is a chart of the $I_{DS}$–$V_{GS}$ relation for a $V_{DS}$ of 10 mV for a NW-TFT on a plastic substrate with an electrolyte solution gate, according to an embodiment of the invention.

Figure 39A:
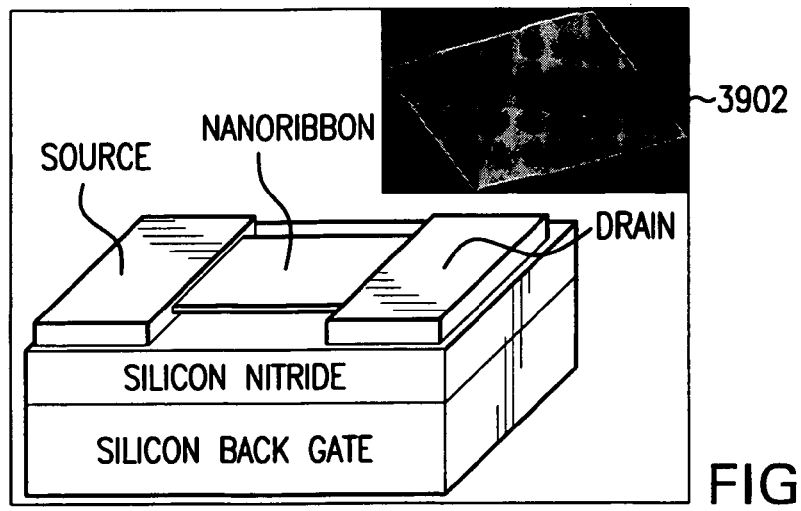

FIG. 39A is a diagram of a CdS nanoribbon TFT, according to an embodiment of the invention.

Figure 39B:
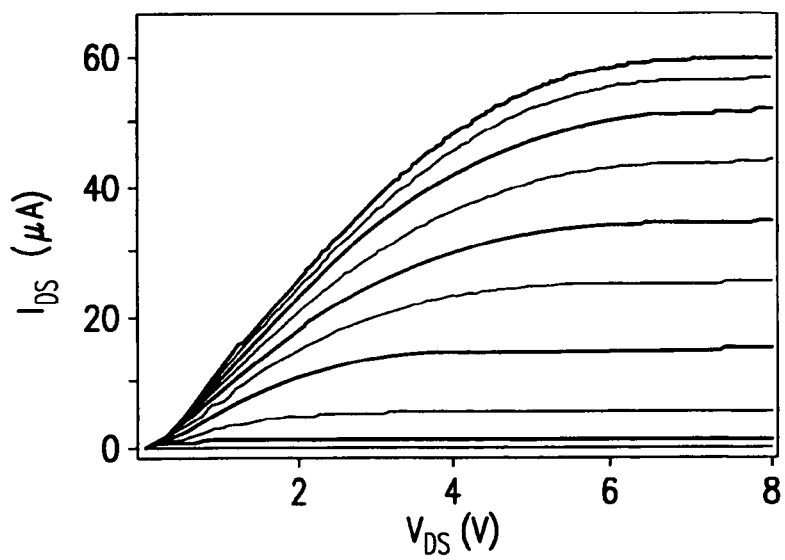

FIG. 39B is a chart of the $I_{DS}$–$V_{DS}$ relation as a function of various gate voltages for a CdS nanoribbon TFT, according to an embodiment of the invention.

Figure 39C:
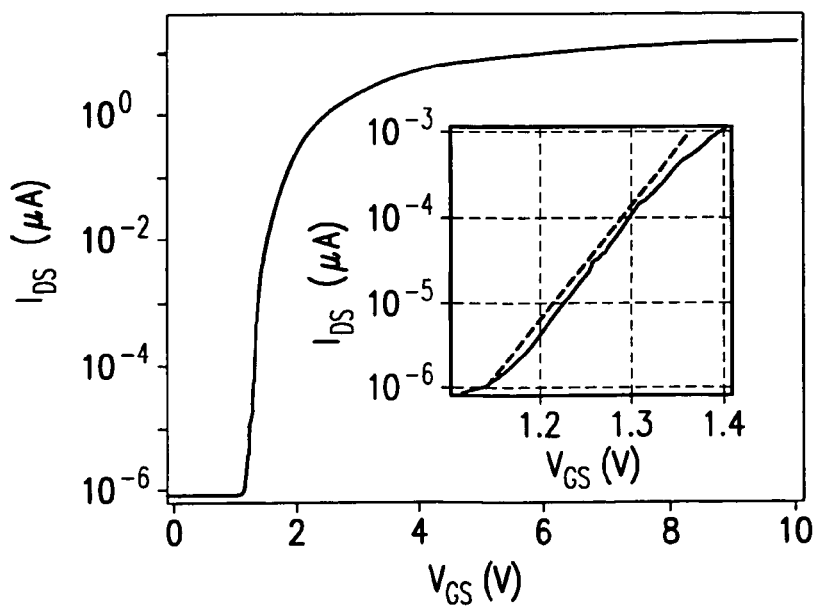

FIG. 39C is a chart of the $I_{DS}$–$V_{GS}$ relation with a $V_{DS}$ of 1 V for a CdS nanoribbon TFT, according to an embodiment of the invention.

Figure 40:
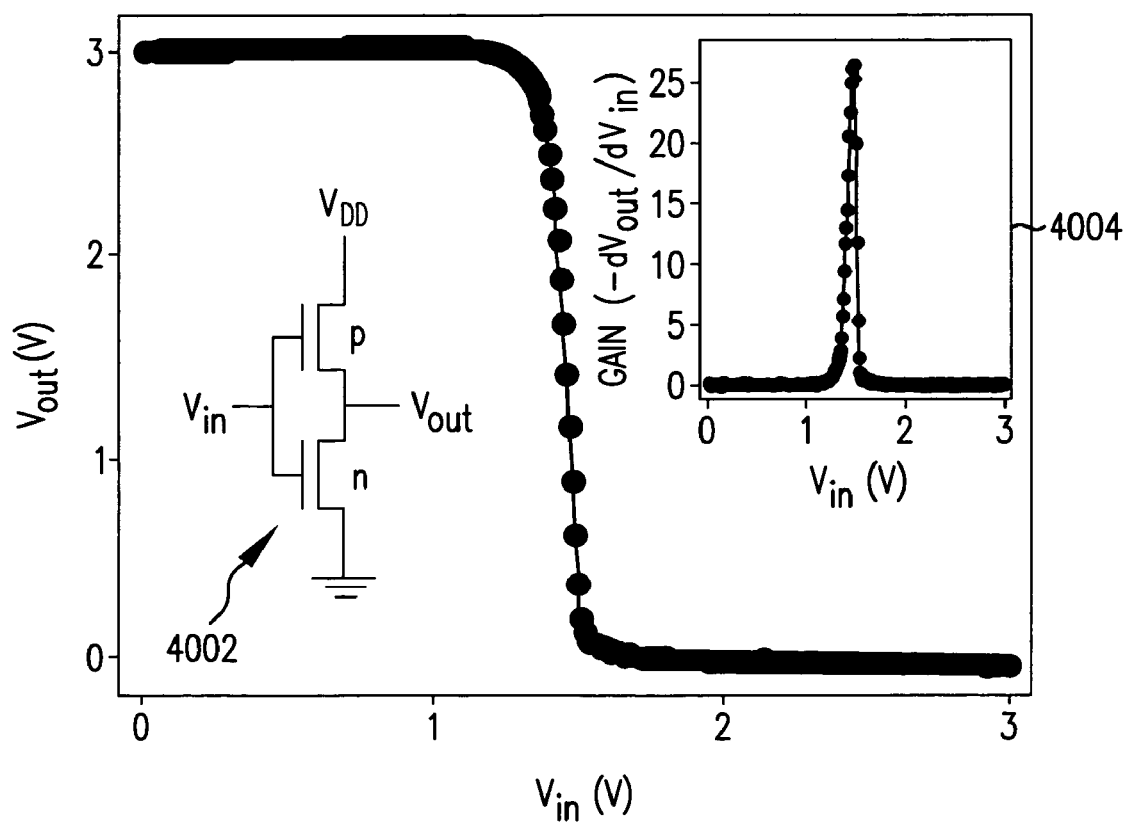

FIG. 40 is a diagram of a complementary inverter made with a p-channel NW-TFT and an n-channel CdS nanoribbon TFT along with gain characteristics, according to an embodiment of the invention.

Figure 41A:
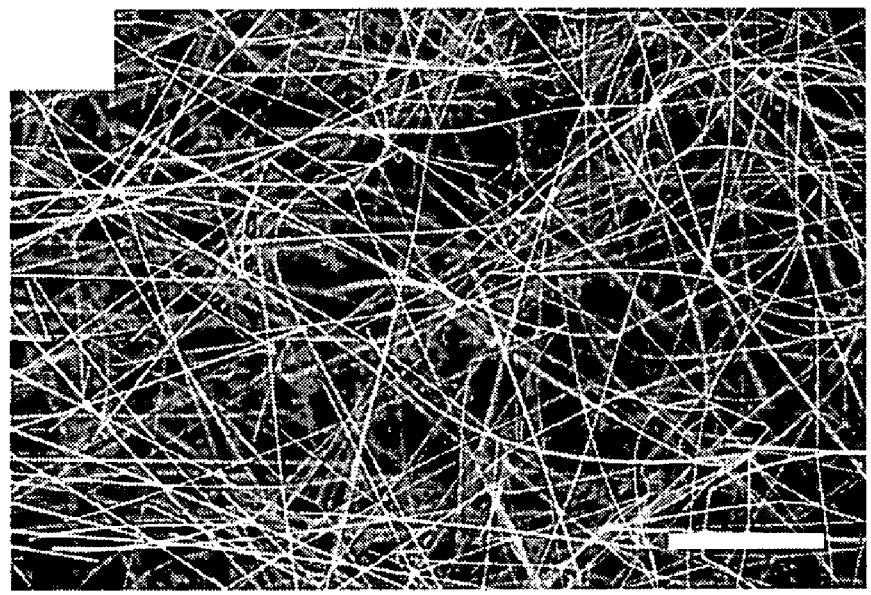

FIG. 41A shows a scanning electron microscope image of synthesized silicon nanowires, according to an example embodiment of the present invention.

Figure 41B:
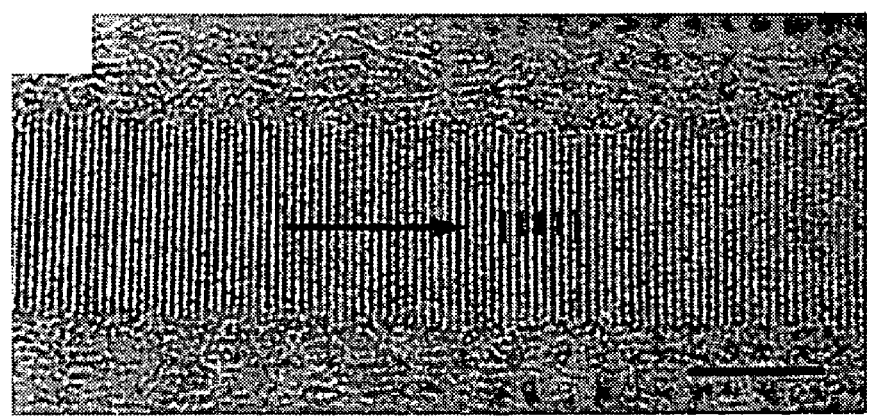

FIG. 41B shows a lattice-resolved transmission electron microscope image of individual Si nanowires, according to an example embodiment of the present invention.

Figure 42:
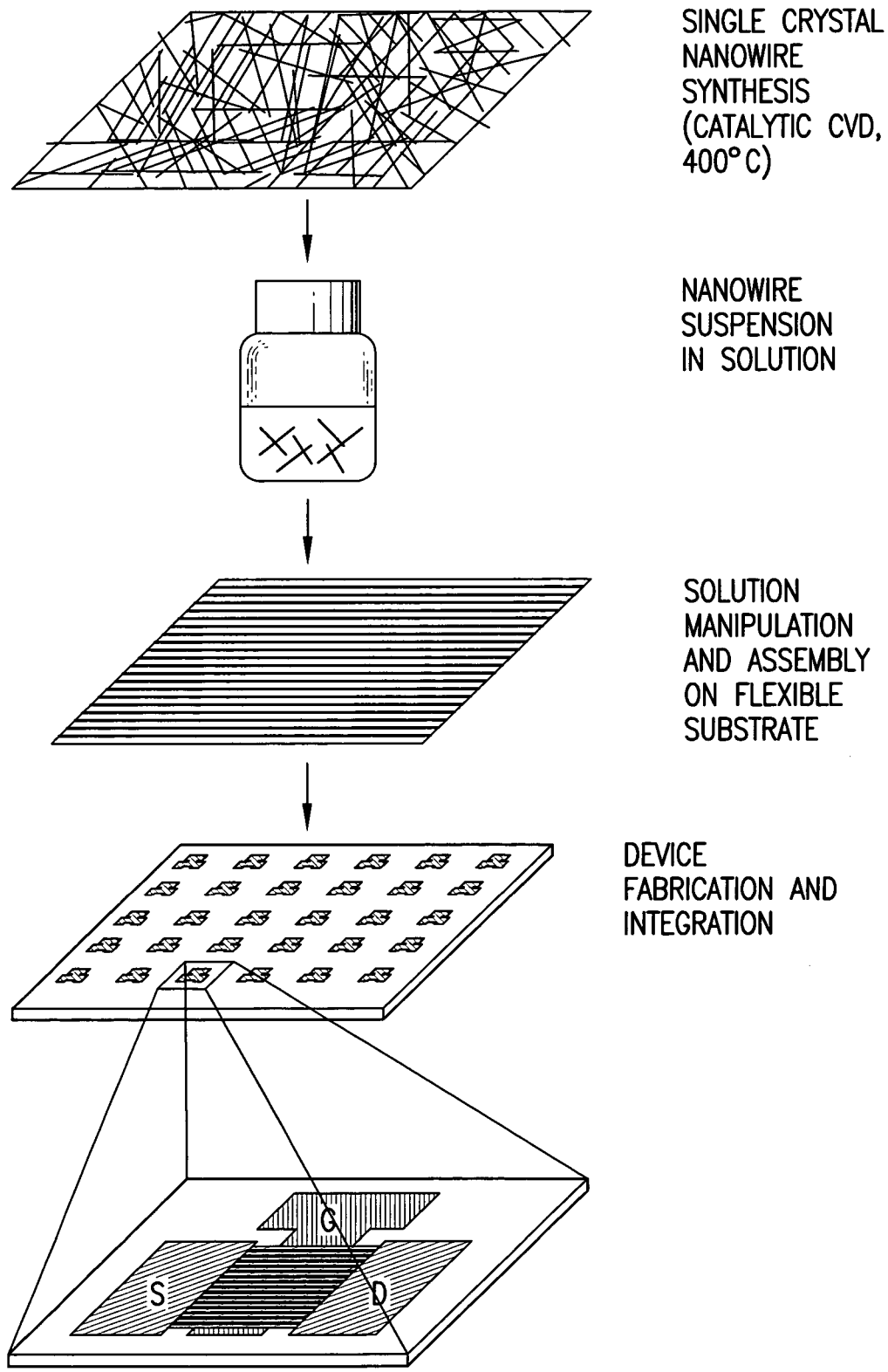

FIG. 42 shows a flow diagram of a process for synthesizing and implementing high mobility nanowire thin film transistors, according to an example embodiment of the present invention.

Figure 43:
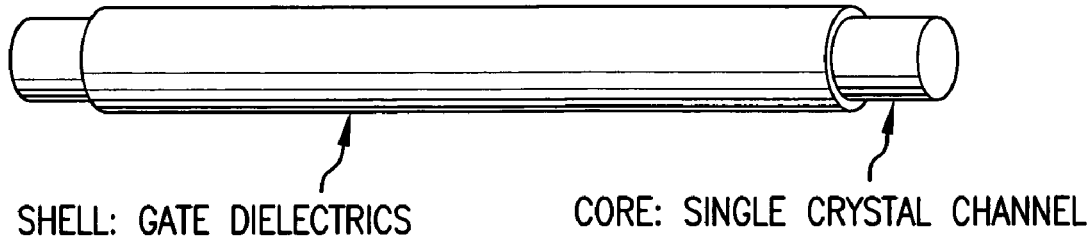

FIG. 43 shows a silicon nanowire core-shell structure with a single crystalline core and dielectric overcoating, according to an example embodiment of the present invention.

Figure 44A:
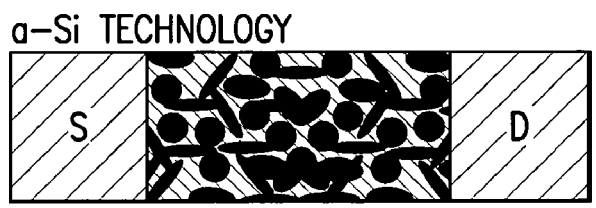
Figure 44B:
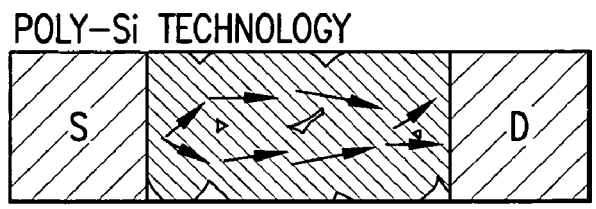
Figure 44C:
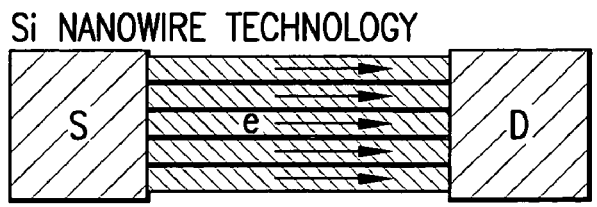

FIGS. 44A-C shows schematic views of thin film transistors (TFTs) fabricated from amorphous silicon, polysilicon, and an aligned nanowire thin film.

Figure 45:
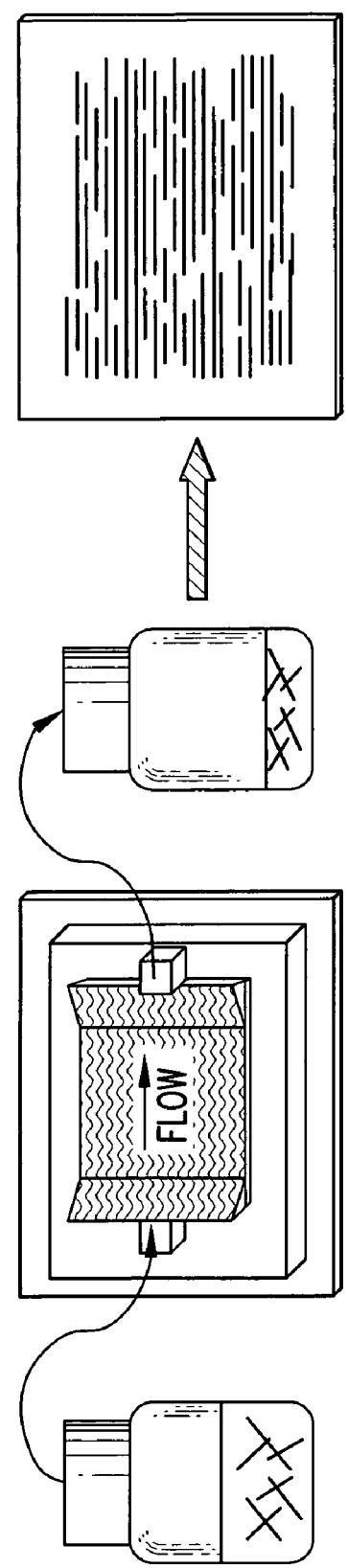

FIG. 45 shows a diagram of a fluidic cell for aligning nanowires over a large area, according to an embodiment of the present invention.

Figure 46:
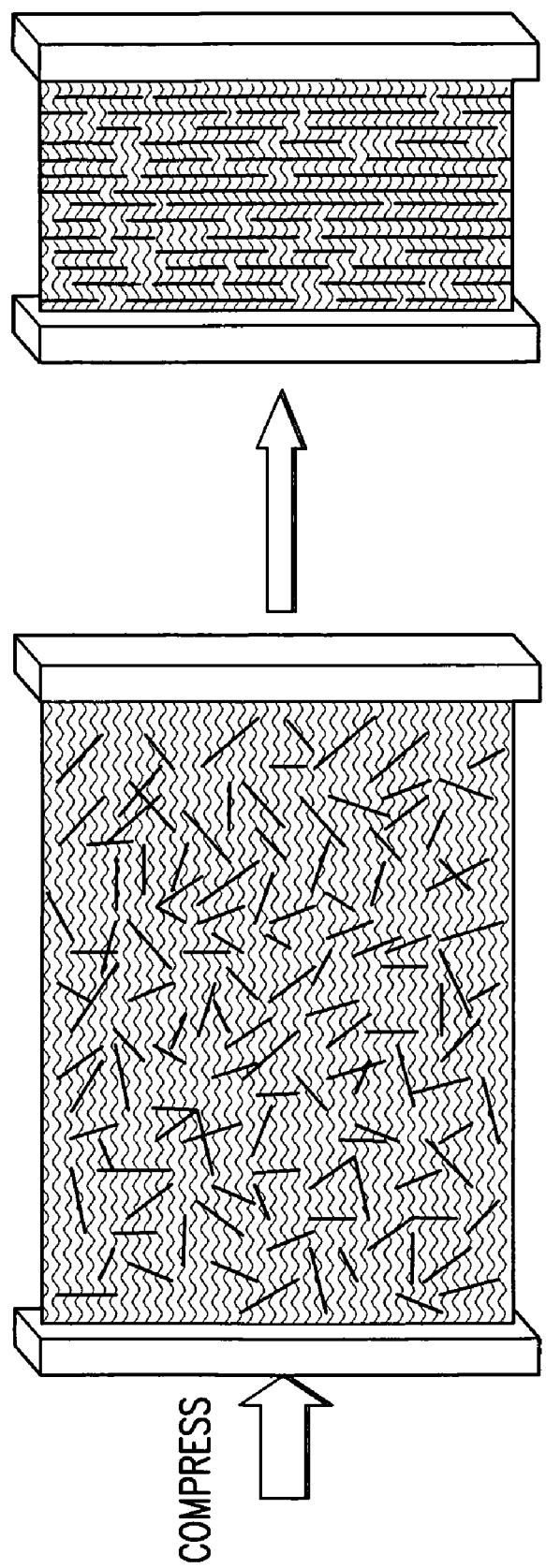

FIG. 46 shows a diagram illustrating the alignment of nanowires over a large area using a Langmuir-Blodgett film, according to an example embodiment of the present invention.

Figure 47:
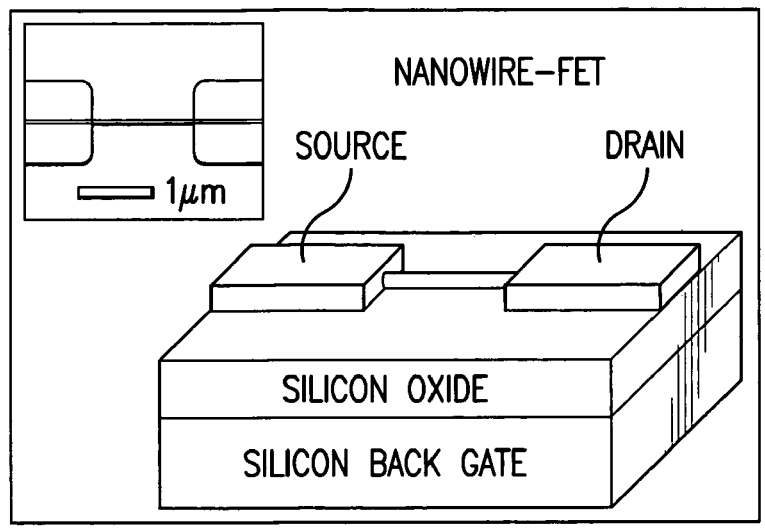

FIG. 47 shows plan and perspective views of a single nanowire field effect transistor, according to an example embodiment of the present invention.

Figure 48A:
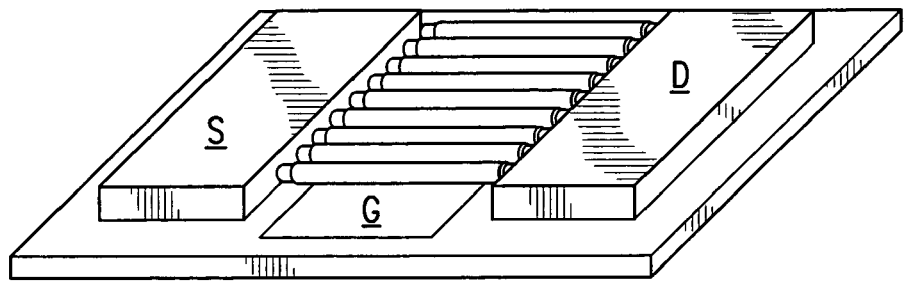
Figure 48B:
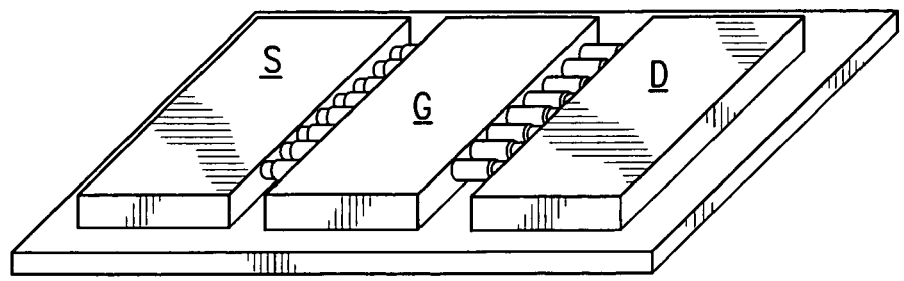

FIGS. 48A and 48B show perspective views of locally gated nanowire thin film transistors, according to embodiments of the present invention.

Figure 49:
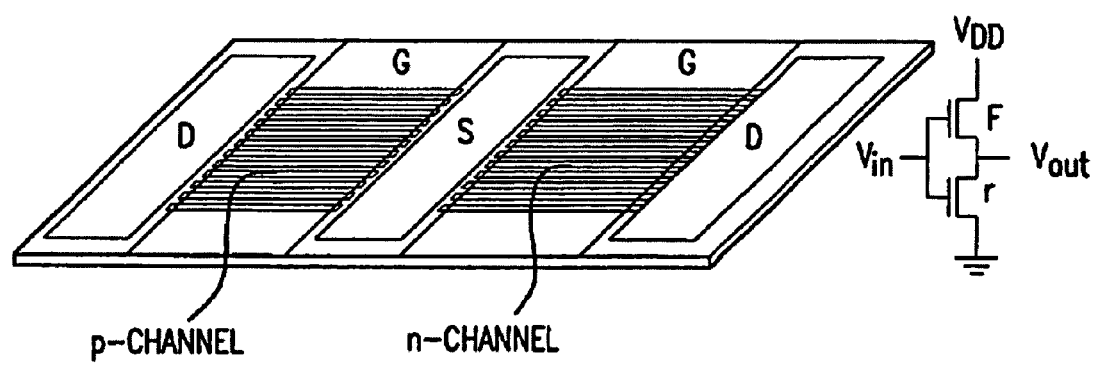

FIG. 49 schematically illustrates an alternative embodiment of a substrate having a plurality of semiconductor devices thereon.

The present invention will now be described with reference to the accompanying drawings. In the drawings, like reference numbers indicate identical or functionally similar elements. Additionally, the left-most digit(s) of a reference number identifies the drawing in which the reference number first appears.

DETAILED DESCRIPTION OF THE INVENTION

Introduction

It should be appreciated that the particular implementations shown and described herein are examples of the invention and are not intended to otherwise limit the scope of the present invention in any way. Indeed, for the sake of brevity, conventional electronics, manufacturing, semiconductor devices, and nanowire (NW), nanorod, nanotube, and nanoribbon technologies and other functional aspects of the systems (and components of the individual operating components of the systems) may not be described in detail herein. Furthermore, for purposes of brevity, the invention is frequently described herein as pertaining to nanowires, and to a semiconductor transistor device. Moreover, while the number of nanowires and spacing of those nanowires are provided for the specific implementations discussed, the implementations are not intended to be limiting and a wide range of the number of nanowires and spacing can also be used. It should be appreciated that although nanowires are frequently referred to, the techniques described herein are also applicable to nanorods, nanotubes, and nanoribbons. It should further be appreciated that the manufacturing techniques described herein could be used to create any semiconductor device type, and other electronic component types. Further, the techniques would be suitable for application in electrical systems, optical systems, consumer electronics, industrial electronics, wireless systems, space applications, or any other application.

As used herein, the term "nanowire" generally refers to any elongated conductive or semiconductive material (or other material described herein) that includes at least one cross sectional dimension that is less than 500 nm, and preferably, less than 100 nm, and has an aspect ratio (length:width) of greater than 10, preferably, greater than 50, and more preferably, greater than 100. Examples of such nanowires include semiconductor nanowires as described in Published International Patent Application Nos. WO 02/17362, WO 02/48701, and 01/03208, carbon nanotubes, and other elongated conductive or semiconductive structures of like dimensions.

As used herein, the term "nanorod" generally refers to any elongated conductive or semiconductive material (or other material described herein) similar to a nanowire, but having an aspect ratio (length:width) less than that of a nanowire. Note that two or more nanorods can be coupled together along their longitudinal axis so that the coupled nanorods span all the way between electrodes. Alternatively, two or more nanorods can be substantially aligned along their longitudinal axis, but not coupled together, such that a small gap exists between the ends of the two or more nanorods. In this case, electrons can flow from one nanorod to another by hopping from one nanorod to another to traverse the small gap. The two or more nanorods can be substantially aligned, such that they form a path by which electrons can travel between electrodes.

While the example implementations described herein principally use CdS and Si, other types of materials for nanowires and nanoribbons can be used, including semiconductive nanowires or nanoribbons, that are comprised of semiconductor material selected from, e.g., Si, Ge, Sn, Se, Te, B, C (including diamond), P, B—C, B—P(BP6), B—Si, Si—C, Si—Ge, Si—Sn and Ge—Sn, SiC, BN/BP/BAs, AlN/AlP/AlAs/AlSb, GaN/GaP/GaAs/GaSb, InN/InP/InAs/InSb, BN/BP/BAs, AlN/AlP/AlAs/AlSb, GaN/GaP/GaAs/GaSb, InN/InP/InAs/InSb, ZnO/ZnS/ZnSe/ZnTe, CdS/CdSe/CdTe, HgS/HgSe/HgTe, BeS/BeSe/BeTe/MgS/MgSe, GeS, GeSe, GeTe, SnS, SnSe, SnTe, PbO, PbS, PbSe, PbTe, CuF, CuCl, CuBr, CuI, AgF, AgCl, AgBr, AgI, BeSiN2, CaCN$_2$, ZnGeP$_2$, CdSnAs$_2$, ZnSnSb$_2$, CuGeP$_3$, CuSi$_2$P$_3$, (Cu, Ag)(Al, Ga, In, Tl, Fe)(S, Se, Te)$_2$, Si$_3$N$_4$, Ge$_3$N$_4$, Al$_2$O$_3$, (Al, Ga, In)$_2$ (S, Se, Te)$_3$, Al$_2$CO, and an appropriate combination of two or more such semiconductors.

In certain aspects, the semiconductor may comprise a dopant from a group consisting of: a p-type dopant from Group III of the periodic table; an n-type dopant from Group V of the periodic table; a p-type dopant selected from a group consisting of: B, Al and In; an n-type dopant selected from a group consisting of: P, As and Sb; a p-type dopant from Group II of the periodic table; a p-type dopant selected from a group consisting of: Mg, Zn, Cd and Hg; a p-type dopant from Group IV of the periodic table; a p-type dopant selected from a group consisting of: C and Si.; or an n-type is selected from a group consisting of: Si, Ge, Sn, S, Se and Te.

Additionally, the nanowires or nanoribbons can include carbon nanotubes, or nanotubes formed of conductive or semiconductive organic polymer materials, (e.g., pentacene, and transition metal oxides).

Hence, although the term "nanowire" is referred to throughout the description herein for illustrative purposes, it is intended that the description herein also encompass the use of nanotubes (e.g., nanowire-like structures having a hollow tube formed axially therethrough). Nanotubes can be formed in combinations/thin films of nanotubes as is described herein for nanowires, alone or in combination with nanowires, to provide the properties and advantages described herein.

Furthermore, it is noted that a thin film of nanowires of the present invention can be a "heterogeneous" film, which incorporates semiconductor nanowires and/or nanotubes, and/or nanorods, and/or nanoribbons, and/or any combination thereof of different composition and/or structural characteristics. For example, a "heterogeneous film" can includes nanowires/nanotubes with varying diameters and lengths, and nanotubes and/or nanotubes that are "heterostructures" having varying characteristics.

In the context of the invention, although the focus of the detailed description relates to use of nanowire, nanorod, nanotube, or nanoribbon thin films on plastic substrates, the substrate to which these nano structures are attached may comprise other materials, including, but not limited to: a uniform substrate, e.g., a wafer of solid material, such as silicon, glass, quartz, polymerics, etc.; a large rigid sheet of solid materials, e.g., glass, quartz, plastics such as polycarbonate, polystyrene, etc., or can comprise additional elements, e.g., structural, compositional, etc. A flexible substrate, such as a roll of plastic such as polyolefins, polyamide, and others, a transparent substrate, or combinations of these features can be employed. For example, the substrate may include other circuit or structural elements that are part of the ultimately desired device. Particular examples of such elements include electrical circuit elements such as electrical contacts, other wires or conductive paths, including nanowires or other nanoscale conducting elements, optical and/or optoelectrical elements (e.g., lasers, LEDs, etc.), and structural elements (e.g., microcantilevers, pits, wells, posts, etc.).

By substantially "aligned" or "oriented" is meant that the longitudinal axes of a majority of nanowires in a collection or population of nanowires is oriented within 30 degrees of a single direction. Although the majority can be considered to be a number of nanowires greater than 50%, in various embodiments, 60%, 75%, 80%, 90%, or other percentage of nanowires can be considered to be a majority that are so oriented. In certain preferred aspects, the majority of nanowires are oriented within 10 degrees of the desired direction. In additional embodiments, the majority of nanowires may be oriented within other numbers or ranges of degrees of the desired direction, including randomly oriented and isotropically oriented.

It should be understood that the spatial descriptions (e.g., "above", "below", "up", "down", "top", "bottom", etc.) made herein are for purposes of illustration only, and that devices of the present invention can be spatially arranged in any orientation or manner.

The materials used for nanowires described herein also have an inherent mechanical flexibility of the high-mobility semiconductor material, allowing fabrication of truly flexible high-performance electronics. Due to the extremely small diameter and large aspect ratio (in some embodiments>1,000), nanowires possess superior mechanical flexibility and strength. Individual nanowires can easily bend with radius of curvature r<10 μm before failure. Because each individual nanowire on these high-density substrates is aligned in the same direction, but physically independent of the surrounding wires, this flexibility is retained in the nanowire thin films of the present invention, including dense, inorganic and oriented nanowire thin-films (DION thin-films). Even without bending the individual nanowires within a device, the fact that each nanowire is only 100 μm long allows a macroscopic r<<1 mm.

THIN FILMS OF NANOWIRES EMBODIMENTS

The present invention is directed to the use of nanowires in systems and devices to improve system and device performance. For example, the present invention is directed to the use of nanowires in semiconductor devices. According to the present invention, multiple nanowires are formed into a high mobility thin film. The thin film of nanowires is used in electronic devices to enhance the performance and manufacturability of the devices.

Figure 1:
FIG. 1 shows a view of a portion of a thin film of nanowires, according to an example embodiment of the present invention.

FIG. 1 shows a close-up view of a thin film of nanowires 100, according to an example embodiment of the present invention. Thin film of semiconductor nanowires 100 can be used instead of amorphous silicon or organic thin films in conventional electronic devices to achieve improved device behavior, while allowing for a straight forward and inexpensive manufacturing process. Through the use of thin films of nanowires, the present invention is particularly adapted to making high performance, low cost devices on large and flexible substrates.

Note that thin film of nanowires 100 as described herein may be formed in a wide range of possible surface areas. For example, thin films of nanowires 100 of the present invention can be formed to have functional areas greater than 1 $mm^2$, greater than 1 $cm^2$, greater than 10 $cm^2$, greater than 1 $m^2$, and even greater or smaller areas.

As shown in FIG. 1, thin film of nanowires 100 includes a plurality of individual nanowires closely located together. Thin film of nanowires 100 can have a variety of thickness amounts that are equal to or greater than the thickness of a single nanowire. In the example of FIG. 1, the nanowires of thin film of nanowires 100 are aligned such that their long axes are substantially parallel to each other. Note that in alternative embodiments, the nanowires of thin film of nanowires 100 are not aligned, and instead can be oriented in different directions with respect to each other, either randomly or otherwise. In an alternative embodiment, the nanowires of thin film of nanowires 100 may be isotropically oriented, so that high mobility is provided in all directions. Note that the nanowires of thin film of nanowires 100 may be aligned in any manner relative to the direction of electron flow in order to enhance performance as required by a particular application.

Figure 2:
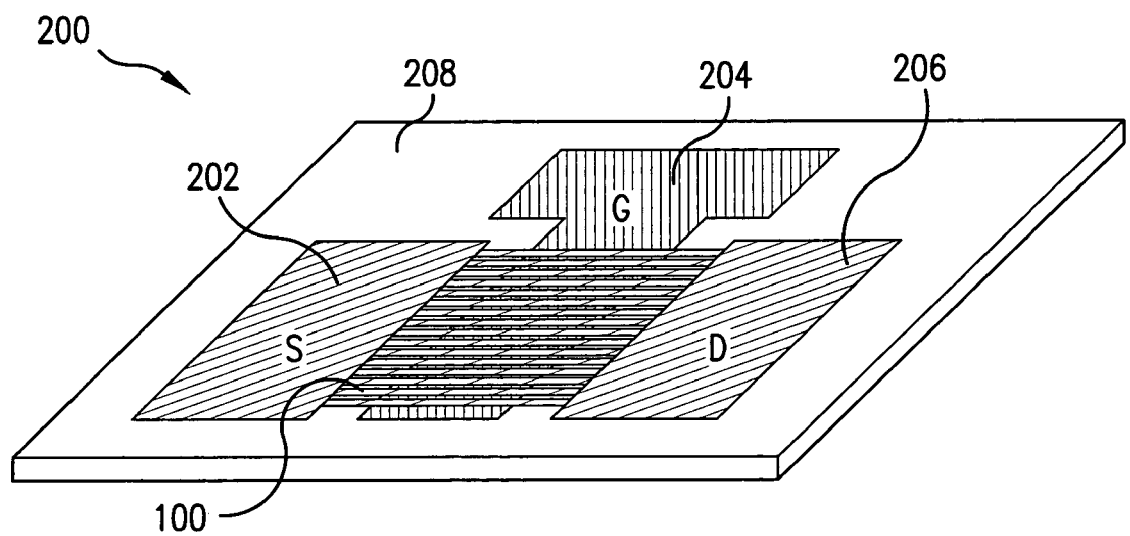
FIG. 2 shows a semiconductor device that includes a thin film of nanowires, according to an example embodiment of the present invention.

FIG. 2 shows a semiconductor device 200 that includes thin film of nanowires 100, according to an example embodiment of the present invention. In FIG. 2, semiconductor device 200 is shown as a transistor, having a source electrode 202, a gate electrode 204, a drain electrode 206, formed on a substrate 208. Thin film of nanowires 100 is coupled between source electrode 202 and drain electrode 206 over a portion of gate electrode 204. Thin film of nanowires 100 substantially operates as a channel region for the transistor of semiconductor device 200, and allows semiconductor 200 to operate with enhanced characteristics, as further described herein. Numerous substrate types applicable to substrate 208 are described elsewhere herein.

Note that semiconductor device 200 is shown as a transistor in FIG. 2 for illustrative purposes. It would be understood to persons skilled in the relevant art(s) from the teachings herein that thin film of nanowires 100 can be included in semiconductor device types in addition to transistors, including diodes.

In embodiments, the nanowires of thin film of nanowires 100 are single crystal semiconductor nanowires that span all the way between source electrode 202 and drain electrode 206. Hence, electric carriers can transport through the single crystals nanowires, resulting in high mobility which is virtually impossible to obtain with current amorphous and polysilicon technologies.

As described above, the nanowires of thin film of nanowires 100 can be aligned or oriented. For example, the nanowires of thin film of nanowires 100 shown in FIG. 2 can be aligned parallel to the length of the channel between source electrode 202 and drain electrode 206, or can be aligned in alternative ways.

Thin film of nanowires 100 can be formed with a sufficient number of nanowires to provide desired characteristics for semiconductor device 200. For example, thin film of nanowires 100 can be formed of a sufficient number of nanowires to achieve a desired current density or current level desired for the particular semiconductor device. For instance, in the transistor example of FIG. 2, thin film of nanowires 100 can be formed to have a current level in the channel of greater than about 10 nanoamps.

In an embodiment, a thin film of nanowires 100 can be formed to have asymmetric mobility. For example, this can be accomplished by asymmetrically aligning the nanowires of thin film of nanowires 100, and/or by doping the nanowires in a particular manner. Such asymmetric mobility can be caused to be much greater in a first direction than in a second direction. For example, asymmetric mobilities can be created in the order of 10, 100, 1000, and 10000 times greater in the first direction than in the second direction, or to have any other asymmetric mobility ratio between, greater, or less than these values.

The nanowires of thin film of nanowires 100 can be doped in various ways to improve performance. The nanowires can be doped prior to inclusion in semiconductor device 200, or after inclusion. Furthermore, a nanowire can be doped differently along portions of its long axis, and can be doped differently from other nanowires in thin film of nanowires 100. Some examples of doping schemes for individual nanowires, and for thin films of nanowires are provided as follows. However, it will be apparent to persons skilled in the relevant art(s) from the teachings herein that nanowires, and thin films thereof, can be doped according to additional ways, and in any combination of the ways described herein.

Figure 3A:
FIGS. 3A-3D shows nanowires doped according to various example embodiments of the present invention.

FIG. 3A shows a nanowire 300 that is a uniformly doped single crystal nanowire. Such single crystal nanowires can be doped into either p- or n-type semiconductors in a fairly controlled way. Doped nanowires such as nanowire 300 exhibit improved electronic properties. For instance, such nanowires can be doped to have carrier mobility levels comparable to alternative single crystal materials. In addition, and without being bound to any particular theory of operation, due to a one-dimensional nature of the electron-wave traversing inside the nanowire channel, and a reduced scattering probability, it may be possible for such nanowires to achieve even higher mobility than a bulk single crystal material. Carrier mobility levels up to 1500 $cm^2/V \cdot s$ have been shown for single p-type Si (silicon) nanowires, and carrier mobility levels up to 4000 $cm^2 V \cdot s$ have been shown for n-type InP nanowires.

Figure 3B:

FIG. 3B shows a nanowire 310 doped according to a core-shell structure. As shown in FIG. 3B, nanowire 310 has a doped surface layer 302, which can have varying thickness levels, including being only a molecular monolayer on the surface of nanowire 310. Such surface doping can separate impurities from a conducting channel of the nanowire, and suppress an impurity-related scattering event, and thus may lead to greatly enhanced carrier mobility. For example, when nanowires are doped according to the core-shell structure, "ballistic" transport may be achieved inside the nanowires. "Ballistic" transport is where electrical carriers are transported through a nanowire with essentially no resistance. Further detail on doping of nanowires is provided below.

Figure 3C:

FIG. 3C shows a nanowire 320 that is uniformly doped, and coated with a dielectric material layer 304, according to another type of core-shell structure. Dielectric material layer 304 can be chosen from a variety of dielectric materials, such as $SiO_2$ or $Si_3N_4$. The use of dielectric material layer 304 can simplify fabrication of semiconductor device 200, as described elsewhere herein. Dielectric material layer 304 can be formed on nanowire 320, as is further described below.

Figure 3D:
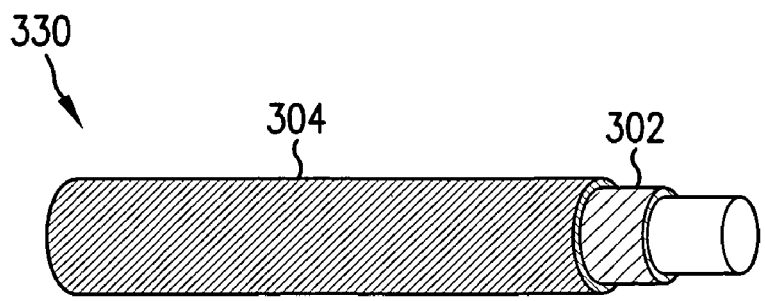

FIG. 3D shows a nanowire 330 that is doped with a doped surface layer 302 according to the core-shell structure shown in FIG. 3B, and is also coated with a dielectric material layer 304, as shown in FIG. 3C.

Figure 4A:
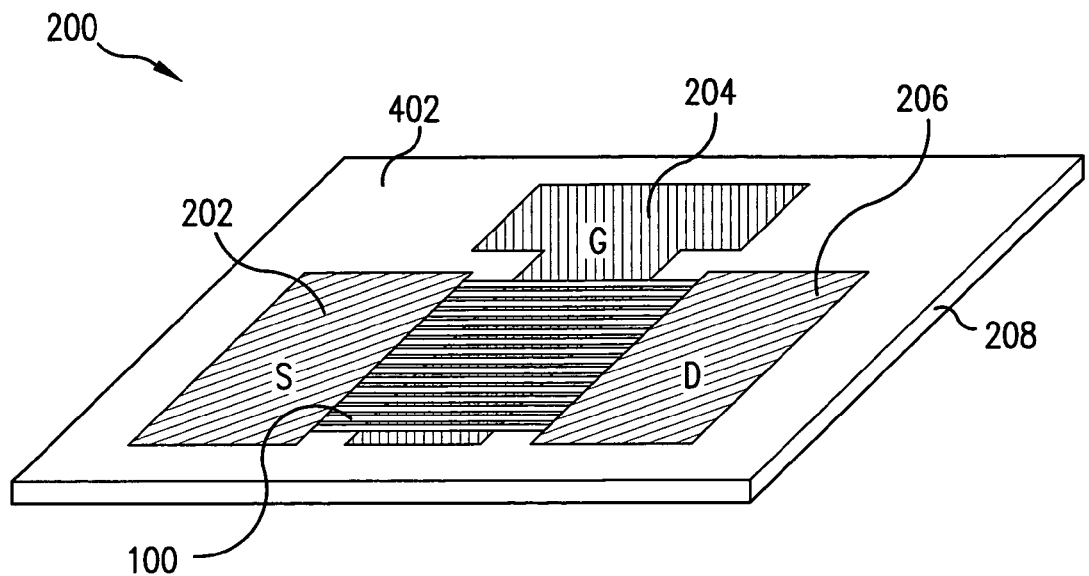
FIGS. 4A and 4B show examples of a semiconductor device, doped according to example doping embodiments of the present invention.
Figure 4B:
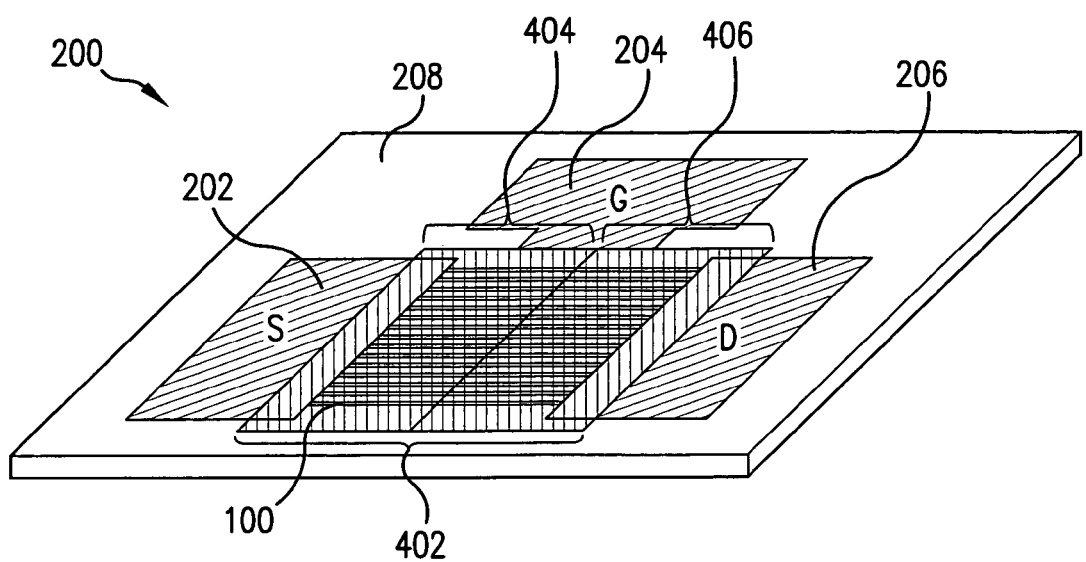

FIGS. 4A and 4B show examples of semiconductor device 200, according to example doping embodiments of the present invention. As shown in FIG. 4A, the top surface of substrate 208 is coated with a dopant layer 402. Dopant layer 402 includes electron-donor or electron acceptor doping materials. Properties of semiconductor device 200 can be controlled by the introduction of dopant layer 402. The electron-donor or electron acceptor materials introduce negative or positive charge carriers into the nanowires to achieve n- or p-channel transistors, respectively. Very high mobility levels can be attained in this configuration for semiconductor device 200 because the dopants are separated from the actual conducting channel.

As shown in FIG. 4B, dopant layer 402 covers a region of substrate 208 substantially localized around thin film of nanowires 100. In embodiments, dopant layer 402 applied to semiconductor device 200 can be patterned to have two or more areas doped according to different n- and p-type characteristics. For example, in the embodiment of FIG. 4B, dopant layer 402 has a first portion 404 doped with an n-type characteristic, and a second portion 406 doped with a p-type characteristic. In such an embodiment, a p-n junction can be achieved according to a variety of electronic and optoelectronic devices, including light-emitting diodes (LEDs).

As described above, dopant layer 402 can be introduced on substrate 208 prior to or after actual fabrication of semiconductor device 200.

Collections of nanowires manufactured with these materials are useful building blocks for high performance electronics. A collection of nanowires orientated in substantially the same direction will have a high mobility value. Furthermore, nanowires can be flexibly processed in solution to allow for inexpensive manufacture. Collections of nanowires can be easily assembled onto any type of substrate from solution to achieve a thin film of nanowires. For example a thin film of nanowires used in a semiconductor device can be formed to include 2, 5, 10, 100, and any other number of nanowires between or greater than these amounts, for use in high performance electronics.

Note that nanowires can also be used to make high performance composite materials when combined with polymers/materials such as organic semiconductor materials, which can be flexibly spin-cast on any type of substrate. Nanowire/ polymer composites can provide properties superior to a pure polymer materials. Further detail on nanowire/polymer composites is provided below.

As described above, collections or thin films of nanowires can be aligned into being substantially parallel to each other, or can be left non-aligned or random. Non-aligned collections or thin films of nanowires provide electronic properties comparable or superior to polysilicon materials, which typically have mobility values in the range of 1-10 $cm^2/V \cdot s$.

Aligned collections or thin films of nanowires provide for materials having performance comparable or superior to single crystal materials. Furthermore, collections or thin films of nanowires that include aligned ballistic nanowires (e.g., core-shell nanowires as shown in FIG. 3B) can provide dramatically improved performance over single crystal materials.

Aligned and non-aligned, and composite and non-composite thin films of nanowires can be produced in a variety of ways, according to the present invention. Example embodiments for the assembly and production of these types of thin films of nanowires are provided as follows.

Randomly oriented thin films of nanowires can be obtained in a variety of ways. For example, nanowires can be dispersed into a suitable solution. The nanowires can then be deposited onto a desired substrate using spin-casting, drop-and-dry, flood-and-dry, or dip-and-dry approaches. These processes can be undertaken multiple times to ensure a high degree of coverage. Randomly oriented thin films of nanowires/polymer composites can be produced in a similar way, providing that the solution in which the nanowires are dispersed is a polymer solution.

Aligned thin films of nanowires can be obtained in a variety of ways. For example, aligned thin films of nanowires can be produced by using the following techniques: (a) Langmuir-Blodgett film alignment; (b) fluidic flow approaches, such as described in U.S. Pat. No. 6,872,645, and incorporated herein by reference in its entirety; and (c) application of mechanical shear force. For example, mechanical shear force can be used by placing the nanowires between first and second surfaces, and then moving the first and second surfaces in opposite directions to align the nanowires. Aligned thin films of nanowires/polymer composites can be obtained using these techniques, followed by a spin-casting of the desired polymer onto the created thin film of nanowires. For example, nanowires may be deposited in a liquid polymer solution, alignment can then be performed according to one of these or other alignment processes, and the aligned nanowires can then be cured (e.g., UV cured, crosslinked, etc.). An aligned thin film of nanowires/polymer composite can also be obtained by mechanically stretching a randomly oriented thin film of nanowires/polymer composite.

Fabrication of Electronic Devices Incorporating Thin Films of Nanowires

Embodiments for making electronic devices and systems that incorporate thin films of nanowires according to the present invention are further described in this subsection. These implementations are described herein for illustrative purposes, and are not limiting. The electronic devices and systems of the present invention, as described in this section, can be fabricated in alternative ways, as would be apparent to persons skilled in the relevant art(s) from the teachings herein.

Figure 5:
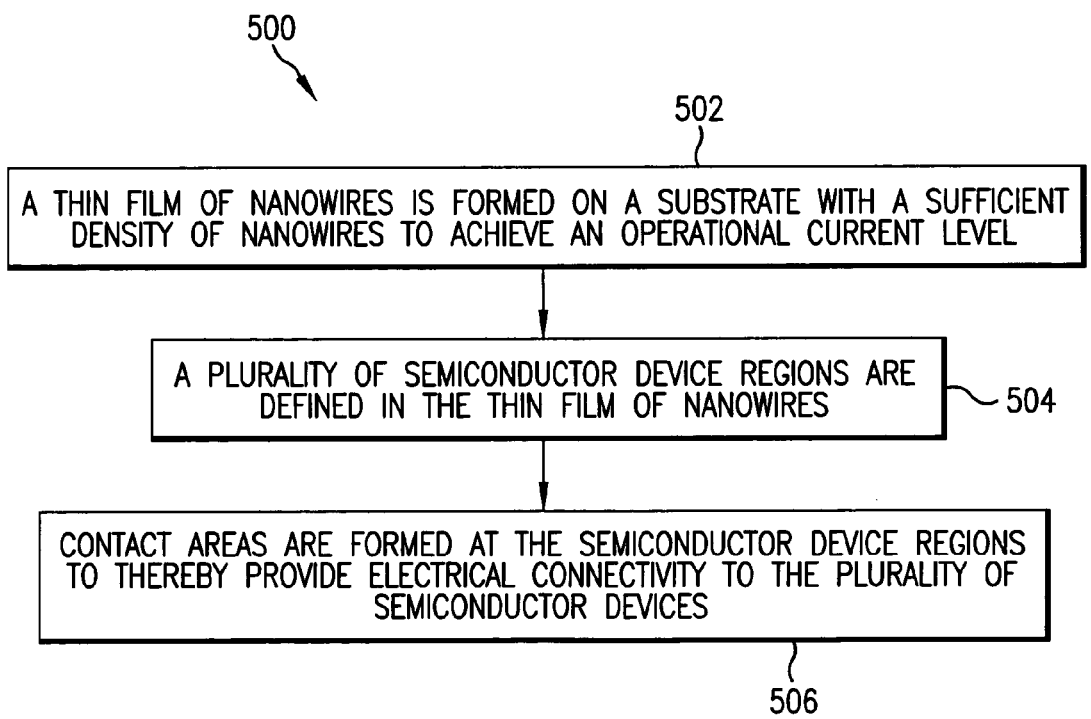
FIG. 5 shows a flowchart providing example steps for making a plurality of semiconductor devices, according to embodiments of the present invention.

FIG. 5 shows a flowchart 500 providing example steps for making a plurality of semiconductor devices that incorporate the thin film of nanowires of the present invention. The steps of FIG. 5 do not necessarily have to occur in the order shown, as will be apparent to persons skilled in the relevant art(s) based on the teachings herein. Other structural embodiments will be apparent to persons skilled in the relevant art(s) based on the following discussion. These steps are described in detail below.

Flowchart 500 begins with step 502. In step 502, a thin film of nanowires is formed on a substrate with a sufficient density of nanowires to achieve an operational current level. For example, as described above, a thin film of nanowires can be formed on a substrate in a variety of ways, according to the present invention. The thin film of nanowires is formed with a sufficient density of nanowires to achieve an operational current level. A sufficient operational current level is typically determined on an application basis. For example, the current level may be in the nanoamp range, including 2 nanoamps, and greater and lesser current levels. The thin film of nanowires can be formed in various ways described elsewhere herein to obtain the required operational current level. The thin film of nanowires can be aligned or non-aligned, and can be a composite or non-composite.

For example, to achieve the required operational current density, a minimum number of nanowires can be included in the thin film of nanowires for a given area on the substrate. Hence, each formed semiconductor device will have a sufficient number of nanowires to carry current at an operational current level. For example, the required number of nanowires per unit area can be 1 nanowire, 2 nanowires, and any other greater number of nanowires, including 5, 10, 100 or more.

In step 504, a plurality of semiconductor device regions are defined in the thin film of nanowires. For example, referring to the single semiconductor device 200 shown in FIG. 2, the overall thin film of nanowires formed in step 502 is patterned to form a localized thin film of nanowires 100 for each region of the substrate where a semiconductor device is being formed. In alternative embodiments, the thin film of nanowires does not need to be patterned. Note that on a particular substrate, the semiconductor device regions can all define the same semiconductor device type, or can define two or more different semiconductor device types.

In step 506, contact (e.g., electrode) areas are formed at the semiconductor device regions to thereby provide electrical connectivity to the plurality of semiconductor devices. A semiconductor device can have any number of required contact areas formed to provide electrical connectivity. For example, a diode or other two terminal device can have anode and cathode electrodes formed. For example, again referring to the single semiconductor device 200 shown in FIG. 2, three contact areas were formed: source electrode 202, gate electrode 204, and drain electrode 206. Other semiconductor devices can have greater or fewer numbers of contact areas formed.

Note that a variety of contact area types can be formed in step 506. The contact areas can be Ohmic and non-Ohmic. For example, a non-Ohmic Schottky diode barrier contact can be used as an electrode. A Schottky diode barrier contact is commonly used for a III-V semiconductor material when it is difficult to make a high quality gate dielectrics. Source electrodes 202, gate electrodes 204, and drain electrodes 206 are formed of a conductive material, such as a metal, alloy, silicide, polysilicon, or the like, including combinations thereof, as would be apparent to a person having ordinary skill in the art.

In some embodiments, flowchart 500 of FIG. 5 can include the step of doping the nanowires. The nanowires can be doped prior to being formed into a thin film, or after being formed into a thin film. A thin film of nanowires can be doped after being formed on the substrate. The nanowires can be doped in numerous ways, including those ways described above with respect to FIGS. 3A-3D. For example, a core of a nanowire can be doped and/or a shell layer of a nanowire can be doped. Furthermore, the individual nanowires and/or the thin film of nanowires can be doped differently in different areas along their respective lengths.

Furthermore, in some embodiments, flowchart 500 of FIG. 5 can include the step of forming a dielectric layer on the nanowires. The dielectric layer can be formed by oxidizing the nanowires, or otherwise forming the dielectric layer. For example, other non-oxided high dielectric constant materials can be used, including silicon nitride, $Ta_2O_5$, $TiO_2$, $ZrO_2$, $HfO_2$, $Al_2O_3$, and others. Nitridation of nanowires can be accomplished with processes similar to those employed in oxidation of nanowires. These materials can be applied to nanowires by chemical vapor deposition (CVD), solution phase over-coating, or simply by spin-coating the appropriate precursor onto the substrate. Other known techniques can be employed.

The steps of FIG. 5 are adaptable to fabrication of single or multiple semiconductor devices on a substrate. FIGS. 6A-6F show various stages of fabrication for a substrate 600 having a plurality of semiconductor devices thereon, according to an embodiment of the present invention. The steps of flowchart 500 shown in FIG. 5 are mentioned below in relation to the processes shown in FIGS. 6A-6F.

Figure 6A:
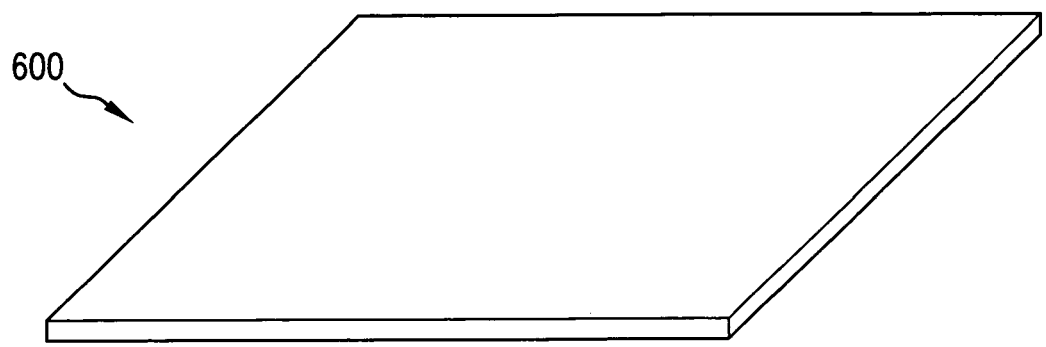
FIGS. 6A-6F show various stages of fabrication for a substrate having a plurality of semiconductor devices thereon, according to an embodiment of the present invention.

FIG. 6A shows a perspective view of substrate 600. Substrate 600 can be any substrate type, including silicon, glass, quartz, polymeric, and any other substrate type describe herein or otherwise known. Substrate 600 can be large area or small area, and can be rigid or flexible, such as a flexible plastic or thin film substrate type. Substrate 600 can be opaque or transparent, and can be made from a conductive, semiconductive, or a non-conductive material.

Figure 6B:
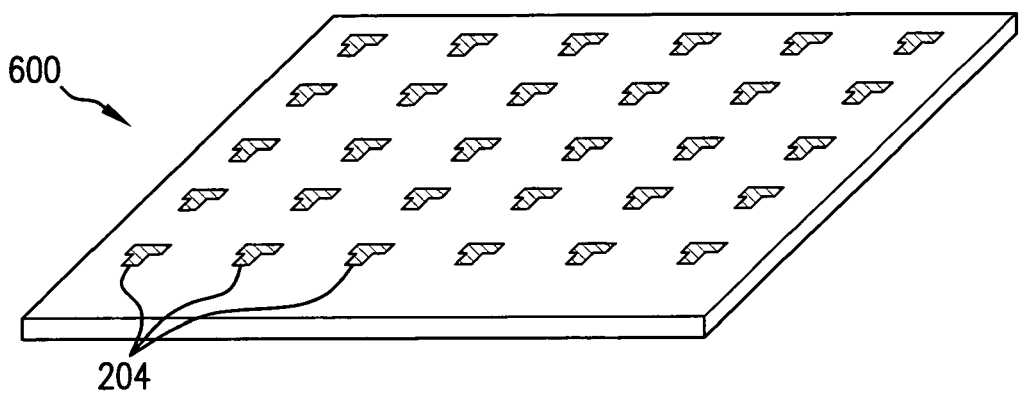

FIG. 6B shows the patterning of a plurality of gates 204 on substrate 600. Gates 204 can be patterned on substrate 600 using standard photolithography, ink-jet printing, or micro-contact printing processes, for example, or by other processes. The patterning of plurality of gates 204 shown in FIG. 6B can be performed during step 506 of flowchart 500 shown in FIG. 5, for example.

Figure 6C:
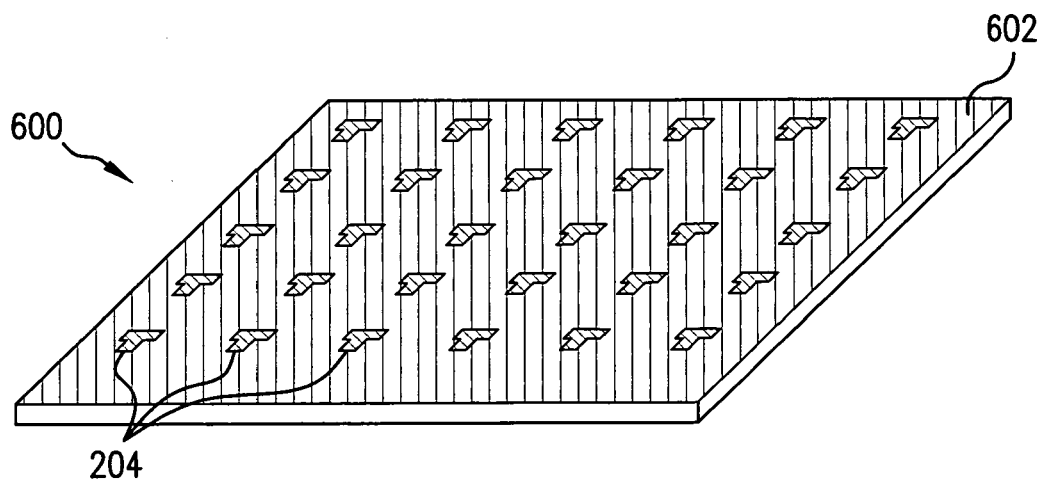

FIG. 6C shows deposition of a dielectric layer 602 on substrate 600. Dielectric layer 602 electrically insulates the plurality of gates 204. The deposition of dielectric layer 602 on substrate 600 can be done using evaporation, solution cast of polymer or oxide dielectrics, and by other processes. Note that the deposition of dielectric layer 602 on substrate 600 may not be necessary if the nanowires to be deposited on substrate 600 are insulated by their own dielectric layer. For example, nanowires 320 and 330 shown in FIGS. 3C and 3D have a dielectric material layer 304 pre-formed on their surfaces. Direct contact devices without a dielectric layer are also envisioned.

Figure 6D:
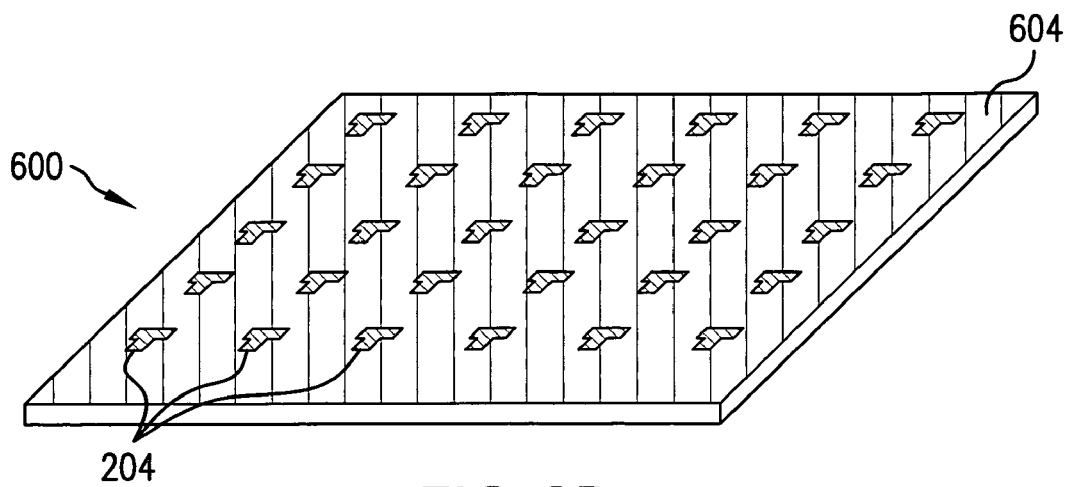

FIG. 6D shows deposition of a thin film of nanowires 604 on substrate 600. Deposition of thin film of nanowires 604 can be done using various procedures described elsewhere herein, including spin-casting, Langmuir-Blodgett alignment, mechanical alignment, and flow-alignment techniques. The deposition of the thin film of nanowires 604 shown in FIG. 6D can be performed during step 502 of flowchart 500 shown in FIG. 5, for example.

Figure 6E:
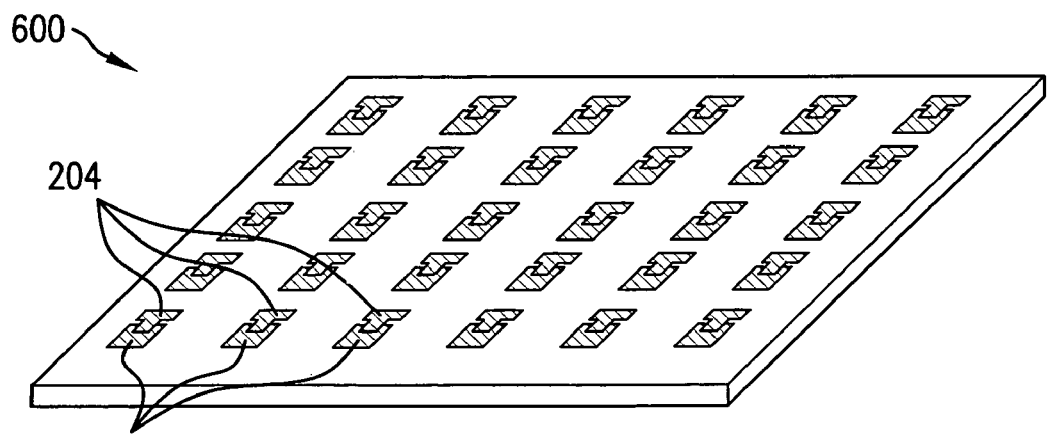

FIG. 6E shows patterning of thin film of nanowires 604 into a plurality of thin films of nanowires 100. Patterning of thin film of nanowires 604 can be done using various processes, including lithography techniques. Note that deposition and patterning of thin film of nanowires 604, as shown in FIGS. 6D and 6E, can be done simultaneously using various processes, such as ink-jet printing or micro-contact printing methods. The patterning of plurality of thin film of nanowires 604 into plurality of thin films of nanowires 100 shown in FIG. 6E can be performed during step 504 of flowchart 500 shown in FIG. 5, for example.

Figure 6F:
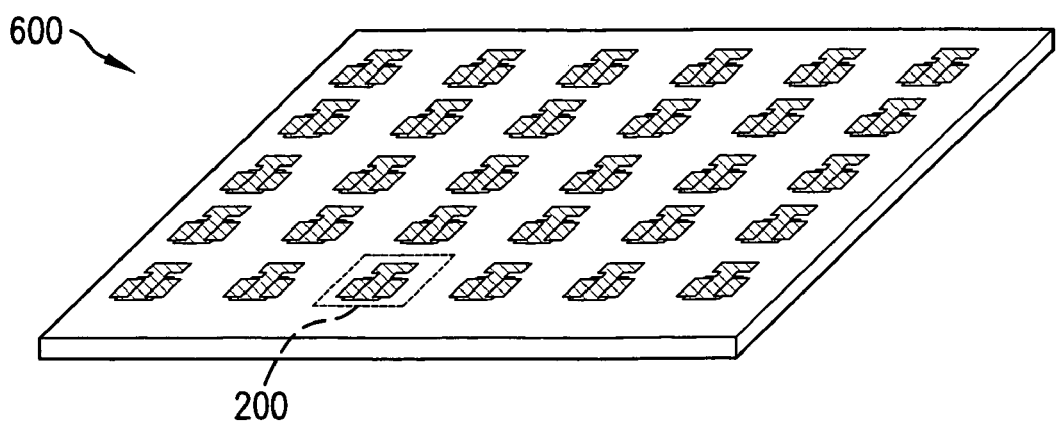

FIG. 6F shows patterning of a plurality of sources 202 and a plurality of drains 206 on substrate 600, to form a plurality of semiconductor devices 200. Source and drain electrode patterning can be done using processes similar to those used to pattern the plurality of gates 204, as shown in FIG. 6B. The patterning of the plurality of sources and drains shown in FIG. 6F can be performed during step 506 of flowchart 500 shown in FIG. 5, for example.

Note that the order in which the gates 204, sources 202, and drains 206 are patterned can be varied. For example, gates 204, sources 202, and drains 206 can be patterned simultaneously with each other or at different times. They can be all be patterned prior to deposition of the thin film of nanowires 604, or afterwards. Sources 202 and drains 206 can be patterned prior to deposition of the thin film of nanowires 604, while gates 204 are patterned afterwards. Alternatively, gates 204 can be patterned prior to deposition of the thin film of nanowires 604, while sources 202 and drains 206 are patterned afterwards. Either of sources 202 and drains 206 can also be patterned prior to deposition of the thin film of nanowires 604, while the other is patterned afterwards.

Note that in some embodiments, more than one layer of a thin film of nanowires can be applied to a substrate in a given area. The multiple layers can allow for greater electrical conductivity, and can be used to modify electrical characteristics of a respective semiconductor device. The multiple layers can be similar, or different from each other. For example, two or more layers of thin films of nanowires having nanowires aligned in different directions, doped differently, and/or differently insulated, can be used in a particular semiconductor device. A contact area of a particular semiconductor device can be coupled to any one or more of the layers of a multiple layer thin film of nanowires. Note that a thin film of nanowires can be formed as a monolayer of nanowires, a sub-monolayer of nanowires, and greater than a monolayer of nanowires, as desired.

Large Area Macroelectronic Substrate Nanowire Materials

As described above, electronic and electro-optic films can be formed on macroelectronic (i.e., large area electronic) substrates using nanowires made from semiconducting materials. Furthermore, according to embodiments of the present invention, nanowires can be made from alternative materials, and these nanowires can be used to form films in a similar manner as for nanowires made from semiconductor materials.

In embodiment of the present invention, nanowires can be made from materials such as magnetic materials, ferroelectric materials, thermoelectric materials, piezoelectric materials, metal(s)/alloys, and transition metal oxide materials. Furthermore, corresponding thin films can be formed from the magnetic nanowires, ferroelectric nanowires, thermoelectric nanowires, piezoelectric nanowires, metal(s)/alloys, and transition metal oxide nanowires. These thin films therefore exhibit properties of the corresponding magnetic, ferroelectric, thermoelectric, piezoelectric, metallic, or transition metal oxide materials, and are able to be formed on large area substrates, which can be flexible or non-flexible. Thus, entirely new materials/devices can be formed, according to the present invention.

For example, nanowire 300 shown in FIG. 3A can be a nanowire made from a magnetic, ferroelectric, thermoelectric, piezoelectric, a metallic, or transition metal oxide material. Furthermore, thin film of nanowires 100 which is shown in FIG. 1, for example, can therefore be a thin film of magnetic nanowires, a thin film of ferroelectric nanowires, a thin film of thermoelectric nanowires, a thin film of piezoelectric nanowires, a thin film of metallic nanowires, or a thin film of transition metal oxide nanowires, or any combination thereof.

Thus, devices, such as semiconductor device 200 shown in FIG. 2, can be formed using thin films of nanowires made from one or more of these materials. These devices may or may not require electrical contacts, depending on the type of nanowire material, such as magnetic nanowires.

For example, as described elsewhere herein, a thin film of semiconducting nanowires can be used in an electrical device, such as semiconductor device 200 shown in FIG. 2. Semiconductor device 200 is a three-terminal transistor device, having a source electrode 202, gate electrode 204, and drain electrode 206. As shown in FIG. 2, thin film of nanowires 100 couples source electrode 202 to drain electrode 206. Gate electrode 204 is formed adjacent to thin film of nanowires 100. During operation, when a sufficient voltage is applied to gate electrode 204, current can conduct between drain electrode 206 and source electrode 202. In an alternative embodiment, gate electrode 204 need not be present, and device 200 operates as a two-terminal device, such as a diode. For example, in such an alternative embodiment, source electrode 202 and drain electrode 206 can be cathode and anode electrodes.

In an embodiment, when thin film of nanowires 100 is formed from one of magnetic, ferroelectric, thermoelectric, piezoelectric, metallic, or transition metal oxide materials, characteristics of the particular nanowire material can be exhibited during operation of the electrical device in which the thin film is incorporated.

For example, in an embodiment, when a current is applied to a thin film of ferroelectric nanowires, an electric polarization can be caused in the thin film of ferroelectric nanowires, of a permanent or non-permanent type.

In another example embodiment, when a current is applied to a thin film of piezoelectric nanowires, a stress can be generated in the thin film of piezoelectric nanowires, which can be exhibited as change of shape, a movement, and/or a vibration of the thin film of piezoelectric nanowires. Such a thin film of piezoelectric nanowires could have applications in audio and other technology areas, for example. Transition metal oxide materials are example materials that can be used to fabricate piezoelectric nanowires.

In another example embodiment, when current is applied to a thin film of thermoelectric nanowires, heat can be transferred across the thin film of thermoelectric nanowires. Such a thin film of thermoelectric nanowires can have many applications, such as in areas of temperature control and heating, and in particular, in applications where spatially localized heating and/or cooling is desired.

Magnetic nanowires may not need to be coupled to electrical contacts in order to operate. A thin film of magnetic nanowires can be formed on a surface to impart magnetic properties to the surface. The thin film of nanowires can be sized as required by the particular application.

Metallic nanowires can be formed in a thin film in applications needing an efficient conductor. Furthermore, electrical devices such as inductors, transformers, and electromagnets can be formed from metallic nanowire thin films.

FIG. 7 shows a flowchart 700 providing example steps for making an electrical device that incorporates a thin film of nanowires of the present invention, according to an embodiment of the present invention. Other structural embodiments will be apparent to persons skilled in the relevant art(s) based on the following discussion. These steps are described in detail below.

Flowchart 700 begins with step 702. In step 702, a plurality of {magnetic; ferroelectric; thermoelectric; piezoelectric; metallic; or transition metal oxide} nanowires are deposited onto a substrate. For example, the substrate can be substrate 208 shown in FIG. 2. Furthermore, the plurality of nanowires can be thin film of nanowires 100, described above, wherein the nanowires of the thin film are made from magnetic, ferroelectric, thermoelectric, piezoelectric, metal(s)/alloys, or transition metal oxide materials. The nanowires can be deposited onto the substrate such that the nanowires are randomly aligned with respect to each other, or in alignment so that their long axes are substantially parallel.

In step 704, first and second electrical contacts are formed on the substrate. For example, the first and second electrical contacts can be source electrode 202 and drain electrode 206, as shown in FIG. 2. In such an embodiment, a gate electrode can also be formed on the substrate. Alternatively, the first and second electrical contacts can be cathode and anode electrodes. In further embodiments, the first and second electrical contacts can be other contact types. Furthermore, other numbers of contacts/additional contacts can be formed on the substrate.

Steps 702 and 704 can be performed in either order. An effect of steps 702 and 704 is that at least one of the nanowires couples the first electrical contact to the second electrical contact. Subsequent processing steps can be performed as needed, such as those described elsewhere herein, including patterning of the nanowires, doping of the nanowires, and causing/allowing the nanowires to adhere/attach to the substrate in contact with the electrical contacts.

Large-Area Macroelectronic Materials that Conduct Both Electrons and Holes with High Mobilities While it is possible to incorporate both p- and n-dopants into a single semiconductor, such as silicon, the presence of both carrier types in the same material leads to recombination and annihilation of the carriers, resulting in poor mobility for either. Thus, a combination of p-dopants and n-dopants in a single semiconductor by conventional means is not desirable.

According to embodiments of the present invention, p-doped nanowires and n-doped nanowires can be separately fabricated, and deposited in a homogeneous mixture onto a surface, such as a macroelectronic substrate. On a macroscopic level, the resulting material appears to contain a high concentration of both n- and p-dopants. However, the individual carrier types are physically separated from each other (i.e. they are in different nanowires), and as a result, they do not substantially interact (i.e., the carriers do not substantially annihilate each other). Thus, by creating such a mixture of p- and n-doped nanowires, macroelectronic devices can be fabricated that respond as if they are both n- and p-doped. For example, a resulting thin film of nanowires that includes both n-doped and p-doped nanowires can exhibit characteristics of both n-doped and p-doped nanowires.

For example, diode, transistor, and other electrical devices described elsewhere herein or otherwise known can be fabricated to include a combination of p-doped nanowires and n-doped nanowires. For instance, semiconductor device 200 shown in FIG. 2 can include a thin film of nanowires 100 that includes a combination of p-doped nanowires and n-doped nanowires. The n-doped nanowires and p-doped nanowires can be combined in the thin film in a variety of ways. Some of these ways are described as follows.

For example, FIG. 8A shows a close up view of an example portion of a nanowire thin film 800 that includes a homogeneous mixture of n-doped nanowires 802 and p-doped nanowires 804. Thin film 800 can be used in a variety of electrical device types. Note that in the example of FIG. 8A, n-doped nanowires 802 and p-doped nanowires 804 can be formed and mixed prior to deposition onto a substrate, or can be mixed on a substrate. Also, while the nanowires in FIG. 8A are shown to be randomly oriented, the present invention includes the use of partially and substantially parallel oriented nanowires, as described above.

In another example embodiment, FIG. 8B shows an example portion of a nanowire thin film 810 that includes both n-doped nanowires 802 and p-doped nanowires 804. For example, thin film 810 can be formed on a substrate. As shown in FIG. 8B, a first region 812 of thin film 810 includes a plurality of n-doped nanowires 802, and a second region 814 of thin film 810 includes a plurality of p-doped nanowires 804. In the example of FIG. 8B, first region 812 and second region 814 are substantially non-overlapping. Thus, as shown in the example of FIG. 8B, n-doped nanowires 802 and p-doped nanowires 804 can be deposited on a substrate in a spatially or regionally segregated manner, either substantially or even entirely segregated. The n-doped and p-doped nanowires can be spatially or regionally segregated in any configuration, including forming segregated stripes, spots, etc. of the n-doped and p-doped nanowires on the substrate.

In another example embodiment, FIG. 8C shows a thin film 820 of nanowires that includes both n-doped nanowires 802 and p-doped nanowires 804. As shown in FIG. 8C, a first sublayer 822 of thin film 820 includes a plurality of n-doped nanowires 802, and a second sublayer 824 of thin film 820 includes a plurality of p-doped nanowires 804. Thus, as shown in the example, of FIG. 8C, n-doped nanowires 802 and p-doped nanowires 804 can be deposited on a substrate in two or more segregated layers.

In embodiments of the present invention, n-doped and p-doped nanowires 802 and 804 can be mixed, regionally segregated within a layer, and/or segregated into separate layers, in any combination.

FIG. 9 shows a flowchart 900 providing example steps for making a thin film of nanowires of the present invention, according to an embodiment of the present invention. The steps of FIG. 9 do not necessarily have to occur in the order shown, as will be apparent to persons skilled in the relevant art(s) based on the teachings herein. Other structural embodiments will be apparent to persons skilled in the relevant art(s) based on the following discussion. These steps are described in detail below.

Flowchart 900 begins with step 902. In step 902, a first plurality of nanowires that are p-doped are formed. For example, the first plurality of nanowires are p-doped nanowires 804, as shown in FIGS. 8A-8C. The p-doped nanowires can be formed in any number of ways, such as those described elsewhere herein or otherwise known. For example, the p-doped nanowires may be grown as intrinsic nanowires that are subsequently p-doped, or can be grown from a p-doped semiconductor material. Furthermore, the p-doped nanowires can all be made from the same semiconductor material (e.g., all p-doped Si), or there can be nanowires made different semiconductor materials (i.e., some p-doped Si nanowires and p-doped CdS nanowires).

In step 904, a second plurality of nanowires that are n-doped are formed. For example, the second plurality of nanowires are n-doped nanowires 802, as shown in FIGS. 8A-8C. The n-doped nanowires can be formed in any number of ways, such as those described elsewhere herein or otherwise known. For example, the n-doped nanowires may be grown as intrinsic nanowires that are subsequently n-doped, or can be grown from an n-doped semiconductor material. Furthermore, the n-doped nanowires can all be made from the same semiconductor material (e.g., all n-doped Si), or there can be nanowires made different semiconductor materials (i.e., some n-doped Si nanowires and n-doped CdS nanowires).

In step 906, the first plurality of nanowires and second plurality of nanowires are deposited onto a substrate to form a thin film of nanowires that includes n-doped and p-doped nanowires. For example, in embodiments, the first and second pluralities of nanowires can be deposited separately or simultaneously. The first and second pluralities of nanowires can be mixed to form a single- or multi-layer homogeneous mixture. Alternatively, the first and second pluralities of nanowires can be deposited onto two or more separate regions of the substrate, and/or into two or more separate sublayers of the thin film.

In an embodiment, where n-doped nanowires and p-doped nanowires are in separate layers, flowchart 900 can include the step where another layer of material is formed between the layer of n-doped nanowires and layer of p-doped nanowires. For example, the middle layer can be an insulator layer, such as a plastic layer, a glass layer, an air layer, or other insulator layer type.

Thus, semiconductor devices/materials can be formed having both p-doped and n-doped characteristics. In an embodiment, such devices/materials can be viewed as having both n- and p-characteristics over a length scale greater than a factor X, where X is dependent on the size of the nanowires, the density of the nanowires, and/or other factors. Prior to the present invention, such devices/materials did not exist.

Macroelectronic Devices Fabricated with Nanowire Heterostructures

In another embodiment of the present invention, electrical devices such as p-n diodes, transistors, and other electrical device types, can be fabricated using nanowire heterostructures. Nanowire heterostructures, as described herein, are nanowires that typically include a plurality of p-n junctions along the length of the nanowire. In other words, nanowire heterostructures include alternating portions or segments along their lengths that are different. For example, nanowire heterostructures can have alternating portions that are differently doped and/or are made from different materials.

By forming nanowires that have differently portions, fabrication of semiconductor devices can be greatly simplified. For instance, in an embodiments where the portions are differently doped, because the nanowires are doped, regions of the substrate on which the nanowires will be attached will not need to be doped using expensive photolithography or ion implantation processes, as is conventionally done. Furthermore, ohmic contact with a substrate is improved through the use of doped nanowires, as compared to intrinsic nanowires. Still further, nanowire heterostructures do not need to be carefully positioned on a substrate, as compared to conventional nanowires, as they are typically much longer than a distance between electrodes on the substrate. Thus more of them will span the distance between the electrodes, and therefore make contact with the electrodes, relative to conventional nanowires.

In embodiments where portions have different materials, many applications are possible. For example, a nanowire heterostructure could include a first heavily p-doped silicon portion, a second heavily n-doped GaN portion, and a third heavily n-doped silicon portion. This could be used to simplify electrical interfacing to a GaN LED. Any other combination of doping and materials in nanowire heterostructures can be used.

In a first embodiment, nanowire heterostructures are grown to have multiple p-n junctions along their lengths. (Note that the following discussion can be applied to other differences along the lengths of the nanowires, including different materials, etc. For illustrative purposes, the discussion focuses on differently doped portions). For example, FIG. 10 shows a nanowire 1000 that is a nanowire heterostructure, according to an example embodiment of the present invention. As shown in FIG. 10, nanowire 1000 has a plurality of n-doped portions 1010a,b and a plurality of p-doped portions 1020a,b. Thus, a plurality of p-n junctions 1030a,b,c are present at intersections of p-doped portions 1010 and n-doped portions 1020. Furthermore, each doped portion of nanowire 1000 has a length 1002.

In embodiments, the lengths of doped portions of nanowire 1000 may or may not be uniform. Preferably, the doped portions of a nanowire heterostructure of the present invention have lengths (i.e., in other words, the p-n junctions are spaced apart) approximately equal to the distance between the electrodes in the final device in which the nanowire heterostructure will be used. For example, in an embodiment, the lengths of the doped portions can be equal to the distance between the electrodes, or slightly longer than the distance between the electrodes. In this manner, when the nanowire heterostructures are deposited onto a substrate, on average, a single p-n junction of each nanowire heterostructure will be located between the electrodes of the final device, and each nanowire heterostructure will be capable of spanning the distance between the electrodes. Furthermore, due to the number of doped portions in each nanowire, the overall length of each nanowire heterostructure will tend to be much greater than the distance between the electrodes. These attributes will create an efficient p-n diode between each electrode pair, creating a macroelectronic device. Furthermore, manufacturing constraints are reduced by using nanowire heterostructures, as the nanowire heterostructures can be deposited onto a substrate with little precision required, and can even be deposited randomly. The repeating structure of the nanowire heterostructure statistically allows for enough p-n junctions of randomly deposited nanowire heterostructures to be located between electrical contacts to create operational devices. This manufacturing advantage of nanowire heterostructures is further illustrated below.

Using nanowire heterostructures, macroscopic heterostructured electronic devices may be created. For example, FIG. 11A shows an example two-terminal electrical device 1100 that includes a plurality of nanowires 1000, according to an embodiment of the present invention. As shown in FIG. 11A, nanowires 1000a-e are deposited on a first electrical contact 1102 and a second electrical contact 1104, in a non-aligned fashion. For example, device 1100 can be a diode, and first and second electrical contacts 1102 and 1104 can be cathode and anode electrodes. As shown in the embodiment of FIG. 11A, a distance between first electrical contact 1102 and second electrical contact 1104 is approximately equal to length 1002 (e.g., either center-to-center or between inner edges), which is the length of the doped portions of nanowires 1000a-e. Furthermore, a total length of each of nanowires 1000a-e is greater than the distance between first electrical contact 1102 and second electrical contact 1104. As shown in FIG. 11A, nanowires 1000c, 1000d, and 1000e do not couple together first and second electrical contacts 1102 and 1104. However, due to their locations, nanowires 1000a and 1000b do couple together first and second electrical contacts 1102 and 1104. Furthermore, nanowires 1000a and 1000b have respective p-n junctions 1030a and 1030b that are located between first and second electrical contacts 1102 and 1104. Thus, device 1100 can operate as a diode as configured in FIG. 11A.

Note that in the example of FIG. 11A, the p-n junctions 1030a and 1030b of nanowires 1000a and 1000b, respectively, are directed opposite each other. In other words, the n-doped portion of nanowire 1000a and the p-doped portion of nanowire 1000b are in contact with first electrical contact 1102, and the p-doped portion of nanowire 1000a and the n-doped portion of nanowire 1000b are in contact with second electrical contact 1104. Thus, the p-n junctions 1030a and 1030b of nanowires 1000a and 1000b, respectively, are conductive and non-conductive in directions opposite to each other. Such a placement of nanowires 1000a and 1000b can occur during a random deposition of nanowire heterostructures on a substrate, for example. However, in certain applications, first and second electrical contacts 1102 and 1104 will have voltages applied that will only allow for current to flow in one direction, causing only one of p-n junctions 1030a and 1030b of nanowires 1000a and 1000b, respectively, to operate. For example, nanowires 1000a and 1000b may be light emitting nanowires (as further described in the following subsection). Thus, when a sufficiently high voltage is applied to first electrical contact 1102 relative to second electrical contact 1104, p-n junction 1030b of nanowire 1000b will conduct and emit light. When the high voltage is removed from first electrical contact 1102, no light is emitted by either of nanowires 1000a and 1000b. Thus, in such an application, having the extra nanowire heterostructure(s) oriented in a direction opposite to that of current flow will not affect operation. This embodiment creates a novel type of light emitting diode, however, that emits light even when reversed biased (i.e. when p-n junction 1030a is forward biased and p-n junction 1030b does not emit light). However, in other applications, it may not be desirable to have oppositely directed p-n junctions of nanowire heterostructures. Thus, in such applications, it may be desired to deposit nanowires in a fashion such that oppositely directed p-n junctions do not occur.

For example, in another embodiment, nanowires 1000 can be aligned relative to each other and to the intended electrode pattern so that their p-n junctions 1000 are aligned. For example, this can accomplished by chemically patterning the substrate such that nanowires 1000 only stick or attach to defined locations. Furthermore, this can be accomplished in other ways.

In a similar fashion to the creation of a two-terminal device, more complex devices, such as a p-n-p or n-p-n bipolar transistors, can be formed by creating nanowire heterostructures having p-n-p repeating segments spaced with a period equal to the distance between source and drain electrodes. In an embodiment, for devices having more than one interface per device, it is desirable that, while the nanowire heterostructures have a built-in period substantially equal to the distance between electrodes, the total length of the device within each period be small relative to the total span. This will aid in decreasing the number of nanowires that will bridge the gap between electrodes with only a half a p-n-p segment at each end, rather than an entire p-n-p segment in the middle.

For example, FIG. 11B shows an example p-n-p transistor 1150, incorporating nanowire heterostructures, and having a drain electrode 1152, a gate 1154, and a source electrode 1156 spaced at distances equal to length 1002 (e.g., typically the distance is center-to-center for adjacent contacts/electrodes).

As shown in FIG. 1B, p-n junctions are present in each of nanowires 1000a-c between drain and gate electrodes 1152 and 1154, and between gate and source electrodes 1154 and 1156. In an embodiment, for example, gate electrode 1154 can be separated from nanowires 1000a-c by a dielectric/insulating layer (not shown in FIG. 11B). Thus, through deposition of nanowire heterostructures on electrodes 1152, 1154, and 1156, and p-n-p transistor 1150 can be formed.

Using nanowire heterostructures, it is possible to form virtually any type of electronic device from any material. For example, devices can be made using nanowire heterostructures formed from any material, including electronic, semiconducting, optical, electro-optical, piezoelectric, thermoelectric, ferroelectric, and other materials.

As described above, nanowire heterostructures can be grown. Alternatively, photolithography, ion-implantation, or other doping processes can be used to create the differently doped regions of the nanowire heterostructures such that macroscopic p-n junctions are formed. In an embodiment, this process can be done as a part of the patterning process along with creating the electrodes.

Note that in embodiments, nanowire heterostructures can have more than two different dopant types. For example, nanowires 1000 have two repeating dopant type portions: n-doped and p-doped portions (i.e., a repeating n:p doped pattern). Furthermore, nanowire heterostructures can other numbers of repeating dopant type portions, including p:n:p, n:p:n, p:i:p, n:i:n, p+:p:n, n+:n:p, p+:n:p, n+:p:n, and any other repeating pattern.

FIG. 12 shows a flowchart 1200 providing example steps for making an electrical device incorporating nanowire heterostructures, according to an embodiment of the present invention. The steps of FIG. 12 do not necessarily have to occur in the order shown, as will be apparent to persons skilled in the relevant art(s) based on the teachings herein. Other structural embodiments will be apparent to persons skilled in the relevant art(s) based on the following discussion. These steps are described in detail below.

Flowchart 1200 begins with step 1202. In step 1202, a plurality of nanowires are formed so that each nanowire has along its long axis at least one first portion doped with a first dopant and at least one second portion doped with a second dopant, each nanowire having a spacing between consecutive junctions of the first and second portions substantially equal to a first distance. For example, the plurality of nanowires can be formed similarly to nanowire 1000 of FIG. 10. As shown in FIG. 10, nanowire 1000 is formed to have p-doped portions 1010 and n-doped portions 1020, which are respectively doped with n- and p-type dopant materials. Furthermore, as shown in FIG. 10, nanowire 1000 has a spacing between p-n junctions 1030 of a length 1002. A nanowire heterostructure can be formed to any length, having any number of alternating doped portions.

In step 1204, a pair of electrical contacts are formed on the substrate, wherein a distance between the electrical contacts is approximately equal to the first distance. For example, in an embodiment, the electrical contacts are first and second electrical contacts 1102 and 1104, shown in FIG. 11A. As shown in FIG. 11A, the distance between first and second electrical contacts 1102 and 1104 is approximately equal to length 1002. Alternately, in an embodiment, the pair of electrical contacts are drain and gate electrodes 1152 and 1154 shown in FIG. 11B.

In step 1206, the plurality of nanowires are deposited onto the substrate, wherein at least one nanowire of the plurality of nanowires couples the first electrical contact to the second electrical contact. For example, as shown in FIG. 11A, a plurality of nanowires 1000a-e are deposited onto, the substrate. As shown in FIG. 11B, a plurality of nanowires 1000a-c are deposited onto the substrate. The plurality of nanowires may be deposited onto the substrate in any fashion described herein, or otherwise known. The plurality of nanowires may then become attached to the electrical contacts, according to any manner of attachment.

Light Emitting Thin Films Using Nanowire Macroelectronics

In embodiments, nanowires fabricated from fluorescent semiconductor materials, phosphorescent, electroluminescent, cathodoluminescent or other light-emitting materials, can be deposited onto a glass, plastic, or other substrate type to allow for low-cost, large-area lighting, emanating white or any other color of light. For example, an aligned monolayer of semiconducting nanowires can be formed on a substrate for this purpose. These nanowires can be fabricated from fluorescent materials, such as CdSe, GaN, InP or any other traditional or non-traditional electroluminescent semiconductor material.

However, in order to form a light emitting diode (LED), a p-n junction must be present in each nanowire, between each electrode pair. This can be difficult and costly to manufacture if each nanowire must be macroscopically doped using post-fabrication ion-implantation, for example.

Thus, according to the present invention, nanowires can be formed/grown with p-n junctions in them, in a similar fashion as described above for nanowire heterostructures. As described above, each nanowire can be formed to have one or more p-n junctions. The p-n junctions are preferably spaced apart at approximately the same distance as the distance between the electrodes to which they will be attached in the final display/illumination device. Thus, as described above, when a quantity of nanowire heterostructures are deposited onto the substrate, there will be a distribution of p-n junctions located between the electrodes, but no single p- or n-doped region will span the entire distance between the electrodes. On average, every wire will span the entire gap or distance between the electrodes and will have one p-n junction between the electrodes. This creates an efficient LED in each nanowire in which the p-n orientation is correct for the bias direction for a macroelectronic LED. By patterning an array of anode and cathode electrodes, or source/drain electrodes, this can be done over an extremely large area, on a flexible substrate, if desired. Note that a unique aspect of the present invention is that if nanowires are deposited such that the locations of the ends are random, roughly half of the nanowires on a particular surface will have p-n junctions in the proper orientation and will therefore produce light when a bias is applied in a particular direction, while the other half will not. When biased in the opposite direction, the roles will be reversed for the different populations of nanowires such that the second half of the nanowires will emit light while the first will not. As such, this technology enables a bi-polar LED. Through use of partial end-alignment as described above, a more traditional uni-polar LED can also be fabricated using the present invention.

A color or wavelength of light emitted by a nanowire depends, at least in part, on the type of material from which the nanowire is fabricated, and upon a diameter of the nanowire. In an embodiment, by using a single nanowire material and nanowire diameter for a plurality of nanowires used in a display/illumination device, a monochromatic light source can be created. In another embodiment, by using a mixture of nanowires fabricated from different materials and/or having different diameters, a polychromatic light source can be created. For example, if red, blue, and green nanowires are included in the mixture, a white light source can be created.

Light emitting nanowire thin films of the present invention allow for higher quality color purity of light emissions, and for an improved color index over conventional light emitters. These factors for light emitting nanowire thin films are much higher than for OLED-based versions of thin-film light emitters due to an ability to blend many pure colors, in embodiments of the present invention.

Quantum confinement effects in nanowires can be taken advantage of to control the emission wavelength of an electroluminescent nanowire as a function of diameter, while retaining the same material composition. This may be used to simplify the electrical interfacing to such a mixed film, because the composition of each light emitting element within the mixed film is the same.

Note that the electrodes for the light emitting nanowires heterostructures can be arranged in any pattern, as is desired for a display or illumination pattern. For example, FIG. 13A shows a discrete pixel or light source 1300, having a pair of electrodes, first electrical contact 1302 and second electrical contact 1304, according to an embodiment of the present invention. First and second electrical contacts 1302 and 1304 can be anode and cathode electrodes for an LED, or can be a pair of electrodes of a light emitting transistor. A plurality of light emitting nanowires 1310a-e are also present in light source 1300. Light emitting nanowires 1310a-e, which are doped similarly to nanowire 1000 of FIG. 10, and are fabricated from light emitting materials, are coupled between first and second electrical contacts 1302 and 1304. The p-n junction 1320 of each of light emitting nanowires 1310a-e emits light when a sufficient voltage is applied to first electrical contact 1302 relative to second electrical contact 1304. Although nanowires 1310a-e are shown to be aligned in FIG. 13A, in alternative embodiments, nanowires 1310 do not need to be aligned, and can be randomly distributed, for example.

In another example embodiment, FIG. 13B shows a column of discrete pixels or light sources 1300a-c, each similar to pixel or light source 1300. In a similar fashion, any number of pixels or light sources 1300 can be arranged in rows, columns, or in a two-dimensional array, to be used in a display having a large number/plurality of pixels, for example. Note that, as shown in FIG. 13B, light sources 1300a-c can have a common second electrical contact 1304, if desired, and can still be independently controlled by first electrical contacts 1302a-c, respectively. Alternatively, independent second electrical contact are also possible.

In another example embodiment, FIG. 13C shows a large area light source 1320, which includes a plurality of light source columns 1350, according to an embodiment of the present invention. Light source 1320 includes elongated first and second electrical contacts 1324 and 1326, which are arranged to illuminate p-n junctions in multiple columns 1350a-c (or rows) to provide illumination over a large area. First and second electrical contacts 1324 and 1326 can have any lengths, can have any number of bends and/or trace "fingers", and can interlock in any number of columns and/or rows to allow for nanowires to bridge them, to provide light over a relatively large area (and/or provide other diode function).

Note that the spacing between electrodes can be selected for optimum electrical performance. The length of electrodes can be arbitrarily long, to maximize a total fluorescent/illumination output and to reduce a number of required processing steps.

In another embodiment, nanowires 1310 can be aligned relative to each other and to the intended electrode pattern so that their p-n junctions 1320 are aligned. For example, this can accomplished by chemically patterning the substrate such that nanowires 1310 only stick or attach to defined locations. This can create a more efficient light-emitting device, and cause less statistical variation between formed light source devices. Alternatively, nanowires 1310 can be deposited randomly or isotropically oriented. In such an embodiment, a relatively less efficient light-emitting device may be created (e.g., fewer of nanowires 1310 may be coupled to the electrodes, and thus not operational), and can cause relatively more statistical variation between formed light source devices.

Furthermore, a light source can include nanowires 1310 formed in a film that is a mono-layer of nanowires 1310 (i.e., one nanowire thick layer), a sub-monolayer of nanowires 1310, or multiple layers of nanowires 1310.

In addition, it is possible to create a light-emitting film without the need for fabricating p-n junctions within the nanowires. This can be accomplished through post deposition lithography and implantation, or through the fabrication of a Schotky diode at the semiconductor-electrode interface.

FIG. 14 shows a flowchart 1400 providing example steps for making a light emitting device incorporating light emitting nanowire heterostructures, according to an embodiment of the present invention. The steps of FIG. 14 do not necessarily have to occur in the order shown, as will be apparent to persons skilled in the relevant art(s) based on the teachings herein. Other structural embodiments will be apparent to persons skilled in the relevant art(s) based on the following discussion. These steps are described in detail below.

Flowchart 1400 begins with step 1402. In step 1402, at least one light emitting semiconductor material is selected. For example, the semiconductor material can include one or more fluorescent materials, or other light emitting materials, such as CdSe or InP, that are suitable for light emitting nanowire applications. A single material can be selected for a monochromatic light source, or multiple materials can be selected to fabricate different nanowires, so that a polychromatic light source can be created.

Note that some materials are light emitting at a nanoscale size, even though the material does emit light when at a larger size. These materials are suitable for use in light emitting nanowires. For example, some bulk semiconductor materials are not light emitting, while a nano-sized particle of the same material is. This includes silicon, which is typically not a light-emitting semiconductor, but does begin to emit light below a certain critical size. Any of these light emitting emiconductor material types are applicable to the present invention.

Note that flowchart 1400 can optionally include the step of selecting diameter(s) for the nanowires.

In step 1404, a plurality of nanowires are formed from the selected at least one light emitting semiconductor material. For example, the plurality of nanowires are nanowires 1310a-e, shown in FIG. 13A. Note that any number of light emitting nanowires can be created for a particular operation, including numbers in the 10s, 100s, 1000s, millions, and other numbers. In an embodiment, note that step 1404 can include the step of forming one or more of the plurality of nanowires to have the selected diameter(s).

In step 1406, each nanowire is doped so that each nanowire includes at least one p-n junction. In an embodiment, each nanowire is doped to have a plurality of alternating n- and p-doped portions. For example, the nanowires are doped in a similar fashion as shown for nanowire 1000 shown in FIG. 10, and as shown for nanowires 1310*a-e* shown in FIG. 13A. The nanowires can be doped to have any number of alternating n- and p-doped portions.

Note that in an embodiment, steps 1404 and 1406 are performed concurrently, where the n- and n-doped regions are formed in the nanowires as the nanowires are grown. Alternatively, steps 1404 and 1406 can be performed separately. Furthermore, in an embodiment, each nanowire is formed to have a distance between consecutive junctions of alternately doped portions substantially equal to a first distance.

In step 1408, the plurality of nanowires are deposited onto a substrate. For example, the plurality of nanowires are deposited on a substrate as shown in FIGS. 13A-13C. The nanowires can be deposited in any manner, and can be deposited onto any substrate type described elsewhere herein, or otherwise known. The substrate can be any size, including small or large, such as a large area macroelectronic substrate. In an embodiment, the substrate has first and second electrical contacts formed thereon. In an embodiment, at least one nanowire of the plurality of nanowires couples the first electrical contact to the second electrical contact. Furthermore, the electrical contacts can be spaced apart at the distance between p-n junctions in the nanowires.

Note that in an alternative embodiment for a light emitting semiconductor device, nanowires are deposited onto a substrate, coupling a first electrical contact to a second electrical contact. At least one of the first and second electrical contacts is a metal contact. During operation of the light emitting device, light can be caused to be emitted from a junction of the nanowires and the metal electrical contact, due to the Schottky effect, in a similar fashion to the way a Schottky diode operates. In such an embodiment, the nanowires used in the device do not necessarily have to be nanowire heterostructrures, and can instead be uniformly doped/undoped nanowires, if desired.

Nanowire Solution Flow Mask Embodiments

As described above, many electronic and other type devices can incorporate nanowires. In this sub-section, techniques are desired for accurate positioning of nanowires.

In a large-scale manufacturing context, nanowire placement techniques are desired for devices manufactured in large quantities. For example, for each device manufactured, the nanowires must be positioned on surfaces of the device to make electrical contacts as needed. However, the devices must be manufactured in a commercially/economically practical manner. The nanowires must be accurately positioned, and placed on the surface(s) in sufficient quantity/density. In some cases, the nanowires must be placed in alignment with each other. Thus, techniques are desired for placement of nanowires according to these manufacturing requirements, in a commercially/economically practical manner.

Furthermore, in a quality control context, after nanowires are manufactured, it may be desirable to test some of the manufactured nanowires. For example, it may be desirable to test whether the nanowires are sufficiently conductive, to measure an impedance of the nanowires, and/or to measure other electrical/mechanical attributes of the nanowires. Thus, it may be desirable to position the nanowires in a commercially practical manner on a surface in contact with test electrodes.

According to the present invention, nanowires in a solution are flowed over a surface. The nanowire solution is flowed over the surface in a manner such that one or more nanowires of the solution reside on or adhere to the surface. The nanowire solution flow is then removed, and the one or more nanowires remain on the surface to form one or more electrical connections and/or other connection types.

In an embodiment, a flow mask is used to direct the flow of nanowires onto a designated portion of a surface. The flow mask thus allows for the positioning of the nanowires on the designated portion of the surface. In an embodiment, using the flow mask, the nanowires are positioned in alignment with each other. In other embodiments, the nanowires are not placed in alignment by the flow mask In an embodiment, the present invention allows for nanowires to be positioned with low probability of forming a parallel circuit. In other words, the present invention allows for deposition of nanowires at a desired density, so that electrical connections are formed by a single nanowire, if desired. Furthermore, devices are provided that also enable rapid measurement of wire and contact resistances in both wet chemical and dry environments.

This section describes example flow techniques and flow mask embodiments for positioning nanowires on surfaces. Nanowires can be positioned by the flow mask on semiconductor wafers, electronic substrates, or any other surface, for use in electronic devices, in electrical test configurations, and in any other devices or systems. The particular embodiments described herein are provided for illustrative purposes, and are not limiting. Alternative embodiments for flow masks will be apparent to persons skilled in the relevant art(s) from the teachings herein. These alternative embodiments are within the scope and spirit of the present invention.

FIGS. 15A and 15B show bottom and cross-sectional views of an example flow mask 1500, according to an embodiment of the present invention. As shown in FIGS. 15A and 15B, flow mask 1500 includes a body 1502. Body 1502 includes an input port 1510 and an output port 1520. A first surface 1504 of body 1502 is configured to mate with a target surface. For example, the target surface may be a surface of a wafer, a surface of a substrate, such as a macro-electronic substrate, or surface of any other structure. For instance, the target surface can be a surface of a semiconductor wafer that has an array of integrated circuits formed thereon. Flow mask 1500 can be applied to the semiconductor wafer surface to position nanowires on any or all of the integrated circuits. Flow mask 1500 can be sized to cover an entire wafer, or to cover any portion thereof.

As shown in FIG. 15A, first surface 1504 has a plurality of channels 1506*a*-1506*e* formed therein. First surface 1504 can have any number of one or more channels 1506 formed therein. Channels 1506 can be substantially parallel to each other, as shown in FIG. 15A, or they can be formed in one or more different directions, as is desired for deposition of nanowires. As shown in FIG. 15A, first surface 1504 also has first and second feeder channels 1530*a* and 1530*b* formed therein. First feeder channel 1530*a* is an input feeder channel coupled between input port 1510 and a first end of channels 1506. Second feeder channel 1530*b* is an output feeder channel coupled between a second end of channels 1506 and output port 1520. First and second feeder channels 1530*a* and 1530*b* are optionally present. Furthermore, when present, first and second feeder channels 1530*a* and 1530*b* may be exposed on first surface 1504 (as shown in FIG. 15A) or may be internal to flow mask 1500. In embodiments where one or both of first and second feeder channels 1530*a* and 1530*b* are not present, each of channels 1506 may be directly coupled to input port 1510 and/or to output port 1520. Alternatively, an input port 1510 and/or an output port 1520 can be present for each channel.

As shown in FIGS. 15A and 15B, input port 1510 is coupled to a first end of channels 1506*a-e* through first feeder channel 1530a, and output port 1520 is coupled to a second end of channels 1506a-e through second feeder channel 1530b. Input port 1510 is formed in body 1502 to supply a flow of nanowires to channel 1506a-e. Output port 1520 is formed in body 1502 to remove the flow of nanowires from channels 1506a-e. Thus, a flow of nanowires is directed into input port 1510 of body 1502, and flows through first feeder channel 1530a. First feeder channel 1530a disperses the flow of nanowires to channels 1506a-e. Second feeder channel 1530b collects the flow of nanowires from channels 1506a-e. The flow of nanowires flows from second feeder channel 1530b to output port 1520, where it is removed from flow mask 1500. When first surface 1504 is mated with a target surface, channels 1506a-e each cover a portion of the target surface. Channels 1506a-e are formed in first surface 1504 to allow nanowires of the flow of nanowires to be positioned on a portion of the target surface covered by channels 1506a-e.

The length, width, and/or depth of channels 1506 can be selected to control the flow of nanowires, and to optimize/control the placement and orientation of nanowires on the target surface. These parameters can be optimized for a particular length/width of nanowires of the flow of nanowires. Furthermore, these parameters can be optimized for a particular target conductive pattern on the target surface. For example, flow mask 1500 can have channels of any width, including widths in the ones, tens, hundreds, and thousands of micrometers. For example, for nanowires of 15 μm length, channel widths can in be the range of 1-1000 μm, including 100 μm, 500 μm, 700 μm, and other width channels therebetween and otherwise. Furthermore, a channel 1506 can include a plurality of channel segments, separated by conduits (i.e., tubes or tunnels in flow mask 1500) that are internal to flow mask 1500. In this manner, a channel 1506 can position nanowires on discrete, separate areas of the target surface, along the channel 1506.

Flow mask 1500 can be formed from various materials, including a metal or combination of metals/an alloy, a plastic, a polymer, glass, a substrate material, and other material. Flow mask 1500 can be molded, machined, etched, and/or otherwise formed. Flow mask 1500 can be made any size as required. For example, a four inch diameter or square flow mask can be used to interface with a four inch substrate or wafer.

A variety of systems can incorporate flow mask 1500 for positioning nanowires, according to embodiments of the present invention. For example, FIG. 16 shows a nanowire positioning system 1600 that incorporates flow mask 1500, according to an example embodiment of the present invention. As shown in FIG. 16, system 1600 includes flow mask 1500, a target surface 1602, a nanowire solution source 1604, and a nanowire solution receptacle 1606. Furthermore, as shown in FIG. 16, nanowire solution source 1604 contains a nanowire solution 1650. Nanowire solution 1650 is typically a liquid solution containing a plurality of nanowires. The composition of nanowire solution 1650 can be selected to aid in transferring nanowires from the flow of nanowires through flow mask 1500 to target surface 1602.

As shown in FIG. 16, first surface 1504 of flow mask 1500 is mated with target surface 1602. Flow mask 1500 is configured to mate with target surface 1602 so that a substantially leak-proof seal is formed therebetween. Thus, nanowire solution 1650 will be substantially contained within an enclosure formed between flow mask 1500 and target surface 1602 when flowing therethrough. In an embodiment, first surface 1504 of flow mask 1500 is substantially flat or planar (exclusive of channels 1506 and feeder channels 1530, when present) to mate with a flat or planar target surface 1602, to form a seal. However, in alternative embodiments, first surface 1504 can be otherwise contoured to mate with target surface 1602. Furthermore, flow mask 1500 and target surface 1602 can have interlocking tab(s) and slot(s) to allow them to mate/align properly with each other. Flow mask 1500 and target surface 1602 can alternatively be optically and/or otherwise mechanically mated/aligned. A sealing material may be used between flow mask 1500 and target surface 1602 to aid in maintaining a seal, although such a sealing material is not required in all applications.

Nanowire solution source 1604 is coupled to input port 1510 of flow mask 1500. Nanowire solution source 1604 supplies nanowire solution 1650 to input port 1510 to supply a flow of nanowires through flow mask 1500, across target surface 1602. Nanowire solution receptacle 1606 is coupled to output port 1520 of flow mask 1500 to receive and remove the flow of nanowires from flow mask 1500, and in embodiments, can store the received nanowire solution 1650. In an embodiment, nanowire solution source 1604 can supply a pressurized flow of nanowires through flow mask 1500. Furthermore, in an embodiment, nanowire solution source 1604 can precisely control a flow rate of nanowire solution 1650 through flow mask 1500.

FIGS. 17A and 17B show plan and cross-sectional views of a flow 1702 of nanowires flowing through flow mask 1500, according to an example embodiment of the present invention. The direction/path of flow 1702 through flow mask 1500 is indicated generally by arrows. Furthermore, additional arrows 1710 indicate a path that some nanowires of flow of nanowires 1702 take to leave nanowire solution 1650 to become positioned on target surface 1602. In an embodiment, the nanowires become positioned on target surface 1602 in an orientation substantially parallel to a direction of flow 1702 through channels 1506.

FIG. 18A shows a plan view of an example semiconductor wafer 1800 mated with flow mask 1500 (only channel positions of flow mask 1500 are shown in FIG. 18A). The positions of channels 1506a-e of flow mask 1500 relative to wafer 1800 are indicated by dotted lines. Each of channels 1506a-e are positioned to cover a corresponding one of portions 1802a-e of wafer 1800.

FIG. 18B shows nanowire regions 1810a-e (i.e., nanowire deposition regions) on the surface of wafer 1800 having nanowires positioned thereon, due to operation of the present invention.

FIG. 18C shows further detail of an example, wafer 1800 showing a location of an array of integrated circuits 1820a-n formed thereon. Integrated circuits 1820 can be any integrated circuit type, and any size, including 0.5 cm². As shown in FIG. 18C, a portion of each integrated circuit 1820a-n is covered by a portion of one of nanowire regions 1810a-e. Thus, nanowires are positioned by the flow mask of the present invention on portions of each of integrated circuits 1820a-n. For example, the integrated circuits can each include a plurality of electrically conductive traces. The nanowires of nanowire regions 1810a-e form one or more connections between electrically conductive traces of each integrated circuit 1820.

For example, FIG. 19A shows an integrated circuit 1900, which can be an example of one of integrated circuits 1820. As indicated in FIG. 19A, a portion 1802 of integrated circuit 1900 is covered by a channel of a flow mask. FIG. 19B shows a close-up view a portion 1920 of integrated circuit 1900, showing detail of example electrically conductive traces 1902. FIG. 19C shows a view of portion 1920, after nanowires 1910 have been deposited thereon in nanowire region 1810 by operation of flow mask 1500. As shown in FIG. 19C, after operation of flow mask 1500, nanowires 1910 are positioned to form electrical connections between various traces of electrically conductive traces 1902. For example, as shown in FIG. 19C, a nanowire 1910a forms a connection between a trace finger of a ground signal trace 1904 and a trace finger 1956.

Note that the density of nanowires 1910 deposited on an integrated circuit, or other surface, can be controlled in various ways, including: varying the rate of flow of nanowires through flow mask 1500; selecting a density of nanowires in nanowire solution 1650; controlling a composition of nanowire solution 1650 (e.g., selecting the base solution type, etc.); selecting a length of time to apply the flow of nanowires, etc. The density of nanowires 1910 can thereby be controlled to statistically control how many of nanowires 1910 will be allowed to make each connection on integrated circuit 1900. Furthermore, the spacing between electrodes, the thickness of electrodes, the width of channels 1506, etc., can be used to control how many of nanowires 1910 will be allowed to make each connection.

Furthermore, note that nanowires 1910 can be deposited on the substrate by flow mask 1500 before or after the pattern of integrated circuit 1900 is formed on the substrate. For example, if nanowires 1910 are deposited first, the traces of integrated circuit 1900 are then formed on the substrate, on nanowires 1910.

FIG. 20A shows a graph 2000 related to FIGS. 19A-C. Graph 2000 shows various probabilities related to forming electrical connections for integrated circuit 1900, according to the present invention. The Y-axis of graph 2000 indicates a probability, and the X-axis of graph 2000 indicates a number of nanowires per length (1/μm). The example of graph 2000 relates nanowires of an example length of 15 μm being applied to integrated circuit 1900 having trace separation of 12 μm in the region of nanowire deposition. Line 2002 indicates a probability of an open circuit. Line 2004 indicates a probability of a single nanowire forming a conductive path between conductive traces. Line 2006 indicates a probability of more than a single nanowire forming a conductive path between conductive traces. As shown on line 2004 in FIG. 20A, for a trace separation of 12 μm, and nanowires having an average length of 15 μm, a maximum probability for a single nanowire forming a conductive path between conductive traces is around 0.35, at a range of 0.3-0.4 nanowires/length of the nanowire solution being applied, where:

nanowires/length = a density of × electrical contact
(1/Φm)     nanowires in the   width
           nanowire solution   (Φm)
           (1/Φm²)

FIGS. 19D shows another example integrated circuit 1950, which can be an example of integrated circuit 1820. As indicated in FIG. 19D, a portion 1802 of integrated circuit 1950 is covered by a channel of a flow mask. FIG. 19E shows a close-up view of a portion 1960 of integrated circuit 1950. FIG. 19F shows a view of portion 1960, after nanowires 1910 have been deposited thereon in nanowire region 1810 by operation of flow mask 1500. As shown in FIG. 19F, after operation of flow mask 1500, nanowires 1910 are positioned to form electrical connections between various traces of electrically conductive traces 1952 of integrated circuit 1950. For example, a nanowire 1910a forms a connection between trace fingers 1954 and 1956.

FIG. 20B shows a graph 2050 related to FIGS. 19D-19F that is similar to graph 2000. Line 2052 indicates a probability of a single nanowire forming a conductive path between conductive traces/electrodes. Line 2054 indicates a probability of more than a single nanowire forming a conductive path between conductive traces. As shown on line 2052 in FIG. 20B, for a trace separation of 4 μm, and nanowires having an average length of 15 μm, a maximum probability for a single nanowire forming a conductive path between conductive traces is around 0.06, at about 0.05 nanowires/length of the nanowire solution being applied. By varying electrical contact spacing, nanowire length, and/or other parameters, the probabilities shown in FIGS. 20A and 20B can be altered, and optimized for a particular application.

Note that the integrated circuits described above can be any type of integrated circuit device, for use in an end product, for example. Alternatively, these integrated circuits can be used for testing of fabricated nanowires. For example, nanowires can be positioned on an integrated circuit (or other circuit type) using the flow mask of the present invention to test whether the nanowires are sufficiently conductive, to measure an impedance of the nanowires, and/or to measure other electrical/mechanical attributes of the nanowires. Two point and four point test probe devices can be used to test the nanowires on the integrated circuits, for example. For example, integrated circuit 1950 of FIG. 19D can be used in a four-test probe system. Test probes can be coupled to two of the pads near the outer edges of integrated circuit 1950 to test a nanowire coupling together traces that correspond to the two pads. A pair of probes that measure a resistance between the pads, or other parameter, due to the nanowire(s) can be coupled to the pads, while another pair of probes are used to supply a test current. In a similar fashion, integrated circuit 1900 of FIG. 19A can be used in a two-test probe system, where trace 1904 shown in FIG. 19C is coupled to ground or other reference potential. Alternatively, integrated circuits 1900 and 1950 can be used as electrical devices, where nanowires are flowed thereon to create electrical connections, diodes, transistors, etc.

FIG. 21 shows a flowchart 2100 providing example steps for positioning nanowires on a target surface using a flow mask, according to an example embodiment of the present invention. Other structural and operational embodiments will be apparent to persons skilled in the relevant art(s) based on the following discussion. These steps are described in detail below.

Flowchart 2100 begins with step 2102. In step 2102, a flow mask is mated with the target surface. For example, in an embodiment, the flow mask is flow mask 1500 shown in FIGS. 15A and 15B. As shown in FIG. 16, first surface 1504 of flow mask 1500 is mated with target surface 1602.

In step 2104, a liquid that contains a plurality of nanowires is flowed through at least one channel in a surface of the flow mask. For example, as shown in FIGS. 17A and 17B, the liquid containing a plurality of nanowires is a nanowire solution, such as nanowire solution 1650. As shown in FIG. 17A, nanowire solution 1650 flows through flow mask 1500 in the direction of flow 1702. Flow 1702 of nanowires flows through one or more channels, such as channels 1506a-e shown in flow mask 1500 of FIG. 15A. As shown in FIG. 18A, channels 1506 cover portions 1802 of an example target surface.

In step 2106, nanowires contained in the liquid flowing through the at least one channel are permitted to become positioned on the portion of the target surface covered by the at least one channel. For example, as indicated by arrows 1710 in FIG. 17B, nanowires are permitted to become positioned on target surface 1602 from flow 1702. In an embodiment, the nanowires positioned on target surface 1602 form at least one electrical connection between electrically conductive features on target surface 1602. In an embodiment, a density of nanowires in the nanowire solution can be selected so that a sufficient number of nanowires are permitted to become positioned on the covered portion of the target surface to form the electrical connections In step 2108, the flow of the liquid through the at least one channel is discontinued. In this manner, nanowires are allowed to remain positioned on the portion of the target surface. For example, as shown in FIG. 18B, nanowires remain positioned on portions of target surface 1602, indicated as nanowire regions 1810.

In an embodiment, flowchart 2100 can include a further step, wherein the nanowires are caused to become attached (or adhere) to target surface 1602. For example, the nanowire solution can be cured on target surface 1602 to adhere the nanowires to target surface 1602. Alternatively, an epoxy or other adhesive material can be added to the nanowires on target surface 1602 to cause them to become attached.

Spraying of Nanowires on Substrates

As described above, techniques are desired for positioning nanowires on substrates, and in particular, on large area substrates. One reason for this is that it is very difficult or impossible to apply conventional photolithographic techniques to large area substrates.

According to an embodiment of the present invention, spraying techniques are used to attach nanowires to surfaces, including a large area substrate. The nanowires can be sprayed on the surfaces to form electrical connections between electrodes, or for other reasons. The nanowires can be sprayed onto the electrical contacts on the surface, or the nanowires can be sprayed onto the surface first, and then the electrical contacts can be metallized or otherwise formed directly thereon.

According to an embodiment of the present invention, the spraying techniques are used to direct a flow of nanowires onto a designated portion of a surface. For example, a spray nozzle is used to spray a nanowire solution onto a surface, to position the nanowires on designated portions of the surface. In an embodiment, using spray techniques, the nanowires are positioned in alignment with each other. In other embodiments, spraying the nanowire solution does not align the nanowires.

This section describes spray techniques and example spray nozzle embodiments for placing and positioning nanowires on surfaces. Nanowires can be positioned by the spray nozzle on semiconductor wafers, electronic substrates, or any other surface, for use in electronic devices, in electrical test configurations, and in any other devices or systems. The particular embodiments described herein are provided for illustrative purposes, and are not limiting. Alternative embodiments for the spray nozzles/techniques will be apparent to persons skilled in the relevant art(s) from the teachings herein. These alternative embodiments are within the scope and spirit of the present invention.

FIG. 22 shows a block diagram of an example nanowire spray application system 2200, according to an embodiment of the present invention. System 2200 includes a nozzle 2202, a target surface 2204, a nanowire solution source 2206, and a nanowire solution conduit 2208. System 2200 can alternatively have other configurations, as would be understood by persons skilled in the relevant art(s).

As shown in FIG. 22, nanowire solution source 2206 contains a nanowire solution 2210. Nanowire solution 2210 is typically a liquid solution containing a plurality of nanowires.

The composition of nanowire solution 2210 can be chosen to optimize the flow of nanowires through nanowire solution conduit 2208 and/or nozzle 2202 onto target surface 2204. For example, the viscosity of nanowire solution 2210 can be selected to enhance the flow of nanowires onto target surface 2204. The composition of nanowire solution 2210 can be selected depending on the size of the nanowires in nanowire solution 2210. Target surface 2204 may be a surface of a wafer, a surface of a substrate, such as a macro-electronic substrate, or surface of any other structure, either described elsewhere herein, or otherwise known.

Nanowire solution source 2206 provides nanowire solution 2210 to nozzle 2202, through nanowire solution conduit 2208. Nanowire solution conduit 2208 can be any type of conduit for a fluid or solution, including tubing, pipes, and/or valves. Note that in some embodiments nanowire solution conduit 2208 is not necessary, where nanowire solution source 2206 is coupled directly to nozzle 2202.

Nozzle 2202 is coupled to nanowire solution source 2206, to receive a flow of nanowires. Nozzle 2202 directs and/or controls a flow of nanowires onto target surface 2204. FIG. 23 shows a detailed view of nozzle 2202 outputting a flow 2302 of nanowires onto an example target surface 2204. In FIG. 23, target surface 2204 is a substrate 2306 that is supported by a substrate carrier 2308. Nozzle 2202 can have any number of one or more openings for providing the flow of nanowires onto target surface 2204. For example, nozzle 2202 can have a single opening. Alternatively, as shown in FIG. 23, nozzle 2202 can have a plurality of openings 2304a-e. Openings 2304 can be arranged in a single row or column of openings, can be arranged in a two-dimensional array of openings, or can be arranged in any other manner. Furthermore, openings 2304 can have any shape, including round, elliptical, rectangular, or other shape. Openings 2304 can be of any width, including in widths that are factors of 10's and 100's of microns. For example, a size of openings 2304 can be used to dictate a size of droplets of nanowire solution 2210 being applied to target surface 2204.

A controlled pressurized, aerosol, or jet spray source can be used to cause the flow of nanowires to spray from nozzle 2202 at desired rate. The pressure required to spray nanowires from nozzle 2202 at a particular rate can be determined on an application-by-application basis.

FIG. 24 shows a plan view of target surface 2204 having a plurality of nanowires 2402 positioned thereon, due to application of the present invention. Nanowires 2402 were deposited by nozzle 2202 from flow 2302 of nanowires. As shown in FIG. 24, nanowires 2402 are positioned on target surface 2204 in a single, substantially uniform distribution of nanowires. Nanowires 2402 can be positioned in a single distribution area through the use of a single opening 2304 in nozzle 2202, or through the use of a plurality of openings 2304 in nozzle 2202 that have adjacent or overlapping coverage areas on target surface 2204. Furthermore, nanowires 2402 are positioned on target surface 2204 in alignment (i.e., parallel to each other). In embodiments, nanowires 2402 can be aligned with respect to each other through the use of nozzle 2202. Nanowires 2402 can be aligned by nozzle 2202 depending on the size of openings 2304 in nozzle 2202, the viscosity of nanowire solution 2210, the size of the nanowires 2402, and other factors mentioned elsewhere herein. For example, droplets of nanowire solution 2210 applied to target surface 2204 can have a surface tension that aligns nanowires 2402.

FIG. 25 shows a plan view of target surface 2204 having a second plurality of nanowires 2502 positioned thereon, due to application of the present invention. Nanowires 2502 were deposited by nozzle 2202 from flow 2302 of nanowires. As shown in FIG. 25, nanowires 2502 are positioned on target surface 2204 in a plurality of distribution areas 2504a-d. Nanowires 2502 can be positioned in a plurality of distribution areas 2504a-d through the use of a single opening 2304 in nozzle 2202, that is directed/moved to deposit nanowires in multiple non-overlapping areas, or through the use of a plurality of openings 2304 in nozzle 2202 that have non-adjacent or non-overlapping coverage areas on target surface 2204. Furthermore, nanowires 2502 are positioned on target surface 2204 in alignment (i.e., parallel to each other). In embodiments, openings 2304 can be configured to cause nanowires to be randomly aligned (i.e., non-necessarily parallel to each other) on target surface 2204.

Electronic contacts can be formed on target surface 2204 before or after deposition of nanowires 2402 by nozzle 2202. FIG. 26 shows a plan view of target surface 2204 of FIG. 24 with a plurality of electrical contacts 2602a-e formed thereon, in electrical contact with nanowires 2402. Nanowires 2402 form electrical connections between adjacent pairs of electrical contacts 2602a-e. Electrical contacts 2602 can be any electrical contact type. For example, adjacent pairs of electrical contacts 2602 can be anode and cathode electrodes. Alternatively, three adjacent electrical contacts 2602 can function as drain, gate, and source electrodes of a transistor.

Any type of nanowire described herein or otherwise known can be deposited using spray techniques of the present invention. The density of nanowires in nanowire solution 2210 can be controlled to create a desired density of nanowires deposited on target surface 2204. Furthermore, once nanowires have been deposited on target surface 2204 using spray techniques, the nanowires/nanowire solution can be cured or set on target surface 2204 in any manner described elsewhere herein or otherwise known. After nanowires have been deposited on target surface 2204, any process for defining features in the nanowire film on target surface 2204 can be used, including lithographic and washing techniques, for example. Furthermore target surface 2204 can be prepared/treated to enhance adherence/attachment of nanowires in any manner described elsewhere herein, or otherwise known.

A size/diameter of openings 2304 can be configured to enhance the flow of nanowires onto target surface 2204, such as causing nanowires to be deposited in alignment. In an embodiment, a width of one or more openings 2304 can be made greater than or equal to ($\geq$) a length of the nanowires to be spray deposited. Alternatively, a width of one or more openings can be less than a length of the nanowires. In an embodiment, a width of an opening 2304 can be in a range of 1 μm to 1000 μm, although widths outside of this range can also be used, depending upon the particular application. Furthermore, openings 2304 can have any shape, including round, elliptical, rectangular, or other shape.

FIG. 27 shows a flowchart 2700 providing example steps for positioning nanowires on a target surface using spray techniques, according to an example embodiment of the present invention. Other structural and operational embodiments will be apparent to persons skilled in the relevant art(s) based on the following discussion. These steps are described in detail below.

Flowchart 2700 begins with step 2702. In step 2702, a nanowire solution is provided. For example, the nanowire solution is nanowire solution 2210, shown in FIG. 22. As described above, in an embodiment, nanowire solution 2210 is a liquid solution that contains a plurality of nanowires.

In step 2704, the nanowire solution is directed through at least one output opening of a nozzle onto the target surface.

For example, FIG. 23 shows a flow of nanowires 2302, which includes nanowire solution 2210, directed through openings 2304a-e of nozzle 2202 onto target surface 2204.

In step 2706, the nanowires are caused to become attached to the target surface. For example, step 2706 can include a step where nanowire solution 2210 includes a curable material, and is cured on target surface 2204. In an embodiment, a charge can be applied to target surface 2204 causing electrostatic attraction to aid in causing nanowires from nanowire solution 2210 to stick to target surface 2204, and to remain in place, during the application of the nanowire solution in step 2704. Charged polymers, chemicals, pigments, or agents can also be applied onto the surface. For example, a material can be applied to a substrate to create a positively charged substrate. The positively charged substrate attracts negatively charged nanowires, such as silicon nanowires coated with an oxide (e.g., $SiO_2$). Materials such as aminopropyl triethoxy silane (APTES), polylysine positively charged amine groups, an amine containing silane, or an amine containing polymer can be applied to a surface to produce this effect, such as onto a substrate that contain silicon or other material.

In an embodiment, step 2704 includes a step where the nanowires are caused to be substantially aligned parallel to each other on the target surface. For example, FIG. 24 shows target surface 2204 having a plurality of nanowires 2402 positioned thereon in alignment with each other due to the present invention.

In an embodiment, step 2704 includes a step where the nanowire solution is directed to overlapping portions of the target surface. For example, FIG. 24 shows nanowires 2402 positioned in a single distribution area. Alternatively, step 2704 can include a step where the nanowire solution is directed to a plurality of non-overlapping portions of the target surface. For example, FIG. 25 shows nanowires 2502 positioned on target surface 2204 in a plurality of non-overlapping distribution areas 2504a-d.

In an embodiment, step 2704 can include a step where pressure is applied to force the nanowire solution through the at least one output opening of the nozzle onto the target surface.

In an embodiment, target surface 2204 can be a very large surface, such as a large area macro-electronic substrate. In such an embodiment, the target surface may be received as a continuous sheet on a conveyor belt-type system, or other substrate supply system. Thus, in an embodiment, flowchart 2700 can include the step of adjusting the position of the sheet relative to the nozzle. For example the sheet can be supplied from a roll that continuously is fed past nozzle 2202. Such relative movement between nozzle 2202 and target surface 2204 can be used to align nanowires on target surface 2204, for example.

Reducing Phonon Scattering of Electrons in Nanowires Through Selection of a Nanowire Semiconductor Material Silicon is a suitable semiconductor material for nanowires, in part due to its compatibility within the semiconductor industry. However, silicon has disadvantages of a prevalence of surface states (~$10^{10}$ cm-2), and has limits on the achievable nanowire wire diameters necessary to eliminate phonon scattering of electrons.

Thus, according to the present invention, alternative materials for fabrication of nanowires are disclosed. Such materials described herein have advantages, including reduced phonon scattering of nanowires and increased diameter ranges.

There are at least two ways to reduce or eliminate phonon scattering of electrons. To reduce or eliminate phonon scattering in nanowires, the energy spacing between the sub-bands of the nanowire material should be (1) larger than the phonon energy; and (2) larger than $3*k_bT$, where $k_b$ is the Boltzmann constant ($8.62\times10^{-5}$ eV/°K.), "3" is a predetermined factor, and T is the absolute temperature at which the nanowire device operates. For operation at room temperature, (2) typically is the more stringent requirement because the phonon energy of most semiconductor materials is less than $3*k_bT_{rt}$ where $T_{rt}$ is room temperature, and $k_bT_{rt}$=0.0259 eV, so that $3*k_bT_{rt}$=0.0777.

The quantum confinement of electrons in a semiconductor material relates to the confinement of electrons in sub-bands within the conduction band of the semiconductor material. Electrons in the material are confined to the specific energy levels of the sub-bands. However, the electrons can move from one sub-band energy level to another. The separation or energy difference between sub-bands can be calculated. For a nanowire material with isotropic electron (or hole) effective mass $m_{eff}$, the energy spacing between the ground state and the first excited state is given by $$\Delta E \approx \frac{8.9\hbar^2}{2m_{eff}r^2} \qquad \text{Equation 1}$$

where:

$\hbar$=Planck's constant÷$2\pi$ $m_{eff}$=effective mass of the selected semiconductor material; and r is the radius of the nanowire.

Quantum confinement of electrons in a semiconductor material is maintained when electrons cannot scatter between sub-bands. However, phonon scattering in a semiconductor material causes electrons to be scattered between sub-bands of the semiconductor material, which can reduce mobility of electrons in the nanowire. To maintain quantum confinement of electrons, phonon scattering of electrons must be prevented in the semiconductor material, to prevent electrons from being scattered between sub-bands. As described below, quantum confinement of electrons can be maintained by selecting semiconductor materials having a known effective mass $m_{eff}$, and forming nanowires from the semiconductor material to have a diameters that deter electrons from moving between energy levels of the sub-bands due to phonon scattering.

The effective mass $m_{eff}$ of different semiconductors makes some of them preferable to reduce or eliminate phonon scattering than others. Furthermore, nanowires having a smaller effective mass $m_{eff}$ allow for a larger diameter. A larger diameter for a nanowire allows for better control during nanowire growth, and provides for additional strength of the nanowires.

By setting Equation 1 equal to $Nk_bT_{rt}$, the following equation can be formed, which can be used to calculate a maximum diameter for a nanowire fabricated from a semiconductor material having an effective mass $m_{eff}$, to have substantially reduced or eliminated phonon scattering:

$$\text{the maximum radius} = \sqrt{\frac{(8.9)\hbar^2}{2m_{eff}Nk_bT}} \qquad \text{Equation 2}$$

wherein:

$\hbar$ = Planck's constant ÷ $2\pi$

= $6.626\times10^{-34}$ J-sec ÷ ($2\times3.1416$)(or $4.14\times10^{-15}$ eV-sec ÷ $2\times3.1416$)

= $1.0545\times10^{-34}$ J-sec ($6.589\times10^{-16}$ eV-sec);

$m_{eff}$=effective mass of the semiconductor material;
N=a predetermined factor;
$k_b$=Boltzmann's constant=$1.38\times10^{-23}$ J/°K. ($8.62\times10^{-5}$ eV/°K.); and
T=operating temperature;
wherein at room temperature, $k_bT$=$4.144\times10^{-21}$ J (0.0259 eV).

Thus, Equation 2 can be rewritten as:

$$\text{the maximum radius} = \sqrt{\frac{(8.9)(1.0545\times10^{-34})^2}{2m_{eff}N(4.144\times10^{-21})}}$$

$$= \sqrt{\frac{1.194\times10^{-47}}{Nm_{eff}}}$$

Predetermined factor N is a factor that can be selected to provide a statistical assurance related to the confinement of electrons and reduction of phonon scattering. For example, predetermined factor N can be selected to have any value greater than zero. In an embodiment, predetermined factor N is selected to have a value of greater than or equal ($\geq$) to 3. In another embodiment, predetermined factor N is selected to have a value of greater than or equal ($\geq$) to 5.

Graph 2800 shown in FIG. 28 shows a relationship between a maximum allowable diameter for a semiconductor material and effective mass $m_{eff}$. Maximum allowable diameter in nanometers (nm) for a nanowire is indicated on the Y-axis, and a normalized effective mass $m_{eff}/m_0$ is shown in the Y-axis of graph 2800. As shown in graph 2800, as the normalized effective mass $m_{eff}/m_0$ decreases, a maximum allowable diameter for a nanowire increases. The maximum allowable diameter for a nanowire increases sharply as normalized effective mass $m_{eff}/m_0$ decreases below 0.2.

Table 2900 shown in FIG. 29 lists various example semiconductor materials in a first column 2902. Listed in a second column 2904 are the effective masses of the semiconductor materials of first column 2902, and listed in a third column 2906 are the energy gaps of the semiconductor materials of first column 2902. As described above, semiconductor materials having relatively smaller effective mass $m_{eff}$ are favorable, as they allow for larger nanowire diameters. GaAs, InSb (for infrared detectors), and InAs stand out as example favorable choices in Table 2900, each having a relatively small effective mass $m_{eff}$, thus allowing for relatively larger nanowire diameters.

For example, applying the data of column 2904 to graph 2800 of FIG. 28, a maximum allowable diameter for a silicon (Si) nanowire having substantially reduced or eliminated phonon scattering is ~6 mn. For gallium arsenide (GaAs) the maximum allowable diameter for a nanowire having substantially reduced or eliminated phonon scattering is ~20 mn.

Furthermore, the data of table 2900 can be applied to Equation 2 to calculate a suitable nanowire diameter for a particular semiconductor material. For example, as shown in column 2904 for GaAs, $m_{eff}/m_0$ is equal to 0.067, where $m_0$ is the free electron rest mass ($9.11 \times 10^{-31}$ kg). This value is applied to Equation 2, as follows:

$$\text{maximum radius for GaAs} = \sqrt{\frac{1.194 \times 10^{-47}}{N \frac{m_{\textit{eff}}}{m_0} m_0}}$$

$$= \sqrt{\frac{1.194 \times 10^{-47}}{(3)(.067)(9.11 \times 10^{-31})}}$$

$$\cong 8.07 \text{ nm}$$

where
$m_0$=free electron rest mass=$9.11 \times 10^{-31}$ kg; and
N=3.

Thus, for GaAs, a diameter up to 16.14 nm can be used, while reducing or eliminating phonon scattering.

Thus, nanowires can be used individually, or in groups/thin films, where the nanowires are formed to have a diameter less than or equal to ($\leqq$) a maximum diameter determined for the semiconductor material of the nanowires(s) to allow each nanowire to retain substantial quantum confinement of electrons (i.e., substantially reduce or completely eliminate phonon scattering of electrons).

Furthermore, in an embodiment, each nanowire can be formed to have a length less than or equal to ($\leqq$) a predetermined length such that ballistic transport of electrons can occur through each nanowire.

FIG. 30 shows a flowchart 3000 providing example steps for designing conducting nanowires having high mobility of electrons, according to an example embodiment of the present invention. Other structural and operational embodiments will be apparent to persons skilled in the relevant art(s) based on the following discussion. These steps are described in detail below.

Flowchart 3000 begins with step 3002. In step 3002, a semiconductor material is selected. For example, the semiconductor material can be selected from Table 2900 of FIG. 29, or can be any other semiconductor material described herein, or otherwise known.

In step 3004, a maximum diameter for a nanowire made from the selected semiconductor material is determined, that provides substantial quantum confinement of electrons. For example, the diameter can be selected by viewing graph 2800 of FIG. 28, or by calculating the maximum diameter using Equation 2.

In step 3006, a plurality of nanowires are formed from the selected semiconductor material, each nanowire of the plurality of nanowires being formed to have a diameter less than or equal to ($\leqq$) to the determined maximum diameter.

Reducing Phonon Scattering of Electrons in Nanowires With Doping Strategies

According to the present invention, phonon scattering of electrons in nanowires can be reduced or eliminated through nanowire semiconductor doping strategies. The effect of doping (whether n-type or p-type) can affect the phonon scattering of electrons in the nanowire, as well as the physical strength of the wire. In embodiments of the present invention, as further described below, semiconductors with either electrons or holes as conducting carriers can be doped to improve performance.

Most semiconductors have degenerate bands at the valence band maximum, with both heavy holes and light holes. The smallest energy spacing between the valence bands comes from the heavy holes with larger effective mass. Therefore, in a preferred embodiment, nanowires are configured so that electrons are the conducting carriers in the nanowires, because the effective mass of holes are greater than that of electrons.

Configuring nanowires to use electrons as conducting carriers can be accomplished by n-doping the nanowires directly, and/or by applying a bias gate voltage on p-doped wires. Table 3100 shown in FIG. 31 lists example III-V semiconductor type materials in a column 3102. A column 3104 contains corresponding effective masses for electrons for the materials of column 3102. Columns 3106 and 3108 contain corresponding effective masses for light holes and heavy holes, respectively, for the materials of column 3102. For all the semiconductor materials listed in Table 3100, the effective mass shown in column 3104 for electrons is less than the effective masses contained in columns 3106 and 3108 for light holes and heavy holes. Thus, n-doping of nanowires made from these semiconductor materials would lead to lower phonon scattering compared to p-doping.

Note that Table 3100 listing III-V semiconductor type materials is provided for illustrative purposes, and that the present invention is applicable to semiconductor material types other than just III-V semiconductor types.

Furthermore, the mechanical strength of n-doped silicon is greater than that of p-doped silicon, which can also be an advantage in choosing n-doping of nanowires over p-doping of nanowires. For further details, refer to B. Busham and X. Li, Journal of Materials Research, Vol. 12, page 54 (1997).

Alternatively, the nanowires can be doped with a p-type dopant material, and the nanowires can be configured so that electrons are the conducting carriers. For example, a thin film of nanowires incorporating the p-doped nanowires can be operated in an inversion mode by applying a sufficient bias voltage to the thin film of nanowires. This can cause electrons to be used as the conducting carriers in the p-doped nanowires, reducing or eliminating phonon scattering in the p-doped nanowires. For example, in a transistor embodiment, a bias voltage can be applied to the plurality of nanowires as a gate bias voltage for the transistor, to operate the nanowires in inversion mode.

Use of Core Shell Materials to Reduce Surface States in Nanowires

Another factor toward achieving increased mobility of electrons, including even ballistic transport of electrons in nanowires, is a reduction in both surface and bulk (i.e., nanowire core) impurity scattering. In nanowires, surface scattering is especially significant, where a larger surface-to-bulk ratio exists.

Surface scattering can be reduced by forming an outer layer of the nanowire, such as by the passivation annealing of nanowires, and/or the use of core-shell structures with nanowires. For example, FIG. 3B shows an example nanowire 310 doped according to a core-shell structure. An insulating layer, such as an oxide coating, can be formed on a nanowire as the shell layer. Furthermore, for example, for silicon nanowires having an oxide coating, the annealing of the nanowires in hydrogen ($H_2$) can greatly reduce surface states. In another example, for nanowires having compound semiconductors in the nanowire core, such as GaAs, the use of an AlGaAs (or similar compound for other compound semiconductor types) shell can effectively confine the electron wave functions, and also serve to reduce surface states.

In embodiments, the a core-shell combination is configured to satisfy the following constraints: (1) the shell energy level should be higher than the core energy level, so that the conducting carriers are confined in the core; and (2) the core and shell materials should have good lattice match, with few surface states and surface charges.

Note that in an embodiment, the thickness of the shell layer versus the wire diameter can be varied, to improve carrier mobility in the nanowires, and to reduce surface states.

FIG. 32 shows a flowchart 3200 providing example steps for fabricating nanowires having reduced surface scattering, according to an example embodiment of the present invention. Other structural and operational embodiments will be apparent to persons skilled in the relevant art(s) based on the following discussion. These steps are described in detail below.

Flowchart 3200 begins with step 3202. In step 3202, a semiconductor material is selected. Any semiconductor material, including those described elsewhere herein, or otherwise known, can be selected.

In step 3204, a plurality of nanowires are formed from the selected semiconductor material. For example, the nanowires can be grown or otherwise formed from the selected semiconductor material.

In step 3206, a circumferential surface of each nanowire of the plurality of nanowires is coated with an insulating layer. For example, in an embodiment, the insulating layer can be a dielectric material. In another embodiment, the insulating layer can be an oxide. Each nanowire can be oxidized to form the insulating layer. In an embodiment, each oxidized nanowire can be annealed. For example, each oxidized nanowire can be annealed in an $H_2$ environment to passivate dangling bonds at the interface of an oxidized layer and a non-oxidized portion of each oxidized nanowire. For example, silicon nanowires can be oxidized to create an oxide layer of $SiO_2$. In another example, a nanowire formed from a compound semiconductor material can be oxidized in oxygen or oxygen combination that is conducive to forming an oxide on the material. For instance, GaAs nanowires could be oxidized in an oxygen and arsenic environment to create an oxide layer, such as a layer of $As_2O_3$. Other compound semiconductor materials can be similarly oxidized, or oxidized in other manners.

FIG. 33 shows another flowchart, flowchart 3300, providing example steps for fabricating nanowires having reduced surface scattering, according to an example embodiment of the present invention. Other structural and operational embodiments will be apparent to persons skilled in the relevant art(s) based on the following discussion. These steps are described in detail below.

Flowchart 3300 begins with step 3302. In step 3302, a semiconductor material is selected. Any semiconductor material, including those described elsewhere herein, or otherwise known, can be selected.

In step 3304, a plurality of nanowires are formed from the selected semiconductor material. For example, the nanowires can be grown or otherwise formed from the selected semiconductor material.

In step 3306, each nanowire of the plurality of nanowires is doped so that each nanowire comprises a core-shell structure, wherein the shell is a doped outer layer of each nanowire surrounding a respective core of each nanowire. For example, the nanowire is nanowire 310, shown in FIG. 3B. The doped outer layer is doped surface layer 302. In an embodiment, an effect of step 3306 is to cause carriers of each nanowire to be substantially confined to the axially-located core during operation.

In an embodiment, step 3306 can include the step where a dopant material is selected for the doped outer layer of each nanowire such that the doped outer layer would have a higher energy level relative to an energy level of the respective core.

In an embodiment, step 3306 can include the step where a dopant material is selected for the doped outer layer so that a lattice structure of the doped outer layer substantially matches a lattice structure of the core.

Nanowire And Nanoribbon Thin Film Transistors

FIGS. 34A-34C illustrate concepts related to high mobility nanowire and nanoribbon TFTs. FIG. 34A represents amorphous (a-Si) or polycrystalline Si (poly-Si) TFTs. As can be seen from the FIG. 34A, electrical carriers have to travel across multiple grain boundaries resulting in low carrier mobility. FIG. 34B illustrates a NW-TFT, according to an embodiment of the present invention. Unlike a-Si or poly-Si TFTs in which carriers have to travel across multiple grain boundaries resulting in low mobility, NW-TFTs have conducting channels formed by multiple single crystal NW paths (like a log bridge) in parallel. Thus, electrons/holes travel within single crystals all the way between the source to drain electrodes, with high carrier mobility. Similarly, as depicted in FIG. 34C, according to an embodiment of the invention, single crystal semiconductor nanoribbons, which have characteristics similar to that of multiple nanowires in parallel, are also used to produce TFTs with high performance.

NW-TFT Device Fabrication

FIG. 35A illustrates a flowchart 3200 providing example steps for fabricating NW-TFTs, according to an embodiment of the invention. Other structural and operational embodiments will be apparent to persons skilled in the relevant art(s) based on the following discussion. These steps are described in detail below.

Flowchart 3500 begins with step 3510. In step 3510, single crystal nanowires are synthesized. For example, p-type silicon nanowires with controlled diameters can be synthesized by decomposition of $SiH_4$ and $B_2H_6$ using gold colloid particles (available through British Biocell International Ltd., for example) as the catalyst in a pilot production scale reactor. In an example embodiment, the growth can be carried out at a temperature between 420-480EC, with a total pressure of 30 torr, and a silane partial pressure of approximately 2 torr, for a period of 40 minutes. The $SiH_4$ and $B_2H_6$ ratio can be varied to control the doping level. A ratio of 6400:1 is used in synthesizing nanowires for which measurements are provided below, although other ratios can be used. In an example application of step 3510, nanowires synthesized by this process had lengths in the range of 20-40 μm, with a nearly mono-dispersed diameter as determined by the Au colloid catalytic particle. In the current example application, the nanowires were synthesized to have a core shell structure with a single crystalline silicon core surrounded by an amorphous silicon oxide shell of thickness 2-3 nm.

In step 3520, the nanowires are suspended in solution. In an example embodiment, the synthesized nanowires can be transferred into ethanol using ultra-sonication to obtain a stable nanowire suspension. Alternatively, nanowires can be transferred into, and suspended in other suitable solution types.

In step 3530, the nanowires are assembled into a thin film. In the present example, after being dispersed into solution, the nanowires were assembled onto a chosen substrate using a fluidic flow directed alignment method to obtain an oriented nanowire thin film. The nanowire suspension was allowed to pass through a fluidic channel structure formed between a poly-dimethylsiloxane (PDMS) mold and a flat substrate surface to obtain NW arrays on the surface. The average NW space in the thin film was controlled by varying the NW concentration in the solution and/or the total flow time. With this approach, the alignment can be readily extended over a 4-inch wafer or even larger areas by using a longer or larger flow channel mold. An example such fluidic channel structure is described above, as flow mask 1500 shown in FIGS. 15A and 15B.

FIG. 35B shows an optical micrograph of an example nanowire thin having a single layer of nanowires oriented in parallel, with an average nanowire spacing of about 500-1000 nm. The micrograph of FIG. 35B further shows that a few nanowires cross over the top of the nanowire thin film, although in alternative embodiments, thin films can be created with no nanowires crossing over the top of the nanowire thin film. The scale bar illustrated in FIG. 35B is 100 µm in length. An inset 3502 within FIG. 35B provides higher magnification and includes a scale bar of 20 µm.

In step 3540, a thin film transistor device is fabricated. The thin film transistor device incorporates the nanowire thin film created in step 3530. Any type of thin film transistor device can be fabricated.

In step 3550, thin film transistor devices are integrated for the particular macroelectronic application. In an example embodiment, a NW thin film can be subjected to standard photolithography or E-beam lithography processes to define source and drain electrodes and yield TFTs on a macroelectronic substrate.

FIG. 35C illustrates an example TFT, where the scale bar is 100 µm. Different materials can be used for electrodes, including gold electrodes, which are shown for the example TFT device in FIG. 35C as light colored bars. For the example TFT 3504 shown inset in FIG. 35C, a back-gated device configuration on a silicon substrate is shown. Underlying silicon is used as the back gate, silicon nitride ($SiN_x$) 100 nm thick is used as the gate dielectric, and a Ti/Au (60 nm/60 nm) film deposited using an e-beam evaporator is used as the source and drain electrodes.

FIG. 35D provides an optical micrograph of a NW-TFT that shows parallel arrays of NWs bridging the source and drain electrodes 3506 and 3508. The scale bar in FIG. 35D is 5 µm in length.

Step 3560 is the end of flowchart 3500.

Performance Characteristics—P-Channel Silicon Nanowire Thin Film Transistors (NW-TFT)

In the following example, electric characterization of NW-TFTs was carried out in an air environment, in a dark box, at room temperature. FIG. 36A shows a plot of drain current ($I_{DS}$) versus drain-source bias voltage ($V_{DS}$) curves at various gate voltages ($V_{GS}$), which are varied in steps of 1 volt (V), beginning with the upper curve having $V_{GS}$=−10V. In this example, the TFT consists of ninety-one substantially parallel 20 nm diameter nanowires, and has a 5 µm channel length. FIG. 36A shows typical p-channel transistor behavior operating in accumulation mode, as the drain current $I_{DS}$ increases linearly with $V_{DS}$ at low $V_{DS}$, and tends to saturate at higher $V_{DS}$. Upon application of negative gate voltages, the drain current increases as the majority carriers (holes) increase in the channel. Applying a positive gate bias depletes holes in the channel and turns the device off.

A plot of $I_{DS}$ versus $V_{GS}$, illustrated in FIG. 36B, at a constant $V_{DS}$=−1 V, shows that essentially no current flows when the gate voltage is more positive than a threshold point, and the $I_{DS}$ increases nearly linearly when the gate voltage increases in the negative direction. Linear extrapolation of the linear region results in a threshold voltage of 0.45 V. An inset plot 3602 shown within FIG. 36B shows—$I_{DS}$ versus $V_{GS}$ at $V_{DS}$=−1V in the exponential scale. FIG. 36B highlights an on-off ratio of nearly $10^8$, and a sub-threshold swing of about 500 mV/s. The linear plot data were collected at a $V_{GS}$ sweep rate of 500 mV/s, and the exponential plot data were collected at a $V_{GS}$ sweep rate of 15 mV/s to minimize capacitive charging currents at the higher gate voltages. The apparent threshold voltage in the inset is shifted to 3.5V due to a hysteresis effect.

A hysteresis effect is commonly observed in $I_{DS}$–$V_{GS}$ relation of the current for NW-TFTs. This hysteresis is likely primarily due to the mobile ions present in the NW-TFT devices. This hysteresis can be eliminated or minimized by stringent control of NW synthesis and device fabrication processes, to minimize ion contamination. The hysteresis has an effect in determining threshold voltages. Due to hysteresis, the apparent threshold voltage can vary depending on the measurement condition and the voltage history that the device experienced before measurements.

In order to minimize the threshold voltage variation caused by hysteresis, similar conditions were used (relatively quick gate voltage sweeping rate of 500 mV/s was used to minimize the mobile ion effect) to test devices. Voltage history variation was also minimized by first cycling the gate voltage (from 10 to −10V) at least three times before collecting data for each device. In this way, a justified threshold voltage distribution (FIG. 36B main plot and FIG. 36C) could be determined. On the other hand, to accurately measure off-state current, a slower gate voltage sweep rate (15 mV/s) to minimize the capacitance current was used. In this case, the device experienced high positive gate voltage for extended period of time (about 5-10 min) and shifted the apparent threshold to a more positive value (inset FIG. 36B).

For macroelectronic applications, a number of key transistor parameters, including transconductance, mobility, on/off current ratio, threshold voltage, and sub-threshold swing, dictate the TFT performance. A high transconductance is important to a transistor's performance, and to voltage gains of transistor-based devices, including amplifiers and logic circuits. The slope in the linear region of −$I_{DS}$ versus $V_{GS}$ shows a transconductance, $g_m$=$dI_{DS}/dV_{GS}$, of about 11 µS at $V_{DS}$=−1 V. Assuming the effective channel width equals to the NW diameter, d, multiplied by the number, N, of NWs: $W_{eff}$=N·d=1.8 µm. For comparison to a-Si TFTs and poly-Si TFTs, a normalized transconductance of about 6 µS/µm can be obtained. This is significantly better than that of amorphous-Si TFTs, which have transconductances of about 0.01 µS/µm, and of p-channel poly-Si TFTs, which have transconductances of about 0.3 to 0.8 µS/µm. Furthermore, this is comparable to that of single crystal p-channel silicon-on-insulator (SOI) MOSFETs, which have transconductances of about 5 to 12 µS/µm. Note that the NW TFT transconductance can further be improved using thinner dielectrics of higher dielectric constants.

Additional modeling using standard MOSFET equations was conducted to further estimate the carrier mobility in the NW-TFT under study. In the low-bias linear region of $I_{DS}$–$V_{DS}$ curves, the hole mobility $\mu_h$ can be deduced from:

$$G_{DS}=I_{DS}/V_{DS}=\mu_h C_G(V_{GS}-V_{th}-V_{DS}/2)/L^2,$$

Where:
$C_G$ is the gate capacitance, and
L is the channel length.

The gate capacitance includes the capacitance of the SiNx dielectric on the substrate and that of the silicon oxide shell. It is, however, nontrivial to calculate these capacitances. Simulation using a 3D finite element package (e.g., Metamesh and HiPhi from Field Precision, http://www.field-p.com) yields a total capacitance of about 27 fF, leading to a hole-mobility about 130 cm$^2$/V·s. This hole-mobility is higher than the best value reported for p-type polysilicon (about 120 cm$^2$/V·s) and comparable to that of p-type single crystal silicon material, such as SOI MOSFET (about 180-250 cm$^2$/V·s). In addition, it is possible that the carrier mobility can be further improved, for example, by decreasing the doping level and/or minimizing the trapping states on NW surface.

Inset 3602 in FIG. 36B shows a plot of the $I_{DS}$-$V_{GS}$ curve in the exponential scale, showing that the drain current decreases exponentially below the threshold voltage and that the transistor has an on-off current ratio close to $10^8$. This represents the largest on-off ratio reported for transistors assembled from chemically-synthesized nanomaterials and is comparable to that of single crystal silicon devices. The exponential decrease in current defines a key transistor parameter, the sub-threshold swing $S=-dV_{GS}/d\ln|I_{DS}|$, to be about 600 mV/decade in this device. In conventional MOSFETs, S is determined by $S=(k_BT/e)\cdot Ln\{(10)(1+\alpha)\}$ where T is temperature, $k_B$ is Boltzmann's constant, e is elementary charge, and $\alpha$ depends on capacitances in the devices and is 0 when the gate capacitance is much larger than other capacitances such as interface trap state capacitance. The lowest theoretical limit for S is therefore $S=(k_BT/e)\cdot Ln(10)$, or about 60 mV/decade at room temperature.

In general, a small sub-threshold swing is desired for low threshold voltage and low-power operation. A sub-threshold swing of about 600 mV/decade in an embodiment of the NW device of the present invention is significantly better than conventional amorphous Si TFTs or organic semiconductor TFTs, which typically range from one to many volts per decade. Furthermore, this is comparable to most poly-Si TFTs, but is substantially larger than the best poly-Si TFT (about 200 mV) and single crystal silicon devices (about 70 mV).

The relatively large sub-threshold swing observed the NW device of the invention is likely mainly due to the existence of surface trapping states and a geometric effect, which can be improved dramatically by passivating the surface (e.g., hydrogenation or using a core-shell structure) and/or using top- or surrounding-gated structure with high-k dielectrics.

A geometric effect results from NWs crossing over other NWs in the NW-TFT. The NW thin film typically consists of a near monolayer of NWs, but occasionally a few NWs cross over other NWs. When a NW crosses over other NWs, it is separated from the substrate surface, experiences a smaller electrical field from the back gate, and thus turns on or off more slowly than other NWs in the device. This increases the sub-threshold swing of the NW-TFT as a whole. Nonetheless, and importantly, a sub-threshold swing as small as about 70 mV/decade has been demonstrated using a surrounding conformal electrolyte gate, as discussed below.

In practical applications, the variability in threshold voltage from device to device is a key factor in determining the viability of a technology. To this end, tests have been conducted on 20 individual devices that were fabricated according to an embodiment of the invention. FIG. 36C shows a histogram of the threshold voltage distribution of these devices. Gaussian fitting shows a standard deviation of only 0.22V. Additionally, optimization of the configuration and fabrication process is likely to lead to tighter distributions.

Specifically, the performance of NW-TFTs can be further improved in a number of ways by exploiting various NW core-shell structures. First, in NW-TFTs on plastic, the on-off ratio is limited by the low-quality e-beam evaporated $AlO_x$ gate dielectrics. This problem can be potentially overcome by using a core-shell NW structure consisting of a single crystal semiconductor core and a high quality gate dielectric shell. Although Si NWs naturally have a core-shell structure, the thin native oxide layer is not high enough quality to withstand a high electric field. The native oxide can be replaced or supplemented with a high quality silicon oxide shell generated by either controlled thermal oxidation, chemical vapor deposition, or other suitable technique. Core-shell NW structures are very well suited for making high performance NW-TFTs on plastic becasue high temperature processes, including semiconductor material synthesis and high quality gate dielectric formation, are performed separate from the final device substrate. In addition, such a core-shell structure can also lead to passivation of surface trapping states, resulting in further performance enhancement.

Second, the current back-gated NW-TFTs are relatively limited in performance due to a geometrical effect. Such a geometrical effect can be overcome by using a more complex NW core-shell structure to include a core of single crystal semiconductor, an inner-shell of gate dielectric, and an outer-shell of conformal gate. This can be realized by depositing a layer of highly-doped amorphous silicon around the $Si/SiO_x$ core-shell structure (described above) as the outer-gate shell, for example.

Third, the performance of NW-TFFs can potentially be further improved to exceed that of single crystal materials by exploiting the quantum electronic effect in small diameter NWs. In analogy to conventional two dimensional semiconductor superlattices and 2D electron/hole gas, multi-core-shell NW structure can be envisioned to separate the dopants from the active conducting channel to achieve ultra-high mobility TFTs.

Major parameters of device performance (such as carrier mobility and threshold voltage) are independent of the number of NWs in the conducting channel. Thus, the design and fabrication of NW-TFTs with pre-defined characteristics are possible. For example, by varying the number of NWs in the conducting channel (changing effective channel width), NW-TFTs can be designed and fabricated to carry current at a predetermined level. FIG. 36D illustrates the linear-scale relation for the drain current when the device is turned on ($V_{gs}=-10V$). The two curves show the on-state current as a function of effective channel width. The lower curve has $V_{DS}=-1V$ and the upper curve as $V_{DS}=-8V$. The effective channel width corresponds to the product of the average diameters of the NWs and the number of NWs in the channel. As expected, the on-state current scales linearly with the effective channel width (number of NWs in conducting channel). An on-state current of more than 0.5 mA has been achieved from a device with an effective channel width less than 5 μm. Reproducible and predictable assembly of NW-TFTs with designed device parameters is important.

NW-TFTs On Plastics

One important aspect of the current NW thin film concept is that the entire NW-TFT fabrication process can be performed essentially at room temperature, except for the NW synthesis step, which is separate from the device fabrication. Therefore, the assembly of high performance NW-TFTs can be readily applied to low cost glass and plastic substrates. To demonstrate NW-TFTs on plastic substrates, a different device configuration is used. FIG. 37A illustrates the device configuration. To fabricate the device of FIG. 37A, a layer of 1-2 μm thick SU-8 (MicroChem Corp.) photo-resist is first spin cast and cured on a polyetheretherketon (PEEK) sheet (50 or 100 μm thick, Goodfellow Inc.) to ensure a microscopically smooth surface. Cr/Au (10/30 nm) strips are defined as the gate arrays, and a 30 nm layer of aluminum oxide is deposited as gate dielectric using e-beam evaporation. The aligned NW thin film is deposited on the surface, and Ti/Au (60/80 nm) source-drain electrodes are defined to form the TFTs. FIG. 37B shows example plastic devices with NW-TFTs. The lower portion of FIG. 37B illustrates the source, gate, and drain of the NW-TFT with a scale bar equal to 5 µm.

Electrical transport characterization was performed in the same way as described above. FIG. 37C illustrates that the $I_{DS}$-$V_{DS}$ curves show a similar behavior to that of devices on $SiN_x$/Si substrate. The plot of FIG. 37C shows an $I_{DS}$-$V_{DS}$ relationship, with variable $V_{GS}$, starting from the top at $V_{GS}$=-8V and increasing in the steps of 1V. The $I_{DS}$-$V_{GS}$ relationship shows a threshold voltage of about 3.0V, and an on-off ratio>$10^5$.

FIG. 37D illustrates transfer characteristics of the same device before and after slight flexing of the plastic substrate. An inset 3702 of FIG. 37D highlights an on-off ratio of more than $10^5$ and a sub-threshold swing of 500-800 mV/decade. The device under test had 17 NWs of 40 nm diameter in parallel with a 6 µm channel length and a 3 µm gate length. The two curves show transfer characteristics for the same device before and after slight flexing of the plastic substrate (radius of curvature of about 55 nm), demonstrating the mechanical flexibility of NW TFTs on plastics.

A relatively smaller on-off ratio (compared to that of the devices on $SiN_x$/Si substrates) is due to: (1) lower on-current due to un-optimized local-gate device configuration, (2) higher off-current limited by gate leakage current caused by the low-quality of e-beam evaporated $AlO_x$ dielectrics; and can be significantly increased with improved device configuration and an advanced core-shell NW structure.

The reduced sub-threshold swing primarily results from two factors. First, the electrolyte solution makes an excellent conformal gate and therefore eliminates or reduces any geometrical effect that broadens the sub-threshold swing. Second, with an electrolyte solution conformal gate, the gate capacitance is more than one order of magnitude larger than that of back gated devices (about 0.77 pF versus about 0.05 pF for a device of about 160 NWs). Therefore, the relative importance of other capacitance is reduced as compared to gate capacitance, leading to a dramatic decrease of a value in $S=(k_BT/e)Ln(10)(1+\alpha)$, and consequently a decrease of sub-threshold swing S.

A major motivation driving plastic-electronic research is mechanical flexibility. Importantly, a slight flexing of the plastic with NW-TFT device does not significantly change device behavior. As discussed above, FIG. 37D provides two curves that illustrate this feature. As illustrated in FIG. 37C, the linear region in the $I_{DS}$-$V_{GS}$ relation gives a transconductance of 0.45 µS at $V_{DS}$=-1V. However, it is difficult to estimate an exact hole-mobility in a device because of difficulties in estimating a gate capacitance in the local-gated device configuration.

In order to gauge carrier mobility and ultimate device performance of NW-TFTs on plastics, an electrolyte gated TFT structure has been tested. FIG. 38A illustrates an electrolyte gated NW-TFT structure that was tested. This approach was used to study individual carbon nanotube FETs. The testing approach entailed the following steps. A small drop of 1 mM salt solution was placed on a TFT device on a plastic substrate, covering the whole TFT device including the source, drain electrode, NW thin film and an additional isolated gold electrode. A voltage $V_{GS}$ was applied to the isolated gold electrode to establish an electrochemical potential in the electrolyte relative to the NW-TFT device. For a voltage range of less than ±0.9V, the leakage current between electrolyte solution and the source, drain electrodes or NWs was negligible. The electrolyte functions as a well insulated liquid gate. Of particular merit, the electrolyte solution makes a useful surrounding conformal gate for all the NWs in the TFT channel, reducing or eliminating undesirable geometric effects and surface charges, thus providing an effective configuration to test the ultimate performance of the NW-TFTs.

FIG. 38B shows a $I_{DS}$-$V_{DS}$ relationship as a function of various electrolyte solution gate voltages in steps of 0.1 V, beginning with the top curve having $V_{GS}$=-0.9V. The NW-TFT tested included 162 20 nm diameter NWs in parallel with a 5 µm channel length.

FIG. 38C shows an $I_{DS}$-$V_{GS}$ relationship for a $V_{DS}$ of 10 mV. The overall results resemble those of TFTs fabricated on silicon substrates as described above. Notably, however, in this device the drain current $I_{DS}$ is much more responsive to changes in the electrolyte gate voltage. The sub-threshold swing is also significantly reduced (70-110 mV/decade), as shown in inset 3802 of FIG. 38C. The $I_{DS}$-$V_{GS}$ relationship was determined with a lock-in amplifier (available through Stanford Research, for example). A 10-Hz sine wave at 10-mV RMS amplitude was used for the measurement.

In addition, the particular architecture of the solution gating experiment can underestimate the performance of an ideal device, since the source and drain electrode are also in contact with the solution. The source and drain potentials can affect the actual solution potential and compromise the electrochemical potential established by the gate electrode, decreasing the actual applied potential around the NWs to below that applied to the gate electrode. Therefore, with an improved approach (e.g., using standard reference electrode) to establish the gate potential, it is possible to achieve even smaller sub-threshold swings. Together, the results demonstrate the potential for high performance TFTs on plastics, which can be improved by further optimizing the gate configuration of these devices (e.g., a solid state surrounding conformal gate can be achieved in a multi-core-shell NW structure consisting of single crystalline semiconductor core, inner-shells of gate dielectrics and outer-shell of conformal gates).

The performance of the electrolyte gated TFT device on plastics was further analyzed by examining various characteristics of device features. The gate capacitance was first examined. A total capacitance, in this case, includes the series capacitance of the electrolyte solution and the capacitance of the NW shell oxide, although the former can be ignored since it is much larger than the later. NWs having a single crystalline core of 20 nm and an average of approximately 2.5 nm amorphous silicon oxide shell were considered. The gate capacitance can be estimated by $C_G=2N\pi\epsilon\epsilon_0L/\ln((1+t_{ox}/r)$, where N is the number of NWs in the channel, $\epsilon$ and $t_{ox}$ are a dielectric constant and a thickness of the amorphous oxide respectively, and r is a radius of the NWs. Based on the calculated capacitance and the following expression $G_{DS}=I_{DS}/V_{DS}=\mu_h C_G(V_{GS}-V_{th}-V_{DS}/2)/L^2$, the hole mobility, $\mu_h$, can be determined to be about 150 cm$^2$/V·S. This result agrees with the mobility obtained for similar devices on $SiN_x$/Si substrate having similar NWs. This shows that the mobility of the NW-TFT is intrinsic to the NWs themselves, and not dramatically affected by the plastic substrate or the electrolyte gate.

N-Channel CdS Nanoribbon TFT

The above discussion demonstrates that high performance NW-TFFs can be assembled on low temperature plastic substrates from p-type Si NWs. Furthermore, since NW synthesis is independent of the final device substrate, a broad range of materials including III-V and II-VI group semiconductors can be exploited as the TFT channel materials, creating a broad range of opportunities. As one example, high performance TFTs can also be readily assembled from II-VI group cadmium sulfide (CdS) nanoribbons. CdS is an excellent material for optical as well as electronic applications due to its intrinsically low surface trapping states. Single crystal CdS nanoribbons with a thickness of 30-150 nm, width of 0.5-5 µm, and length up to 10-200 µm were synthesized using a vacuum vapor transport method.

Specifically, a small amount of CdS powder (about 100 mg) was transferred into one end of a vacuum tube and sealed. The vacuum tube was heated such that the end with CdS powder was maintained at 900° C., while the other end of the vacuum tube was kept at a temperature about 50° C. lower. Within two hours, most of the CdS was transported to the cooler end and deposited on the tube wall. The resulting materials are predominantly nanoribbons having thicknesses of 30-150 nm, widths of 0.5-5 µm, and lengths of 10-200 µm. TEM images show these nanoribbons are single crystals with low defects all the way to the edge surface.

Nanoribbons are useful for TFTs since their unique physical morphology closely resembles that of conventional single crystal thin film. CdS nanoribbon TFTs with a single-crystal conducting channel were fabricated using an approach similar to that described above. FIG. 39A illustrates a CdS nanoribbon TFT. The inset 3902 of FIG. 39A shows a 3D atomic force microscopic topographic image of a nanoribbon TFT.

Electrical transport measurements for the CdS nanoribbon TFT show typical n-channel transistor characteristics. The n-channel behavior is consistent with previous studies on CdS bulk materials and NWs. FIG. 39B provides the $I_{DS}$-$V_{DS}$ relation at different gate voltages for a CdS nanoribbon TFT. FIG. 39B shows a linear region at low source to drain biases and saturates at a higher bias. The $I_{DS}$-$V_{GS}$ relation at a $V_{DS}$ of 1 V shows nearly linear behavior above a threshold $V_{GS}$ of 2.0V. The slope in the linear region gives a transconductance of about 2.4 µS/µm at $V_{DS}$=1V. Assuming a parallel plate model, the gate capacitance was calculated to be 1.9 fF using $C_G = \epsilon \epsilon_0 L \cdot W/h$, where L and W are channel length and width, and h is the dielectric thickness. With the calculated capacitance, an electron mobility can be deduced to be about 300 cm$^2$/V·s using $I_{DS}/V_{DS}=\mu_e C_G (V_{GS}-V_{th}-V_{DS}/2)/L^2$. Importantly, this mobility value matches closely with that of single crystal CdS material (about 300-350 cm$^2$/V·s).

Furthermore, the exponential plot of $I_{DS}$-$V_{GS}$ gives an on-off ratio greater than 10$^7$ and a sub-threshold swing, S, as small as 70 mV/decade, as illustrated in FIG. 39C and its inset, approaching the theoretical limit of 60 mV/decade. The high carrier mobility and small sub-threshold swing observed in CdS nanoribbon TFTs can be largely attributed to high crystalline quality and the low-surface states in these materials as well as the absence of geometrical effects like that in Si NW-TFT.

Complementary Logic

The ability to fabricate both p- and n-channel TFTs is critical to construct complementary electronics that are known to be superior in performance to circuits consisting of unipolar p- or n-channel transistors. To this end, a complementary inverter (a logical NOT gate) was constructed by connecting an n-channel and a p-channel TFT in series. The complementary inverter was formed by connecting a p-channel Si NW-TFT (consisting of 15 NWs in parallel) and n-channel CdS nanoribbon TFT in series. The device 4002 is illustrated in FIG. 40. FIG. 40 also provides the output-input ($V_{out}$-$V_{in}$) voltage response of the inverter, and shows constant high voltage output with low input. When the input is increased to about 1.5 V, the output quickly turns to 0 V and maintains a low state at higher input voltages. Most significantly, the complementary inverter exhibits a high voltage gain. Differentiation of the measured $V_{out}$-$V_{in}$ relation reveals a voltage gain as large as 27, as illustrated as inset 4004 in FIG. 40. Such a large gain demonstrates high performance of our devices and will be critical for interconnection of arrays of logic circuits for a variety of large area electronic applications without the need for signal restoration at each stage. Lastly, it should be noted that $V_{out}$-$V_{in}$ relation of the inverter was measured without any load on the output. The gain may decrease when the device is loaded in an actual circuit. However, with careful device/circuit design, the desired voltage gain in practical applications should be attainable, considering the reproducibility and predictability of the NW-TFT devices described herein with characteristics, such as those shown in FIGS. 36A-D.

NW-TFTs in Display and Other Applications

Over the last twenty years, Flat-panel displays (FPDs) have become more commonplace in modern electronic devices. FPDs are indispensable in many new products, including cellular phone, personal digit assistant, digit camera, camcorder, and notebook computer. In addition, the market is expected to expanding significantly since FLD is poised to replace desktop computer and television (TV) cathode ray tube (CRT) monitors. Active matrix liquid crystal display (AMLCD) is the dominant commercial flat-panel display technology, dominating nearly the entire large area flat-panel display market. AMLCD is also sometimes referred to as active matrix thin film transistors (AMTFTs) because large area thin film transistors are the key technology which enable today's AMLCD.

The thin film transistor (TFT) was invented 13 years before the point contact junction transistor. The first US patent on the TFT was issued to Lilienfield in 1933. As late as earlier of 1960's, many industrial research lab, including GE, RCA, IBM, Zenith, Westinghouse and Philips, were actively engaged in TFT research and development. However, at around the middle of 1960's, metal-oxide semiconductor field effect transistor (MOSFET) came along, and became the focal point. Soon, most industrial laboratories dropped TFT research and development. Because the majority of today's semiconductor technologies, including MOSFET technology, are single-crystal wafer based, the size of a substrate is determined by the size of wafers available. To date, the biggest wafer available is ~12". Hence, this substrate size is probably not suitable for applications that require large substrate areas.

The emergence of liquid crystal displays (LCDs), in particularly, AMLCDs, in the middle of 1980's, which require driving circuitry to be located on a large glass substrate, renewed the interest in the TFT technology. Earlier efforts of the TFT were focused on II-VI semiconductor materials. The technology never went beyond the research lab due to difficulties in control of the II-VI semiconductor materials. For example, in general it is more difficult to make crystallized phase of a compound semiconductor than that of an element. Furthermore, the doping of II-VI materials, such as CdSe, is difficult. It was also very difficult to deposit reliable dielectric materials on II-VI materials.

At the same time, hydrogenated amorphous silicon (a-Si:H) thin film has attracted great attention due to its potential application as a solar cell and as imaging sensor materials. A turning point came in 1975, when W. E. Spear and P. G. LeComber demonstrated that amorphous silicon material could be doped. Very soon, TFT based on a-Si:H became the choice for driver elements of AMLED despite poor transistor properties. The technology is almost exclusively used in today's large screen commercial AMLCD displays. In a AMLCD display, the a-Si TFTs are fabricated on a glass substrate underneath the LCD pixels, and are used as switches to turn pixels on/off upon receiving the command from a integrated circuit (IC) driving circuit. The IC driving circuit is mounted on the periphery of the substrate. The a-Si thin films can be easily deposited on relatively large glass substrates at low temperature using plasma assisted chemical vapor deposition methods. The low deposition temperature makes using cheap glass substrate possible. The glass substrate is a necessity because of transparency of the substrate is a must for the back-site illumination technique of the technology.

The field effect mobility of a typical a-Si FET is around ~1 $cm^2/V \cdot s$, which limits the performance of the display. Extensive effort has been devoted worldwide towards improving the performance of a-Si TFT by crystallizing a-Si into polycrystalline thin film. The field effect mobility of polysilicon TFT lies in between that of a-Si TFTs and single crystal silicon transistors, with values up to several hundreds reported. Current polycrystalline processes typically require annealing a-Si at 600° C. for up to 24 hrs in order to produce transistors with a mobility of 10-50 $cm^2/Vs$. In addition to direct thermal annealing, several methods, including rapid thermal annealing, laser induced crystallization, and transition metal induced annealing have been explored to convert a-Si film to polycrystalline. The rapid thermal annealing uses higher temperatures, from 700° C. to 800° C., for very shot periods of time. The short time duration minimizes potential damage to the substrate. However, it is unlikely that inexpensive glass substrates can be used for this process. Laser annealing allows small areas of amorphous silicon to be heated up to very high temperature rapidly without significantly heating the substrate. Unfortunately, due to a small beam size, the method is very inefficient for large scale production. Additionally, the process is very difficult to control.

Metal induced crystallization has attracted great attention recently. Nickel based processes appear to be promising. In general, a nickel based process reduces the annealing temperature required for a slow thermal process from approximately 600° C. to between 500° C. and 550° C., with a duration of annealing reduced from ~24 hrs to a few hours. However, metal induced crystallization requires an extra step of the transition metal deposition on the top of the a-Si. Crystallization is dependent of the quality of metal film. Residue metal, metal silicides and structural defects of complicate grain boundaries can result in high leakage current in transistors.

Poly TFT is not likely to replace a-Si technology soon because there is still no viable polysilicon process that is compatible with inexpensive glass substrates. The performance of polysilicon TFTs is not likely to soon approach those of devices fabricated from traditional single crystal silicon because of the grain boundary conduction and difficulty in the preparation high quality polysilicon. Therefore, the currently available TFT technologies based on a-Si or p-Si are limited from various perspectives.

Recently a new thin film transistor technology—organic TFT—has attracted much attention. Organic TFTs with field effect mobility up to ~1 $cm^2/V \cdot s$ have been demonstrated. By its nature, organic transistors are compatible with low temperature processes on a plastic substrate, although most of work has been carried out using glass or oxide coated silicon as the substrate. Unfortunately, however, the performance of organic transistors does not currently approach that of silicon. Hence, the area for application of organic based transistors is limited. Attempts to place silicon on plastics has not yet yielded satisfactory results, mainly because the required temperature of two key steps, silicon deposition and gate dielectric materials deposition, even for fabrication of amorphous silicon transistors, is too high for plastic substrates with the highest glass transition temperature to date to withstand.

A recent breakthrough in Prof. Charles Lieber's lab at Harvard University, carried out substantially by the principal investigator of this program, Dr. xiangfeng Duan, have shown that semiconductor nanowires are excellent or ideal building blocks for nanoscale electronics and optoelectronics. Prof. Lieber's lab have demonstrated that a wide range of group IV, III-V and II-VI semiconductor nanowires can be rationally synthesized in single crystal form with controlled and tunable chemical composition, physical dimension (e.g., diameter and length), and electronic properties (e.g., doping type and concentration). The diameter of the nanowires can be controlled and varied in the range of 2-100 nm. The lengths of the nanowires usually range from 10-100 μm (FIG. 41).

FIG. 41A shows a scanning electron microscope image of synthesized silicon nanowires, according to an example embodiment of the present invention. The nanowires of FIG. 41A have diameters on the order of ten nanometers, and length extending up to tens of micrometers. The scale bar shown in FIG. 41A is 5 μm in length. FIG. 41B shows a lattice-resolved transmission electron microscope image of individual Si nanowires, according to an example embodiment of the present invention. The example nanowires of FIG. 41B have a single crystalline core with continuous lattice along their whole length, and an amorphous oxide over-layer, which can be controlled synthetically.

The extended longitudinal dimension and reduced lateral dimension makes the nanowires the smallest dimension materials for efficient transport of electrical carriers. In addition, the nanowires can be flexibly manipulated in solution and assembled onto substrate using a electric field or microfluidic flow approach, and thus enabled the demonstration of a variety of nanoscale electronic and optoelectronic devices and device arrays, including single nanowire field effect transistors (FETs), crossed nanowire FET, and a series of logic circuits such as logic OR, AND, NOT, NOR gates, and logic half adder circuits and memory arrays, as well as light emitting diodes, photodetector and highly sensitive chemical/biological sensors.

In particular, studies on single nanowire FET has demonstrated field effect mobility up to 1500 $cm^2/V \cdot s$ for Si nanowires, ~1000 $cm^2/V \cdot s$ for GaN nanowires and ~4000 $cm^2/V \cdot s$ for n-type InP nanowires, all comparable or superior to their single crystal counterparts with a similar doping concentration. The high mobility value observed in the nanowire materials highlights the high quality of this new class of materials. In addition, these observed mobility values are believed to represent only a low value for the nanowire materials because little attention has been paid to the surface passivation etc., and recent studies showed the mobility value can be significantly increased by passivating the nanowire surface. Studies suggest that the scattering events can be significantly suppressed due the quantum mechanical properties in a modulated doped one-dimensional wire. For example, theoretical calculations have predicted mobility of $3 \times 10^8$ $cm^2/V \cdot s$ for selectively doped GaAs nanowires. Thus it is possible to achieve extremely high carrier mobility if the dopants are separated from the conducting channel (e.g., molecular doping from the surface of the nanowires or doping from the shell in a core-shell nanowire structure).

In summary, nanowires represent a building block for high mobility thin film transistors. A randomly oriented nanowire thin film has carrier mobility comparable to polycrystalline thin film materials, and an oriented nanowire thin film exhibits mobility value comparable or superior to single crystal materials.

TFTs are critical to the development of many modern electronic technologies. Currently, research and development on TFTs is driven by flat-panel display (FPD) market, dominated by active matrix liquid crystal displays (AMLCD). A new TFT technology—true silicon on cheap large area glass or plastic substrates could revolutionize current FPD technology, and open the door for new industries producing new types of electronic devices. TFTs incorporating nanowire thin films, according to the present invention, makes these previously unattainable goals possible.

Described herein are thin film transistors (TFTs) based on oriented semiconductor nanowires, and formed on inexpensive glass or flexible plastic substrates, having performance comparable to that of transistors fabricated from single crystal silicon:

Field effect mobility: 1500 $cm^2/V \cdot s$.

$I_{on}/I_{off}$: $10^7$.

Threshold: <2.5 V.

Conventionally, nanomaterials are used to reduce the size of electronics. Embodiments of the present invention, however, use nanomaterials to make electronics faster and/or larger. Although the mobility of individual nanowires is high, a single nanowire is unlikely to be able to provide enough current-density required for macroelectronic applications. To take advantage of the high mobility of nanowires, transistors are fabricated from oriented nanowire thin films such that many nanowires, including hundreds or thousands of nanowires, span between electrodes (e.g., between source and drain electrodes). This enables high mobility and high current density transistors on large, flexible substrates.

FIG. 42 shows a flow diagram of a process for synthesizing and implementing high mobility nanowire thin film transistors, according to an example embodiment of the present invention. High quality single-crystal nanowire materials are synthesized at high temperature, and are then aligned on a desired substrate to form an oriented nanowire thin film. This can be further subjected to lithography processes to form thin film transistors with the conducting channel parallel to the wire axis. A single crystalline conducting channel along the nanowire length ensures high mobility for the resulted TFT.

In this approach, silicon nanowire core-shell structure with a single crystalline core and dielectric overcoating (shell) can be fabricated, such as shown in FIG. 43, according to an example embodiment of the present invention. The nanowires are first synthesized by using the recently developed gold nanoparticle catalyzed chemical vapor deposition (CVD) method and subsequent direct oxidation. The method is applicable to a variety of semiconductor nanowires including silicon (Si) and gallium arsenide (GaAs). Silicon nanowires are referred to herein for illustrative purposes. The chemically synthesized nanowires are suspended in a solvent, such as alcohol, allowing for subsequent process and manipulation. From these solution suspended nanowires, a monolayer nanowire thin film is prepared with wires oriented substantially in parallel on a substrate. Finally, metal contacts for source, drain and gate can be applied through photolithography process to yield nanowire TFT arrays with the conducting channel parallel to the wire axis.

The present invention provides a fundamentally new strategy towards high performance thin film transistors, and brings in a variety of technical innovations and process, performance advantages:

Single crystalline conduction channel: In the present TFT device, multiple nanowires reside in parallel all the way from source to drain (like a log bridge) to provide a single-crystal conducting channel for carriers. This leads to high carrier mobility comparable to bulk single crystal materials, which is impossible to achieve with amorphous or poly-silicon materials. This is largely due to extensive trapping states near the grain boundary which lead to significantly carrier depletion near boundary and grain boundary scattering for those materials (see FIGS. 44A-44C).

FIGS. 44A-44C shows views of thin film transistors (TFTs) fabricated from amorphous silicon (FIG. 44A), poly-silicon (FIG. 44B), and an aligned nanowire thin film (FIG. 44C). In both the a-Si and poly-Si based technologies, electrical carriers experience multiple grain boundary scattering and thus limit the achievable carrier mobility (~<1 $cm^2/V \cdot s$ for a-Si and <100 $cm^2/V \cdot s$ for poly-Si). On the other hand, in the nanowire based technology of the present invention, electrical carriers transport across the TFT channel along multiple single crystalline paths, and thus enable TFTs with carrier mobility approach single crystal materials (~1000 $cm^2/V \cdot s$).

Off-substrate high temperature process: Semiconductor nanowires and gate dielectrics are prepared off substrate at high temperature and are then applied to the substrate at room temperature. Therefore thermal properties of the substrates will not be a limiting factor for high temperature process. Thus, this allows for high quality crystalline material and gate dielectrics, which are critical for high performance reliable device function. In addition, by incorporating an extremely thin gate-dielectric shell around each individual nanowires, rather than a layer of extrinsic gate-oxide over the device, processing can be dramatically simplified, while reducing the required turn-on voltage due to the extremely thin and near-perfect nature of the shell.

Solution processibility: Unlike a bulk semiconductor wafer, nanowires can be suspended in solution and then deposited and secured onto virtually any substrate over a large area. Thus, high performance semiconductor materials on many technologically important substrate types (e.g., plastic, glass) are enabled. This further makes possible roll-to-roll production of high performance electronics via ink-jet or screening printing technology.

Mechanical flexibility: Due to an extremely small diameter and large aspect ratio (>1000), nanowires possess superior mechanical flexibility with a radius of curvature as small as 10 micrometer, for example. By depositing a dense film of mechanically flexible oriented nanowires onto a large, flexible substrate, the resulting structure has superior electronic performance comparable to a bulk single crystal semiconductor, and can extend over an arbitrarily large area and be as flexible as a fabric. In addition, the mechanical flexibility of nanowires enables formation of high performance electronics on relatively rough substrates, such as most plastics, where the use of amorphous or poly-silicon thin film is near impossible.

Miniaturized device dimension: The intrinsically small diameter and large length of the nanowires allows facile control of TFT channel width and length. Transistors can be achieved with reduced dimensions, which is limited in the case of polysilicon device. In addition, the intrinsic high mobility of nanowire materials allows transistors to be formed with reduced size, while still maintaining a functional current level, and allows high density integration on large area substrates that is not possible with traditional amorphous silicon or polysilicon materials.

Process applicable to other high mobility materials such as GaAs nanowires: The capabilities of silicon nanowires can be extended and applied to other intrinsically high mobility materials such as III-V group materials including GaAs and InAs nanowires. Thus ultra-high mobility materials are possible, and many novel applications are enabled. Even higher mobility is possible by taking advantages of potential quantum effect—ballistic conduction of nanowires, as further described elsewhere herein.

Nanowire synthesis: In some embodiments, nanowires with uniform physical dimension and chemical dopant distribution can be used to achieve reliable and reproducible TFT device behavior. Such control has been demonstrated in very small scale within a 1 inch tube furnace. 8-inch semiconductor tube furnaces exist that are capable of producing nanowires at large scale. Control of uniformity over the large volume is more difficult than over a smaller volume. The control diameters and diameter distributions of silicon nanowires are determined by the diameters and diameter distributions of gold colloids. Commercially available gold colloids can be used. The length of nanowires depends on the growth condition—temperature, vapor pressure and duration of growth. These issues, and issues of crystallinity and doping concentration, can be addressed by varying and fine tuning the growth conditions.

Dielectric oxide/nitride coating: The quality of a gate dielectric coating is important to nanowire TFT performance. The technology for formation of a high quality gate dielectric is present in planar semiconductor technology. However, forming a pin-hole free gate dielectrics with uniform thickness around the surface of nanowires without a defined crystallographic direction is technically challenging. This issue can be addressed from different perspectives. A process can be used to generate a uniform silicon oxide coating less than ~2 nm by slow thermal oxidation of silicon nanowires immediately following their growth. A key to controlling the quality of the oxide coating is nanowires having a smooth and consistent surface structure. A low oxidation process aids in avoiding hot spots and generating pin-hole free thin coatings. Alternatively, plasma assisted direct nitridation of silicon oxide coated nanowires can be used for generation of oxynitride or nitride coating on the nanowire surface.

Surface states and trapped charges: Due to its high surface and bulk atomic ratio, surface states, trapped charges and dangling bonds affect nanowires, which could significantly limit device performance. A number of strategies can be used to minimize the surface states, including direct thermal annealing under an inert atmosphere or under hydrogen/forming gas atmosphere, and annealing in hydrogen plasma, followed by a thermal annealing. These and other strategies are described in further detail above.

Large area nanowire thin film deposition: The development of a scalable approach for the preparation of oriented nanowire thin film on large area substrate is important to the eventual successful implementation of this new technology. For example, a flow alignment process or Langmuir-Blogette film approach can be used to place a monolayer of nanowires on a glass or a plastic substrate.

Ohmic contact: Making reliable Ohmic contacts with nanowires is difficult due to small contact areas and complicated interface states. Interface chemistry and physics between metal contacts and silicon are important technical areas regarding Ohmic contacts. A key to success is the precise control of the metallization process and surface cleaning process prior to metallization. Three possible metallization schemes can be used—Ti—Au, Ni and Al by e-beam evaporation. Various further processes, including ion gun cleaning, or HF etching can be employed to remove the surface dielectrics prior to metallization of source-drain electrodes.

The present invention allows for a revolutionary advance in large area electronics, and offers a new generation of electronic devices by providing a thin film TFT with performance comparable to inorganic single crystal semiconductor materials, as well as size and flexibility of plastic electronics.

TFT nanowire transistors can be manufactured with performance characteristics approaching those of transistors fabricated from traditional single crystal silicon, most significantly on very large glass or plastic substrates, which will enable ultra-large scale high density integration and provide a true silicon on the plastic technology. The potential applications of this technology is very broad, including incorporating nanowire TFTs into liquid crystal displays (LCD). A nanowire TFT has a much smaller foot-print than that of a-Si TFT, allowing for an increase in pixel density—e.g., a ultra-high density display. The smaller TFT also blocks less light and has a higher aperture ratio. With a nanowire TFT, periphery driver circuits can be simultaneously integrated on the edge of the glass substrate, significantly simplifying the fabrication process and lowering the cost. Nanowire TFT are applicable to microdisplays, digital projectors and high density imaging devices that require very high pixel densities. Furthermore, a true silicon-on-plastic technology enables development of light, high information density electronic devices. For example, the present invention enables computing and displaying on a single sheet, and enables wearable electronics, which can be especially important for police, emergency officers working in the field, soldiers in the battlefield and space and remote exploration.

In a broader sense, the present invention allows engineers to develop electronic materials with the performance and materials characteristics of any industrially-relevant semiconductor material on any substrate material. This technology enables engineers to design the functionalcharacteristics of an electronic material (i.e., the conductive properties, doping, mobility and turn-on-voltages) completely independently from the structural characteristics (i.e., its flexibility, shape, size and process characteristics). The selection of the physical characteristics of the semiconductor nanowire component (e.g., composition, diameter, length, crystallinity and density) determine the electronic performance; the nature of the substrate, which can be selected completely independently, the physical performance. Together, the high performance, easy processibility and potentially low-cost of nanowire thin film produces a versatile flexible electronics platform, and is useful not only for driving circuits for high-density display and micro-displayer array, radio frequency identification tags, large area biosensor but also for many new application such as smart cards, logic and memory for wearable computers on plastic and for many more important applications yet to be identified.

Three development stages are described as follows: (1) silicon nanowire synthesis; (2) oriented nanowire thin film deposition; and (3) nanowire thin film transistor (TFT) fabrication.

(1) Silicon Nanowire Synthesis

Step 1: A scalable process for silicon nanowire synthesis is described below.

An example nanowire suspension solution, nanowire type, and nanowire concentration is provided, for illustrative purposes: 1 mg/100 cc in alcohol, p and n-doped 60 nm diameter silicon nanowires, having a core-shell structure. The nanowire core is single-crystal silicon. The nanowire shell is ~2 nm thick pin-hole-free silicon oxide or oxynitride coating, length of ~20-50 μm.

The synthesis uses a gold nanoparticle catalyzed CVD process. A pre-determined precursor gas mixture, $SiH_4$ and $B_2H_6$ or $PH_3$ in He passes over the catalyst-gold particles deposited on an oxide coated silicon substrate at a total pressure between 20-50 Torr, while the gold nanoparticles are heated up to a temperature ~450° C. Upon contact with the gold nanoparticles, $SiH_4/B_2H_6$ is decomposed, and Si and B atoms diffuse into the gold nanoparticle and generate a liquid alloy droplet. Once an over-saturation is reached, Si/B atoms precipitate out and initiate a nanowire growth. Continuously supplied $SiH_4$ and $B_2H_6$ allows the nanowires to continue growing until intentionally terminated, or a "death" caused by local condition change. The quality of the nanowires is dependent on the quality of gold nanoparticles, control of gold nanoparticle distribution on the substrate and growth condition including temperature, ratio of $SiH_4$ to $B_2H_6$ or $PH_3$, partial pressure of the $SiH_4$, and resident time of precursor gases in the reactor.

In the current example embodiment, the growth is accomplished using a computer controlled 8" semiconductor furnace. A 4" silicon oxide coated silicon wafer is used as the substrate.

A process for uniformly deposition of gold nanoparticles on 4" wafers is described.

Commercially available 60 nanometer diameter gold colloids are used. The target is to achieve a uniform deposition of gold nanoparticle with density between 2-4 particles per micrometer sq. A key is minimized gold particle cluster formation. The clusters can result in undesired larger diameter nanowire growth. Spin coating and self assembly methods can be explored for the deposition.

Spin coating is a fairly straightforward process. A deposition density can be controlled through variation of the gold particle concentration in the precursor colloids, manipulation of surface chemistry of the silicon wafer and changing the spin speed. A drawback of spin coating can be low utilization efficiency of gold colloid solution. A recycling process in the production stage can be used if warranted.

Self assembly involves some use of established chemistry. The surface of 4" silicon oxide coated wafer is functionalized with either (3-aminopropyl)-trimethoxysilane (APTMS) or (3-mercaptopropyl)-trimethoxysilane (MPTMS), then contacted with 60 nanometer gold colloid solution. The gold particles are assembled on the surface. The difference between two different chemistries are compared, and the possibility of controlling the density of gold particles by control of the contact time and gold particle concentration in the contact solution may be used.

Step 2. Optimize nanowire growth condition: Growth parameters need to be optimized including ratio of $SiH_4$ to $B_2H_6$ or $PH_3$, partial pressures of $SiH_4$, and $B_2H_6$ or $PH_3$, total pressure, gas flow rate, growth temperature, and growth duration. The diameter distribution of silicon nanowires can be determined by that of gold nanoparticles. Commercially available 60 nanometer gold colloids can have a diameter distribution of ±10%. The same distribution is our target for the nanowires. Gold nanoparticles can be split into smaller ones resulting in smaller diameter nanowire growth, depending on the growth condition. The growth condition can be optimized to minimize this event. Given a growth condition, the length of nanowires can be controlled by varying duration of the growth. Crystallinity of silicon nanowires and dopant concentration are also growth condition dependent. They can be optimized and controlled together with other important nanowire characteristics.

Another issue is thermal decomposition of $SiH_4$ and $B_2H_6$ under the growth condition in order to grow high quality silicon nanowires. This decomposition can generate unwanted silicon nanoparticles in the product. In their small scale growth, the thermal decomposition can not easily be eliminated, but can be minimized by varying the condition of growth Step 3: Process for dielectric thin film coating: The quality of dielectric coating is a key factor in determining the performance of nanowire TFT. Methods and underpinning scientific principles for high quality dielectric coating have been well established for planner single crystal silicon, lately for amorphous and polysilicon. In general, methods can be categorized into direct oxidation/nitridation for silicon oxide/nitride dielectrics and CVD deposition for all kinds of dielectric coatings. A unique structural nature of silicon nanowires leads to selection of direct oxidation/nitridation over the deposition method. However, the deposition method can be used as an alternative.

A silicon dioxide thin coating with a thickness of ~2 nm can be used. The direct oxidation of 60 nanometer diameter silicon nanowires can carried in the nanowire growth furnace. After nanowire growth is terminated, the reactant gas mixture can be depleted from the reaction tube and replenished with a mixture of oxygen (5%) and helium at a temperature below 150° C. The temperature of the furnace can then be slowly raised to a number between 300° C. and 800° C. The oxidation temperature together with a ratio of oxygen to helium, partial pressure of oxygen, and duration of oxidation determines the thickness of silicon oxide generated. These conditions can be optimized until a thickness of ~2 nm is obtained. A slow oxidation is desired in order to minimize defects, dangling bonds, which can result in trapped charges and states.

If the performance of silicon oxide thin coating is unsatisfactory, direct nitridation of silicon oxide coated nanowires to generate oxynitride coating can be used. The higher dielectric constant made oxynitride and nitride a more attractive coating. A plasma assisted direct nitridation method using gases of NO or $NH_3$ can be used.

Step 4. Process for removing surface states and trapped charges: Surface states and trapped charge can be a serious issue for nanowires because of their high surface to bulk atom ratio. Processes for dealing with this issue are known in the semiconductor industry for planner processes, which are applicable to nanowires. First we can anneal in hydrogen, using a single nanowire device test as a feedback for condition optimization.

Step 5. Prepare the nanowire suspension in alcohol: After being coated with a dielectric coating and being annealed, silicon nanowires can be removed from the 4" (or other size) wafer and suspended in alcohol by ultrasonication. Nanowires may agglomerate and precipitate out. A surfactant like Triton X-100 can be used for stablization.

Step 6. Nanowire characterization: The structural and electric properties of nanowires can be characteized. SEM and AFM can be used for characterization of their length and diameter distribution, high resolution TEM for thickness and uniformity of dielectric thin film coating, transport measurement, EFM, scanning gate AFM for their electric properties. The results of characterization can be feed back for fine tuning of synthetic procedure and conditions.

(2) Oriented Nanowire Thin Film Deposition

A scalable method for oriented nanowire monolayer thin film deposition is described below.

Result: An oriented monolayer 60 nm silicon nanowire film on a 4"×4" glass or plastic, such as polystyrene.

Oriented nanowire arrays are critical to ensuring a single crystal conducting channel between source and drain of the nanowire TFT, which make high field effect mobility possible. To obtain a highly oriented nanowire thin film over a large area, two basic approaches can be used as parallel strategies, fluidic flow approach and Langmuir-Blodgett film approach.

Step 1. Generic chemistry for nanowire surface modification: The goal of this task is to develop a generic set of processes for modifying a silicon nanowire surface to facilitate stable suspension of nanowires in a non-polar solvent, which is necessary in order to practice the Langmuir-Blodgett film approach. This can be achieved using a generic silicon oxide surface chemistry. We can use alkyl-trimethoxysilane to attach hydrophobic alkyl group, such as octyl group on the surface of nanowires. This can make nanowire suspendable in organic solvent, such as octane. These surface groups may have a detrimental effect on the electronic properties of nanowires. Methods for removing the organic molecules (e.g., oxygen plasma or ozone cleaning process) from a silicon nanowire surface subsequent to nanowire thin film formation can be developed when necessary.

Step 2. Process for substrate surface treatment: Surface chemistry of substrate is important to adhesion of nanowires to the substrate. In case of glass substrates, nanowires intrinsically adhere to it nicely because of similar surface chemistry of glass and silicon oxide coated nanowires. A routine clean and a quick plasma oxygen plasma etch can be done. For hydrophobic plastic substrate, we can first do an oxygen plasma oxidation, then attach a monolayer of 3-aminopropyl-group to the surface using 3-aminopropyltrimethoxysiline. The rigid polystyrene sheet can be tested first. If successful, the flexible film, like a piece of polypropylene, can be used next.

Step 3. Fluidic flow alignment: For fluidic alignment, we use nanowires suspended in alcohol. The fluidic flow approach has been applied to align nanowires on a scale with width of hundreds of micrometer and length of a few inches. In principle, the fluidic flow alignment can be extended to very large area just like logs in a river. In order to achieve alignment over large area, a fluidic channel with lateral dimension comparable to the substrate size can be used. The height of the channel can be controlled to be less than 500 μm so that a major portion of the nanowire solution is proximate to the substrate, and the shear flow near the surface of the substrate enables the alignment of the nanowires along the flow direction. FIG. 45 shows a diagram of a fluidic cell for aligning nanowires over a large area, according to an embodiment of the present invention. An detailed example method and system for such a fluidic cell alignment approach is described above with reference to flow mask 1500, as shown in FIGS. 15A and 15B. The entrance and outlet of the fluidic cell is carefully designed to ensure a uniform flow along and across the whole flow channel.

Various nanowire solution concentration and flow times can be used to control a nanowire surface density/coverage on the substrate. When desired, the substrate can also be functionalized to enhance the complementary interaction between the substrate and the nanowires to achieve higher surface coverage. A systematic study can be conducted to enable reproducible nanowire deposition on surface. The surface coverage can be studied with an optical microscope and/or scanning electron microscope, and a rational statistical approach can be developed to quantitatively characterize the surface coverage. These studies can be first conducted on glass substrate and can be implemented to surface functionalized plastic substrate.

Several critical issues should be noted and carefully controlled: 1) a rubber stamp (polydimethylsiloxane, PDMS) fluidic channel used for small scale alignment may not be applicable at inch- to tens-of-inch-dimension because the channel can potentially collapse in the middle part due to the flexible nature of PDMS. To overcome this issue, a solid channel using glass or stainless steel can be used. The perimeter of the channel can be sealed using either o-ring or coating a thin layer of PDMS. 2) At such a large dimension scale, the flow across and along the whole channel may not be uniform which is not desired for uniform nanowire deposition. To enable uniform flow, particular attention should be paid to design and engineering the fluidic channel entrance and outlet. Great care is also taken with design solution delivery scheme. A programmable automatic syringe pump can be used to ensure a constant solution delivery rate. There is high technical risk in terms of achieving a uniform nanowire deposition on surface. For example, it is likely to have much higher nanowire density in the area near the entrance of the channel than the area near the outlet, which is often observed in micro-channel fluidic alignment without careful design of the channel entrance. The density variation can be compensated by alternatively reversing the flow direction during the alignment process. Alternatively, a Langmuir-Blodgett film technique can be used, which can give uniform alignment over a large area. However, the results from fluidic flow alignment can still be used for initial test on device fabrication and characterization.

Step 4. Langmuir-Blodgett Film: In order to achieve a uniform alignment over a large area, a large scale assembly approach based on Langmuir-Blodgett (L-B) film can be used. Langmuir-Blodgett alignment has been used to form thin films of nanoparticles and aligned nanorods. This approach can be extended to the alignment of nanowires to produce an oriented nanowire thin film. FIG. 46 shows a diagram illustrating the alignment of nanowires over a large area using a Langmuir-Blodgett film, according to an example embodiment of the present invention.

In this approach, the nanowires are first functionalized and suspended in non-polar solvent (Step 1 above). Such a non-polar nanowire suspension is then transferred onto water surface in an L-B trough. At sufficient low-densities, the nanowires form an isotropic distribution with random orientation. As the surface is compressed, it becomes increasingly difficult for the wires to point in random directions and the nanowires undergo a transition to a more ordered anisotropic phase with uniaxial symmetry to have a nematic or smectic phase (see FIG. 46). Indeed, this has been observed in Monte-Carlo simulations and in real experiment for the case alignment of thin film nanorods (e.g., aspect ratio=length/diameter<10). Thus it is possible to achieve alignment of nanowires on water surface over large area. In addition, directional capillary force and van der Waals attraction between nanowires further enhance the parallel alignment of the nanowires and the formation of an oriented nanowire thin film. Due large significantly larger aspect ratio of the nanowires (e.g., >500), the nanowires may experience significantly larger resistance to rotating from a random orientation to parallel to each other. This potential problem can be solved by inducing some pre-alignment prior to surface compression, for example. A number of strategies can also be employed to achieve this goal. For example, a flow process can be combined to achieve some pre-alignment. An electrical field can also be applied to enhance the alignment of the wires. The aligned nanowires on water were then transferred onto a desired substrate. The nanowire density can be controlled by the ratio of surfactant and nanowires and by the amount of surface compression. After an aligned nanowire thin film is formed on the water surface, it can be transferred onto any substrate. Different transfer protocols may be used to avoid disturbing the alignment during the transferring. The surface coverage can be characterized using a similar approach described above.

(3) TFT Fabrication and Characterization.

Silicon nanowire TFTs with field effect mobility of ~1000 cm$^2$/V·s, on/off current ratio of >10$^7$, and threshold voltage of <2.0 V are fabricated in the current example, as described below.

Result: A 1000×1000 array of silicon nanowire TFT on a glass substrate and a polystyrene substrate.

Despite that FETs has been demonstrated using a single nanowire as the conducting channel, the application of these FETs has often suffered from a large variance from device to device. This variance may be due to a lack of synthetic control, a reliable way to make ohmic contact, and a large number of surface trap states. Achieving reliable and controllable electrical characteristics is critical for any real application of TFTs. In order to achieve high level control of device characteristics, the electronic properties of individual nanowires must be highly reproducible and controllable. Electronic quality control of the nanowires can be characterized and optimized using a single nanowire FET structure. With well controlled electronic properties, nanowire thin film transistor devices can be fabricated and characterized on different substrate including glass and plastics.

Step 1. Process for a reliable metallization process using single nanowire FET:

A single nanowire transistor FET can be used as a test vehicle to develop a reliable metallization process. A single nanowire FET device can be fabricated on SiO$_2$/Si surface using either electron-beam lithography or photolithography. The substrate silicon can be a global back gate, and two metal electrodes can be used as source and drain electrodes (FIG. 47). Prior to metallization, appropriate surface cleaning procedure can be taken to remove the oxide from the nanowire surface and ensure a good contact between the nanowire and contact metal. Planar silicon technology can be used as a reference point for choosing appropriate contact metal and process protocol. Various strategies, including ion gun cleaning, or HF etching can be employed to remove the surface dielectrics prior to metallization of source-drain electrodes. Different metallization recipes (E.g., Ti/Au, Ni/Au, Al) can be tested and optimized using either electron-beam evaporation or sputtering process. Attention is paid to the surface treatment (via thermal annealing and hydrogen plasma annealing) of nanowires and its effects on the electronic properties. The device behavior can be characterized using a semiconductor analyzer. Various measurement configuration including gate-dependent two-terminal measurement and four-terminal measurements, as well as electric force microscopy can be employed to characterize the device behavior. The device structure can be stringently modeled theoretically to derive all the key transistor parameters including carrier concentration and mobility, threshold voltage, on/off ratio etc. The results from the electrical test and theoretical modeling can further be feed back to optimize metallization process until a reliable process is obtained. This can be a standard metallization process for the fabrication nanowire TFT. The single nanowire FET is also used for the nanowire qualification test. A database can be constructed in terms of synthetic conditions and the electronic parameters of nanowires, the database wcan be further used to guide a more controllable synthesis and device fabrication process.

FIG. 47 shows plan and perspective views of a single nanowire field effect transistor, according to an example embodiment of the present invention. The single nanowire FET is used as the basic device geometry to characterize and optimize the electrical transport properties of individual nanowires. The perspective view shown in FIG. 47 shows a scanning electron microscope (SEM) image of a typical device. In this device a silicon substrate can used as the back gate, and two metal electrodes can be used as the source-drain contacts Step 2. Global-back-gated Nanowire TFT: The goal of this task is to demonstrate and characterize nanowire TFT fabricated from nanowire thin film with different surface density using a similar device structure described above. A reliable protocol identified for the fabrication of single nanowire device can be applied to nanowire thin film transistors. TFT devices can be fabricated using nanowire thin films with different surface density to achieve individual TFT devices with variable number of nanowires bridging the source and drain electrodes. A semiconductor analyzer can be used to characterize the devices behavior such as current level, on/off ratio, threshold voltage and gate leakage current as a function of nanowire surface density, and device behavior can be theoretically modeled to calculate the critical device parameters including the mobility value. The modeling can in turn be used to direct the design of device structure to achieve desired device function. These studies can be carried out on SiO$_2$/Si substrate using silicon back as the back gate, as this is an relatively easy way for device fabrication and modeling. At the end of this task, a reliable protocol can be formed to fabricate TFTs with variable nanowire surface density and controllable device behavior.

Step 3. Local-gated nanowire-FET on glass and plastics: Fabrication of nanowire TFTs and TFT arrays on glass and plastic substrate are described, for example, targeting mobility around ~1000 cm$^2$/V·s. A TFT using locally patterned gate electrodes is used. Locally-gated TFT structure are fabricated using Si/SiO$_2$ or Si/Si$_3$N$_4$ core-shell nanowires, where SiO$_2$ or Si$_3$N$_4$ shell can be used as the gate dielectrics, and an additional metal electrode can be employed as the gate electrode (FIG. 48).

FIGS. 48A and 48B show perspective views of locally gated nanowire thin film transistors, according to embodiments of the present invention. FIG. 48A shows a staggered structure with the gate formed beneath the nanowire thin film, and the source drain electrode from on the top of the nanowire thin film with the dielectric over-layer removed. FIG. 48B shows a TFT structure with all the contacts formed on the top of the nanowire thin film.

A bottom contact and top-contact gate configuration can both be tested to ensure the lowest switching voltage, largest on/off ratio, and lowest leakage current. All these tests can be done on first on glass substrate and then be applied to plastics. Resultingly, individual nanowire TFTs can be fabricated on glass and plastic substrate with controllable device characteristics (carrier mobility ~1000 cm$^2$/V·s, controllable threshold (<2.5 V), current level (1 µA-1 mA) and on/off ratio (>106)).

Step 4. Integrated nanowire TFT arrays: As a reliable protocol is identified for making individual local-gated TFTs on glass and chosen plastics with desired device characteristics, it can be applied to fabricate an integrated array of TFT devices on a 4×4" glass and plastic substrate. Multi-level photolithography can be used to pattern the nanowire thin film and to form the source-drain, gate electrode array for an integrated TFT array. Particular attention may be paid to the exact device structure design and device fabrication process design. The mature technology of amorphous silicon and polysilicon TFTs can be used as a reference point for such design. In the end, a 1000×1000 array of nanowire TFTs can be fabricated and further be configured into logic circuits to produce logic function.

Electrical Devices Including Nanowire Layers, and Nanowire Layers Combined with Single-crystal, Amorphous, and Polycrystalline Semiconductor Materials In another aspect of this invention, electrical devices can be formed using a structure that includes multiple nanowire thin film layers. In other words, multiple layers of nanowire thin films, such as the various embodiments described above, can be stacked to create devices.

For example, in an embodiment, a first plurality of nanowires are deposited on a substrate to form a first nanowire thin film layer. A second plurality of nanowires are deposited on the first nanowire thin film layer to form a second nanowire thin film layer. Any number of additional pluralities of nanowire can also be deposited on preceding nanowire thin film layers to form additional thin film layers in a stack.

For illustrative purposes, referring to a two-thin film layer embodiment, nanowires of the first and second layers can be differently doped. For example, the first layer can include nanowires that are p-doped, and the second layer can include nanowires that are n-doped. Thus, junctions, such as p-n junctions, are thereby formed at the cross points/intersections between the nanowires of the first and second thin film layers.

Contacts can be formed to create electrical devices based on the properties of the junctions. For example, in a diode embodiment, a first contact can be formed that is coupled to nanowires of the first thin film and a second contact can be formed that is coupled to nanowires of the second thin film. Thus, a two-terminal p-n diode can be formed. Three- and other-terminal number devices, such as transistors, can be formed in a similar manner.

Note that nanowires of the first thin film layer are preferably aligned parallel to each other, and nanowires of the second thin film layer are preferably aligned parallel to each other. However, in alternative aspects, the nanowires of the first and/or second thin film layers can be randomly oriented.

In another embodiment, an electrical device is formed that includes a hybrid nanowire-single crystal semiconductor structure. For example, a single-crystal semiconductor strip/thin film is formed. For example, the single crystal strip can be formed by etching a wafer, such as a silicon-on-insulator (SOI) wafer. Furthermore, the single-crystal semiconductor strip/thin film can be formed to have any shape or size as required by a particular application. A plurality of nanowires are deposited on the top of the strip. Junctions, such as p-n junctions, are formed at the cross points between the nanowires and the single crystal semiconductor strip. For example, the single crystal semiconductor strip can be doped a first way (either n- or p-doped) and the nanowires can be doped a different way (e.g., p- or n-doped). Thus, p-n junctions can be formed at the intersections of the strip with the nanowires.

Contacts can be formed to create electrical devices based on the properties of these junctions. For example, in a diode embodiment, a first contact can be formed that is coupled to the single crystal semiconductor strip and a second contact can be formed that is coupled to the nanowire thin film. Thus, a two-terminal p-n diode can be formed. Three- and other-terminal number devices, such as transistors, can be formed in a similar manner.

The nanowires of the plurality of nanowires are preferably aligned parallel to each other, but can alternatively be randomly oriented.

In another embodiment, an electrical device is formed that includes a hybrid nanowire-amorphous/polycrystalline semiconductor structure. For example, an amorphous or polycrystalline semiconductor thin film is deposited on a substrate. A plurality of nanowires are deposited on the thin film pattern. Junctions, such as p-n junctions, are formed at the cross points/interasections between the nanowires and the amorphous/polycrystalline semiconductor thin film pattern. For example, the amorphous or polycrystalline semiconductor thin film can be doped a first way (either n- or p-doped) and the nanowires can be doped a different way (e.g., p- or n-doped). Thus, p-n junctions can be formed at the intersections of the amorphous or polycrystalline semiconductor thin film with the nanowires Contacts can be formed to create electrical devices based on the properties of these junctions. For example, in a diode embodiment, a first contact can be formed that is coupled to the amorphous or polycrystalline semiconductor thin film and a second contact can be formed that is coupled to the nanowire thin film. Thus, a two-terminal p-n diode can be formed. Three- and other-terminal number devices, such as transistors, can be formed in a similar manner.

The nanowires of the plurality of nanowires are preferably aligned parallel to each other, but can alternatively be randomly oriented.

In an example embodiment, light emitting devices can be created using these structures. For example, light emitting semiconductor nanowires such as those emitting red, green and blue light, can be selected in a predetermined ratio of nanowires. Nanowires selected in the predetermined ratio can be mixed in a solution. The nanowire mixture is flowed across a single-crystal, amorphous, or polycrystalline semiconductor strip/thin film. As described above, contacts can be formed to create a light emitting electrical device, such as a light emitting diode in a two-contact/terminal device. Depending on the selected mixture of light emitting nanowires, any color of light can be emitted by the light emitting electrical device, including white light.

Applications of the Present Invention

Numerous electronic devices and systems can incorporate semiconductor or other type devices with thin films of nanowires, according to embodiments of the present invention. Some example applications for the present invention are described below or elsewhere herein for illustrative purposes, and are not limiting. The applications described herein can include aligned or non-aligned thin films of nanowires, and can include composite or non-composite thin films of nanowires.

Semiconductor devices (or other type devices) of the present invention can be coupled to signals of other electronic circuits, and/or can be integrated with other electronic circuits. Semiconductor devices of the present invention can be formed on large substrates, which can be subsequently separated or diced into smaller substrates. Furthermore, on large substrates (i.e., substrates substantially larger than conventional semiconductor wafers), semiconductor devices formed thereon according to the present invention can be interconnected.

The present invention can be incorporated in applications requiring a single semiconductor device, and to multiple semiconductor devices. For example, the present invention is particularly applicable to large area, macro electronic substrates on which a plurality of semiconductor devices are formed. Such electronic devices can include display driving circuits for active matrix liquid crystal displays (LCDs), organic LED displays, field emission displays. Other active displays can be formed from a nanowire-polymer, quantum dots-polymer composite (the composite can function both as the emitter and active driving matrix). The present invention is also applicable to smart libraries, credit cards, large area array sensors, and radio-frequency identification (RFID) tags, including smart cards, smart inventory tags, and the like.

The present invention is also applicable to digital and analog circuit applications. In particular, the present invention is applicable to applications that require ultra large-scale integration on a large area substrate. For example, the thin film of nanowires embodiments of the present invention can be implemented in logic circuits, memory circuits, processors, amplifiers, and other digital and analog circuits.

The present invention can be applied to photovoltaic applications. In such applications, a clear conducting substrate is used to enhance the photovoltaic properties of the particular photovoltaic device. For example, such a clear conducting substrate can be used as a flexible, large-area replacement for indium tin oxide (ITO) or the like. A substrate can be coated with a thin film of nanowires that is formed to have a large bandgap, i.e., greater than visible light so that it would be non-absorbing, but would be formed to have either the HOMO or LUMO bands aligned with the active material of a photovoltaic device that would be formed on top of it. Clear conductors can be located on two sides of the absorbing photovoltaic material to carry away current from the photovoltaic device. Two different nanowire materials can be chosen, one having the HOMO aligned with that of the photovoltaic material HOMO band, and the other having the LUMO aligned with the LUMO band of the photovoltaic material. The bandgaps of the two nanowires materials can be chosen to be much larger than that of the photovoltaic material. The nanowires, according to this embodiment, can be lightly doped to decrease the resistance of the thin films of nanowires, while permitting the substrate to remain mostly non-absorbing.

Hence, a wide range of military and consumer goods can incorporate the thin film of nanowires embodiments of the present invention. For example, such goods can include personal computers, workstations, servers, networking devices, handheld electronic devices such as PDAs and palm pilots, telephones (e.g., cellular and standard), radios, televisions, electronic games and game systems, home security systems, automobiles, aircraft, boats, other household and commercial appliances, and the like.

Conclusion

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. A system for applying nanowires to a target surface, comprising:

a solution source that provides a nanowire solution, wherein said nanowire solution comprises a liquid containing a plurality of nanowires, wherein the plurality of nanowires comprise silicon having an oxide coating and which have a first negative charge; a nozzle coupled to said solution source, wherein said nozzle has at least one output opening; and a target surface comprising a charged material having a second charge which is opposite to said first charge, which second charge aids in attracting the nanowires from the nanowire solution to the target surface;

wherein said nozzle directs the nanowire solution through said at least one output opening onto the target surface.

2. The system of claim 1, wherein said nozzle has a plurality of output openings.

3. The system of claim 2, wherein said plurality of output openings apply the nanowire solution to overlapping portions of the target surface.

4. The system of claim 2, wherein said plurality of output openings apply the nanowire solution to a plurality of non-overlapping portions of the target surface.

5. The system of claim 1, wherein a width of an output opening of said at least one output opening is in a range of 1 μm to 1000 μm.

6. The system of claim 1, wherein a width of an output opening of said at least one output opening is greater than or equal to (≧) a length of a nanowire of said plurality of nanowires.

7. The system of claim 1, wherein the charged material comprises aminopropyl triethoxy silane (APTES).

8. The system of claim 1, wherein the charged material comprises an amine containing silane.

9. The system of claim 1, wherein the charged material comprises an amine containing polymer.

10. A system for applying nanowires to a target surface, comprising:

a solution source that provides a nanowire solution, wherein said nanowire solution comprises a liquid containing a plurality of nanowires, wherein the plurality of nanowires comprise silicon having a first charge; a nozzle coupled to said solution source, wherein said nozzle has at least one output opening; and a target surface comprising a charged material having a second charge which is opposite to said first charge, which second charge aids in attracting the nanowires from the nanowire solution to the target surface, wherein the charged material comprises polylysine positively charged amine groups;

wherein said nozzle directs the nanowire solution through said at least one output opening onto the target surface.

11. The system of claim 10, wherein the nanowires are negatively charged.

12. The system of claim 11, wherein the nanowires comprise silicon which is coated with an oxide.

* * * * *